United States Patent
Cho et al.

(10) Patent No.: US 12,550,518 B2
(45) Date of Patent: Feb. 10, 2026

(54) LIGHT EMITTING DISPLAY DEVICE

(71) Applicant: SAMSUNG DISPLAY CO., LTD., Yongin-si (KR)

(72) Inventors: Seong Min Cho, Seongnam-si (KR); Dae-Gi Kweon, Hwaseong-si (KR); Sungmin Kim, Hwaseong-si (KR); Chan Young Kim, Hwaseong-si (KR); Hyun Duck Cho, Anyang-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 575 days.

(21) Appl. No.: 18/050,974

(22) Filed: Oct. 28, 2022

(65) Prior Publication Data
US 2023/0269990 A1    Aug. 24, 2023

(30) Foreign Application Priority Data

Feb. 24, 2022   (KR) .................. 10-2022-0024511

(51) Int. Cl.
*H10K 39/34*    (2023.01)
*H10D 86/40*    (2025.01)
(Continued)

(52) U.S. Cl.
CPC .......... *H10K 39/34* (2023.02); *H10D 86/441* (2025.01); *H10D 86/60* (2025.01);
(Continued)

(58) Field of Classification Search
CPC .... H10K 59/60; H10K 50/865; H10K 59/122; H10K 59/131; H10K 2102/311;
(Continued)

(56) References Cited

U.S. PATENT DOCUMENTS 8,106,583 B2    1/2012  Shin et al.
8,664,021 B2    3/2014  Kim et al.
(Continued)

FOREIGN PATENT DOCUMENTS

CN      110264894 A    9/2019
KR   10-2017-0104097    9/2017
(Continued)

*Primary Examiner* — Fernando L Toledo
*Assistant Examiner* — Adam S Bowen
(74) *Attorney, Agent, or Firm* — F. CHAU & ASSOCIATES, LLC

(57) ABSTRACT

A light emitting display device includes: a display area; a first component area positioned within the display area and that includes a plurality of pixels, each pixel of the plurality of pixels respectively includes a pixel circuit part, and the first component area further includes a first photosensor area and a second photosensor area between the plurality of pixels. The first photosensor area includes: a first sub-photosensor area positioned between adjacent pixel circuit parts; and a light blocking layer positioned on a front surface of the first sub-photosensor area and that includes an opening that overlaps the first sub-photosensor area on a plane. The second photosensor area includes: a second sub-photosensor area positioned between the adjacent pixel circuit parts; and the light blocking layer positioned on a front surface of the second sub-photosensor area and that overlaps the second sub-photosensor area.

20 Claims, 42 Drawing Sheets

(51) Int. Cl.
  *H10D 86/60* (2025.01)
  *H10K 59/121* (2023.01)
  *H10K 59/122* (2023.01)
  *H10K 59/131* (2023.01)
  *H10K 59/38* (2023.01)
  *H10K 59/60* (2023.01)
  *H10K 59/65* (2023.01)
  *H10K 59/80* (2023.01)
  *H10K 102/00* (2023.01)

(52) U.S. Cl.
  CPC ....... *H10K 59/1213* (2023.02); *H10K 59/122* (2023.02); *H10K 59/131* (2023.02); *H10K 59/38* (2023.02); *H10K 59/60* (2023.02); *H10K 59/65* (2023.02); *H10K 59/8792* (2023.02); *H10K 2102/311* (2023.02)

(58) Field of Classification Search
  CPC .... H10K 59/8792; H10K 39/34; H10K 59/00; H10K 50/844; H10K 50/856; H10D 89/10; H04M 1/0264
  See application file for complete search history.

(56) References Cited

U.S. PATENT DOCUMENTS

| | | |
|---|---|---|
| 8,866,170 B2 | 10/2014 | Moon et al. |
| 2020/0133414 A1* | 4/2020 | Lee .................. G06F 3/044 |
| 2021/0066642 A1 | 3/2021 | Lee et al. |
| 2022/0208863 A1 | 6/2022 | Cho et al. |

FOREIGN PATENT DOCUMENTS

| | | |
|---|---|---|
| KR | 10-2021-0028319 A | 3/2021 |
| KR | 10-2021-0093420 | 7/2021 |
| KR | 10-2022-009767 | 7/2022 |

* cited by examiner

FIG. 34
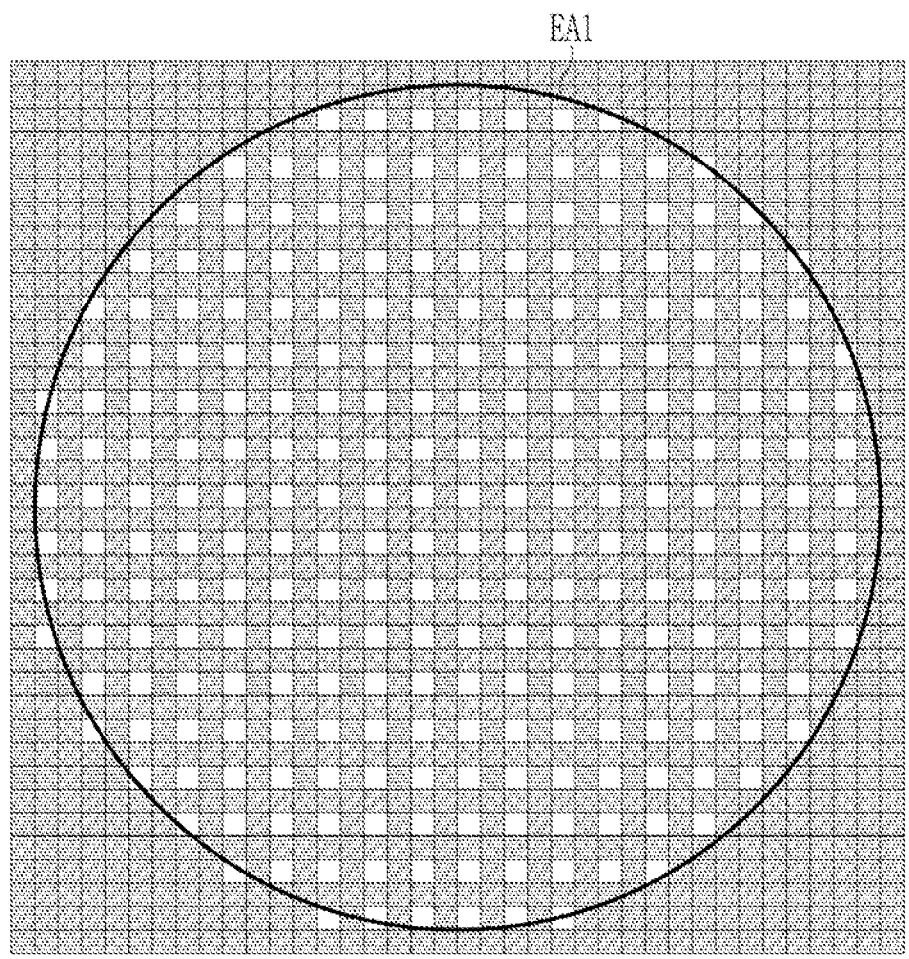
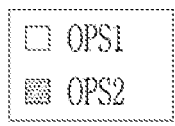

LIGHT EMITTING DISPLAY DEVICE

CROSS-REFERENCE TO RELATED APPLICATION

This application claims priority under 35 U.S.C. 119 from Korean Patent Application No. 10-2022-0024511, filed in the Korean Intellectual Property Office on Feb. 24, 2022, the contents of which are herein incorporated by reference in their entirety.

TECHNICAL FIELD

Embodiments of the present disclosure are directed to a light emitting display device, and to a light emitting display device that includes a sensor on a rear surface of a display area.

DISCUSSION OF THE RELATED ART

A display device displays an image on a screen, and includes a liquid crystal display (LCD), an organic light emitting diode (OLED), etc. These display devices are used in various electronic devices, such as portable phones, navigation devices, digital cameras, electronic books, portable game machines, or various terminals.

A display device such as an organic light emitting device may have a flexible substrate in which the display device can be bent or folded.

In addition, in a small electronic device such as a portable phone, optical elements such as cameras and optical sensors can be formed in a bezel area, which is a periphery of the display area, however as the size of the peripheral area of the display area is being gradually reduced while the size of the display screen is being increased, a technology is being developed that allows the camera or the optical sensor to be positioned on the rear surface of the display area.

SUMMARY

Embodiments adjust transmittance of a component area positioned in front of a sensor in a light emitting display device to additionally improve a reflected color of the component area while allowing the sensor to operate.

A light emitting display device according to an embodiment includes: a display area; and a first component area positioned within the display area and that includes a plurality of pixels, where each pixel of the plurality of pixels respectively includes a pixel circuit part, and the first component area further includes a first photosensor area and a second photosensor area between the plurality of pixels. The first photosensor area includes: a first sub-photosensor area positioned between adjacent pixel circuit parts; and a light blocking layer positioned on a front surface of the first sub-photosensor area and that includes an opening that overlaps the first sub-photosensor area. The second photosensor area includes: a second sub-photosensor area positioned between the adjacent pixel circuit parts; and the light blocking layer positioned on the front surface of the second sub-photosensor area and that overlaps the second sub-photosensor area.

One of the first sub-photosensor area or the second sub-photosensor area may be adjacent to all pixel circuit parts in the first component area, the first component area may include a plurality of the first photosensor areas, the second component area may include a plurality of the second photosensor areas, and a number of the first photosensor areas is equal to or less than the number of the second photosensor areas.

The first component area may include one or more of a ½ period in which one second photosensor area is formed for one first photosensor area, a ¼ period in which three second photosensor areas are formed for one first photosensor area, a ⅜ period in which five second photosensor areas are formed for three first photosensor areas, a ⅛ period in which seven second photosensor areas are formed for one first photosensor area, or a ⅑ period in which eight second photosensor areas are formed for one first photosensor area.

The first component area may have transmittance greater than 0.12%.

The first component area may be divided into a center area and a peripheral area. A first period of the center area of the first component area may differ from a second period of the peripheral area of the first component area.

The first period may have a greater value than the second period.

The light emitting display device may further include a black pixel definition layer disposed between the pixel circuit part and the light blocking layer, and the black pixel definition layer may have an additional opening that overlaps the first sub-photosensor area in the first photosensor area and overlaps the second sub-photosensor area in the second photosensor area.

The light emitting display device may further include a black pixel definition layer disposed between the pixel circuit part and the light blocking layer, and the black pixel definition layer may have an additional opening on a portion that overlaps the first sub-photosensor area in the first photosensor area and a portion that overlaps the second sub-photosensor area in the second photosensor area.

The light emitting display device may further include a color filter disposed on the light blocking layer.

The plurality of pixels may further include a light-emitting element. The light-emitting element may include an anode, an emission layer, and a cathode. The light emitting display device may further include an encapsulation layer that covers the light-emitting element and the pixel circuit part and is positioned under the light blocking layer, and a reflection adjustment layer disposed on a front surface of the light blocking layer and that selectively absorbs light of one or more predetermined wavelengths.

The light emitting display device may further include a capping layer disposed on the cathode and between the cathode and the encapsulation layer, and a low reflection layer disposed on the capping layer.

A light emitting display device according to an embodiment includes: a display area; and a first component area positioned within the display area and that includes a plurality of pixels, where each pixel of the plurality of pixels respectively includes a pixel circuit part, and the first component area further includes a first photosensor area and a second photosensor area between the plurality of pixels. The first photosensor area includes a first sub-photosensor area positioned between adjacent pixel circuit parts; and a black pixel definition layer positioned on a front surface of the first sub-photosensor area and that includes an opening that overlaps the first sub-photosensor area. The second photosensor area includes a second sub-photosensor area positioned between the adjacent pixel circuit parts; and the black pixel definition layer positioned on a front surface of the second sub-photosensor area and that overlaps the second sub-photosensor area.

One of the first sub-photosensor area or the second sub-photosensor area may be adjacent to all pixel circuit parts in the first component area. The first component area may include a plurality of the first photosensor areas, the second component area may include a plurality of the second photosensor areas, and a number of the first photosensor areas is equal to or less than a number of the second photosensor areas.

The first component area may include one or more of a ½ period in which one second photosensor area is formed for one first photosensor area, a ¼ period in which three second photosensor areas are formed for one first photosensor area, a ⅜ period in which five second photosensor areas are formed for three first photosensor areas, a ⅛ period in which seven second photosensor areas are formed for one first photosensor area, or a ⅑ period in which eight second photosensor areas are formed for one first photosensor area.

The first component area may have transmittance of greater than 0.12%.

The first component area may be divided into a center area and a peripheral area, and a first period of the center area of the first component area may differ from a second period of the peripheral area of the first component area.

The first period may have a greater value than the second period.

The light emitting display device may further include a light blocking layer disposed on the black pixel definition layer, and a color filter disposed on the light blocking layer.

The plurality of pixels may further include a light-emitting element. The light-emitting element may include an anode, an emission layer, and a cathode. The light emitting display device may further include an encapsulation layer that covers the light-emitting element and the pixel circuit part; a light blocking layer disposed on the encapsulation layer; and a reflection adjustment layer disposed on the front surface of the light blocking layer and that absorbs light of one or more predetermined wavelength bands.

The light emitting display device may further include a capping layer disposed on the cathode and between the cathode and the encapsulation layer, and a low reflection layer disposed on the capping layer.

A light emitting display device according to an embodiment includes: a display area; and a first component area positioned within the display area and that includes a plurality of pixels, where each pixel of the plurality of pixels respectively includes a pixel circuit part, and the first component area further includes a first photosensor area and a second photosensor area between the plurality of pixels. The first photosensor area includes: a first sub-photosensor area positioned between adjacent pixel circuit parts; and a black pixel definition layer positioned on a front surface of the first sub-photosensor area and that includes an opening on a portion that overlaps the first sub-photosensor area in the first photosensor area. The second photosensor area includes: a second sub-photosensor area positioned between the adjacent pixel circuit parts; and the black pixel definition layer positioned on a front surface of the second sub-photosensor area and a portion that overlaps the second sub-photosensor area in the second photosensor area.

One of the first sub-photosensor area or the second sub-photosensor area may be adjacent to all pixel circuit parts in the first component area. The first component area may include a plurality of the first photosensor areas, the second component area may include a plurality of the second photosensor areas, and a number of the first photosensor areas is equal to or less than a number of the second photosensor areas.

The first component area may include one or more of a ½ period in which one second photosensor area is formed for one first photosensor area, a ¼ period in which three second photosensor areas are formed for one first photosensor area, a ⅜ period in which five second photosensor areas are formed for three first photosensor areas, a ⅛ period in which seven second photosensor areas are formed for one first photosensor area, or a ⅑ period in which eight second photosensor areas are formed for one first photosensor area.

The first component area may have transmittance of greater than 0.12%.

The first component area may be divided into a center area and a peripheral area, and a first period of the center area of the first component area may differ from a second period of the peripheral area of the first component area.

The first period may have a greater value than the second period.

The light emitting display device may further include a light blocking layer disposed on the black pixel definition layer, and a color filter disposed on the light blocking layer.

The plurality of pixels may further include a light-emitting element. The light-emitting element may include an anode, an emission layer, and a cathode. The light emitting display device may further include an encapsulation layer that covers the light-emitting element and the pixel circuit part; a light blocking layer disposed on the encapsulation layer; and a reflection adjustment layer disposed on the front surface of the light blocking layer and that absorbs light of one or more predetermined wavelength bands.

The light emitting display device may further include a capping layer disposed on the cathode and between the cathode and the encapsulation layer, and a low reflection layer disposed on the capping layer.

According to embodiments, the pixel circuit part of the pixel that includes the pixel circuit part and the light emitting diode LED also includes the sub-photosensor area OPS through which light can pass, the part of a plurality of sub-photosensor areas OPS includes the first photosensor area OPS1 that overlaps the opening positioned on the light blocking layer or the black pixel definition layer through which light may pass, and the remaining sub-photosensor areas OPS include the second photosensor area OPS2 that overlaps the light blocking layer or the black pixel definition layer and through which light might not pass. Accordingly, a sensor positioned on the rear surface of the first component area can detect the front surface of the light emitting display device, and the reflection color of light in the first component area can be improved. In addition, according to an embodiment, the component area can be prevented from being recognized by a user because the reflectance or reflection color is different from the display area that surrounds the component area.

BRIEF DESCRIPTION OF THE DRAWINGS

FIG. 34 is a schematic top plan view of a first component area according to an embodiment.

DETAILED DESCRIPTION

Figure 1:
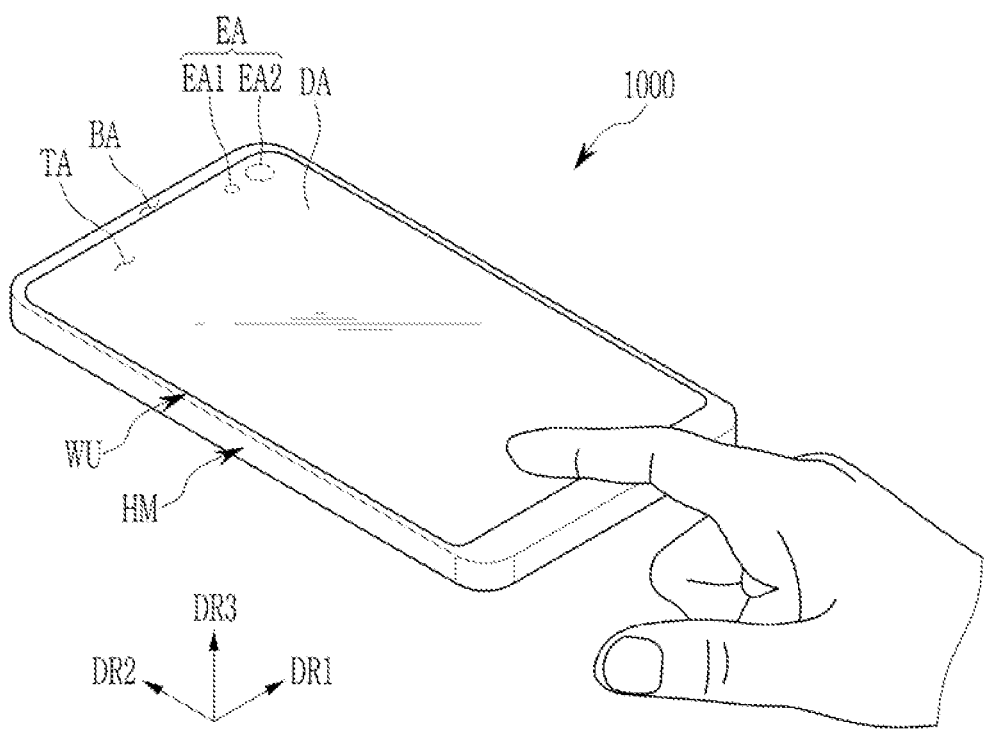
FIG. 1 is a schematic perspective view of a display device according to an embodiment.

Embodiments of the present disclosure will be described more fully hereinafter with reference to the accompanying drawings, in which embodiments of the disclosure are shown. As those skilled in the art would realize, embodiments may be modified in various different ways, all without departing from the spirit or scope of embodiments of the present disclosure.

The drawings and description are to be regarded as illustrative in nature and not restrictive. Like reference numerals may designate like elements throughout the specification.

It will be understood that when an element such as a layer, film, area, or substrate is referred to as being "on" another element, it can be directly on the other element or intervening elements may also be present.

Throughout the specification, "connected" does not only mean that two or more constituent elements are directly connected, but also when two or more constituent elements are connected indirectly through other constituent elements, as well as the case of being physically connected or electrically connected.

In addition, electronic devices that include display devices and display panels described in the specification, such as mobile phones, TV, monitors, laptop computers, etc., or display devices and electronic devices that include display panels, etc., manufactured by a manufacturing method described in the specification are not excluded from the scope of this specification.

Figure 2:
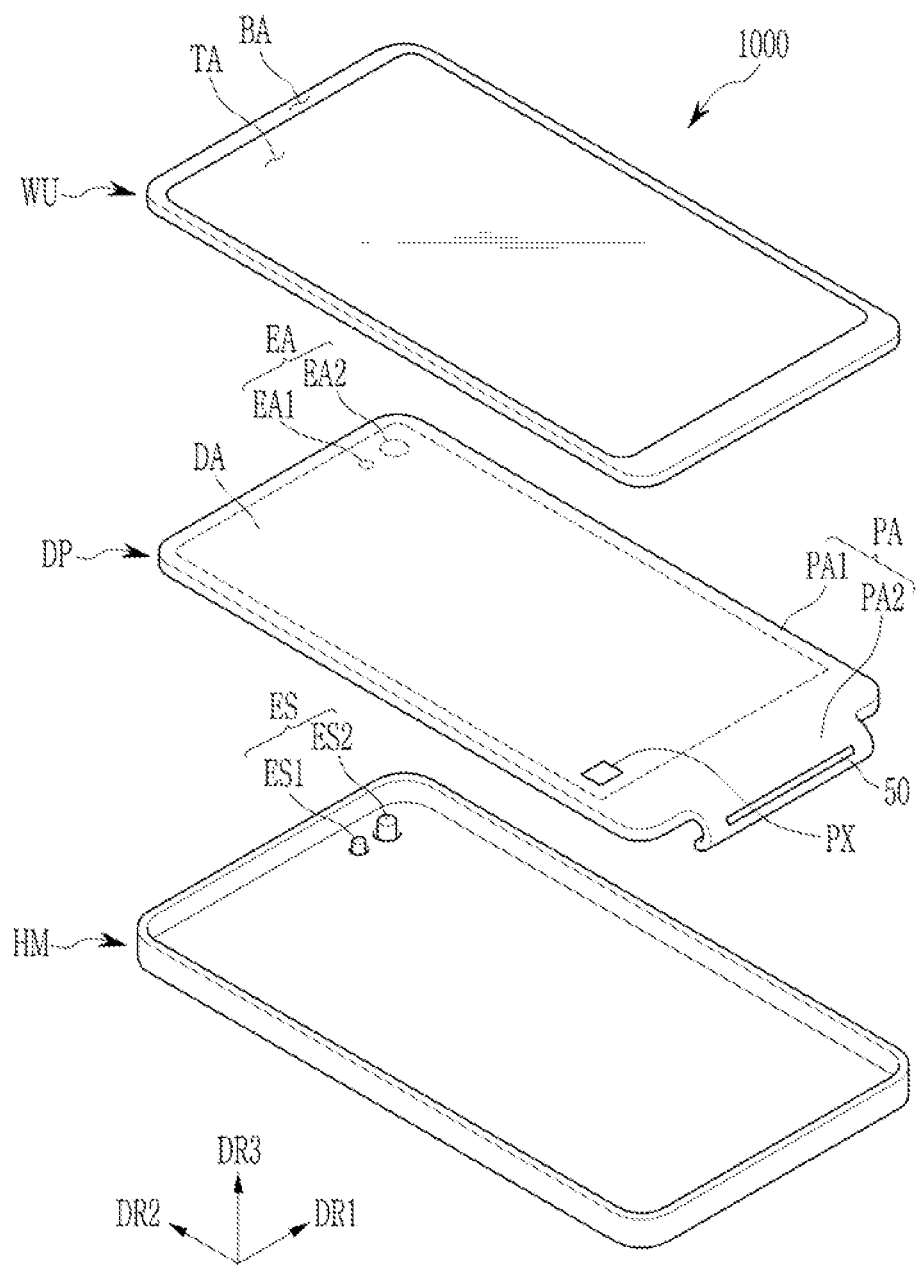
FIG. 2 is an exploded perspective view of a display device according to an embodiment.
Figure 3:
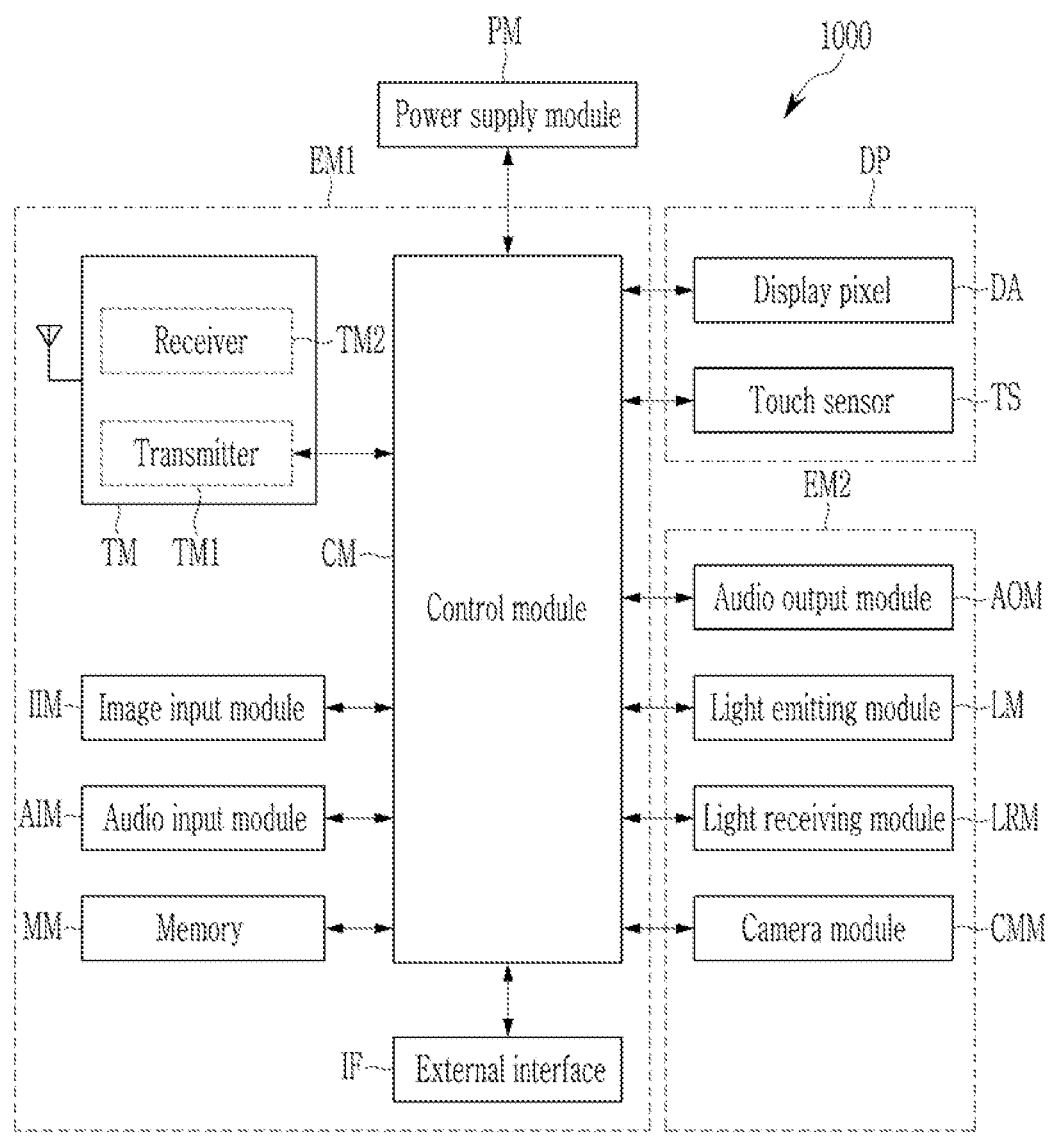
FIG. 3 is a block diagram of a display device according to an embodiment.

Hereinafter, a schematic structure of a display device is described with reference to FIG. 1 to FIG. 3. FIG. 1 is a schematic perspective view of a display device according to an embodiment, FIG. 2 is an exploded perspective view of a display device according to an embodiment, and FIG. 3 is a block diagram of a display device according to an embodiment.

Referring to FIG. 1, a light emitting display device 1000 according to an embodiment can display a motion picture or a still image, and can be used as a display screen of various products such as a television, a laptop, a monitor, an advertisement board, Internet of things (IOT), etc. as well as portable electronic devices such as a mobile phone, a smart phone, a tablet personal computer, a mobile communication terminal, an electronic notebook, an e-book, a PMP (portable multimedia player), a navigation device, a UMPC (Ultra Mobile PC), etc. In addition, the display device 1000 according to an embodiment can be used in a wearable device such as a smart watch, a watch phone, a glasses display, or a head mounted display (HMD). In addition, the display device 1000 according to an embodiment can be used as an instrument panel of a car, a center fascia of the car, a CID (Center Information Display) disposed on a dashboard, a room mirror display that replaces a side mirror of the car, an entertainment device for a rear seat of the car, or a display disposed on the rear surface of the front seat. FIG. 1 shows the display device 1000 being used as a smartphone for ease of comprehension and description.

The display device 1000 displays an image in a third direction DR3 on a display surface parallel to each of a first direction DR1 and a second direction DR2. The third direction DR3 is normal to a plane defined by the first direction DR1 and the second direction DR2. The display surface on which the image is displayed corresponds to the front surface of the display device 1000 and to the front surface of a cover window WU. The images may include static images as well as dynamic images.

In an embodiment, a front surface (or an upper surface) and a rear surface (or a lower surface) of each member are defined based on the direction in which the image is displayed. The front surface and the rear surface are opposed to each other in the third direction DR3, and the normal directions of each of the front and the rear surfaces are parallel to the third direction DR3. The separation distance in the third direction DR3 between the front surface and the rear surface corresponds to the thickness in the third direction DR3 of the display panel.

The display device 1000 according to an embodiment detects an input of a user, as indicated by the hand in FIG. 1. The user's input can one of various types of external inputs, such as using a part of the user's body, light, heat, or pressure. In an embodiment, the user's input is shown as the user's hand being applied to the front. However, embodiments of the disclosure are not necessarily limited thereto. The user's input can be provided in various forms, and the display device 1000 can sense the user's input applied to the side surface or the rear surface of the display device 1000, depending on the structure of the display device 1000.

Referring to FIG. 1 and FIG. 2, the display device 1000 includes a cover window WU, a housing HM, a display panel DP, and an optical element ES. In an embodiment, the cover window WU and the housing HM are combined to constitute the appearance of the display device 1000.

The cover window WU includes an insulating panel. For example, the cover window WU is made of one of glass, plastic, or a combination thereof.

The front surface of the cover window WU is the front surface of the display device 1000. The front surface includes a transmissive area TA and a blocking area BA. The transmissive area TA is an optically transparent area. For example, the transmissive area TA has visible light transmittance of about 90% or more.

The blocking area BA defines the shape of the transmissive area TA. The blocking area BA is adjacent to the transmissive area TA and surrounds the transmissive area TA. The blocking area BA has a relatively low light transmittance as compared to the transmissive area TA. The blocking area BA includes an opaque material that blocks light. The blocking area BA has a predetermined color. The blocking area BA is defined by a bezel layer provided separately from the cover window WU that defines the transmissive area TA, or may be defined by an ink layer that is inserted or colored into the cover window WU.

The display panel DP displays an image and includes a driving unit 50. The display panel DP includes a front surface that includes a display area DA and a non-display area PA. The display area DA is where a pixel is located and emits light according to an electrical signal.

In an embodiment, the display area DA is where an image is displayed, and where an external input is sensed by having a touch sensor positioned on the upper side in the third direction DR3 of the pixel.

The transmissive area TA of the cover window WU at least partially overlaps the display area DA of the display panel DP. For example, the transmissive area TA overlaps the front surface of the display area DA or overlaps at least a portion of the display area DA. Accordingly, a user can perceive an image through the transmissive area TA or provide an external input based on the image. However, embodiments of the disclosure are not necessarily limited thereto. For example, in the display area DA, an area in which an image is displayed and an area in which an external input is detected may be separated from each other.

The non-display area PA of the display panel DP at least partially overlaps the blocking area BA of the cover window WU. The non-display area PA is covered by the blocking area BA. The non-display area PA is adjacent to the display area DA and surrounds the display area DA. The image is not displayed in the non-display area PA, and a driving circuit or driving wiring that drives the display area DA is disposed in the non-display area PA. The non-display area PA includes a first peripheral area PA1 positioned outside the display area DA and a second peripheral area PA2 that includes a driving part 50, connection wiring, and a bendable area. In an embodiment of FIG. 2, the first peripheral area PA1 is positioned on three sides of the display area DA, and the second peripheral area PA2 is positioned on the other side of the display area DA, however, embodiments are not necessarily limited thereto.

In an embodiment, the display panel DP is assembled in a flat state in which the display area DA and the non-display area PA face the cover window WU. However, embodiments of the disclosure are not necessarily limited thereto. A part of the non-display area PA of the display panel DP can be bent. For example, a portion of the non-display area PA can face the rear surface of the display device 1000, so that the blocking area BA shown on the front surface of the display device 1000 is reduced in area, and as shown in FIG. 2, the second peripheral area PA2 can be bent to be positioned on the rear surface of the display area DA, and then assembled.

In addition, the display panel DP includes a component area EA, such as a first component area EA1 and a second component area EA2. The first component area EA1 and the second component area EA2 are at least partially surrounded by the display area DA. Although the first component area EA1 and the second component area EA2 are shown as being spaced apart from each other, embodiments of the disclosure are not necessarily limited thereto, and at least some of the component areas may be connected. A component that uses infrared light, visible light, or a sound is disposed below the first component area EA1 and the second component area EA2.

The display area DA includes a plurality of light emitting diodes (LEDs), and a plurality of pixel circuit parts that generate and transmit a light emitting current to each of a plurality of light emitting diodes (LEDs). One light emitting diode LED and one pixel circuit part are referred to as a pixel PX. In the display area DA, one pixel circuit part and one light emitting diode LED are formed one-to-one.

The first component area EA1 includes an area that includes a transparent layer that allows light to pass through, and a pixel defining layer and a light blocking layer that include a light blocking material with an opening that overlaps the first component area EA, thereby having a structure that does not block light. A conductive layer or a semiconductor layer might not be located in the first component area EA1.

The second component area EA2 includes a transmissive part through which light or/and sound can pass and a display part that includes a plurality of pixels. The transmissive part is positioned between adjacent pixels and includes a transparent layer through which light or/and sound can pass. The display part includes unit structures that each include a plurality of pixels, and the transmissive part is positioned between the adjacent unit structures.

Referring to FIG. 3 in addition to FIG. 1 and FIG. 2, in an embodiment, the display panel DP includes the display area DA that includes the display pixels, and the touch sensor TS. The display panel DP is visually perceived by the user through the transmissive area TA, which includes the pixels that generate the image. In addition, the touch sensor TS is positioned on the pixel, and detects an external input. The touch sensor 1S detects an external input provided to the cover window WU.

Again referring to FIG. 2, in an embodiment, the second peripheral area PA2 includes a bendable part. The display area DA and the first peripheral area PA1 have a flat surface that is substantially parallel to the plane defined by the first direction DR1 and the second direction DR2, and one side of the second peripheral area PA2 extends from the flat surface and has a flat surface on the other side of the bendable part. As a result, at least a part of the second peripheral area PA2 can be bent and assembled to be positioned on the rear surface side of the display area DA. At least a portion of the second peripheral area PA2 overlaps the display area DA when being assembled, so that the blocking area BA of the display device 1000 can be reduced in size. However, embodiments of the disclosure are not necessarily limited thereto. For example, in an embodiment, the second peripheral area PA2 is not bent.

The driving part 50 is mounted on the second peripheral area PA2, and may be mounted on the bendable part or positioned on one side of the bendable part. The driving part 50 may be an integrated circuit chip.

The driving part 50 is electrically connected to the display area DA and transmits an electrical signal to the display area DA. For example, the driving part 50 transmits data signals to the pixels PX disposed in the display area DA. In addition, the driving part 50 includes a touch driving circuit and is electrically connected to the touch sensor TS disposed in the display area DA. In addition, the driving part 50 may include various other circuits in addition to the above-described circuits, and may provide various other electrical signals to the display area DA.

A pad part is positioned at the end of the second peripheral area PA2, and the display device 1000 is electrically connected by the pad part to a flexible printed circuit board (FPCB) that includes a driving chip. For example, the driving chip may include various driving circuits that drive the display device 1000, or connectors for power supply. According to an embodiment, instead of the flexible printed circuit board, a rigid printed circuit board (PCB) is used.

The optical element ES is disposed under the display panel DP. The optical element ES includes a first optical element ES1 that overlaps the first component area EA1 and a second optical element ES2 that overlaps the second component area EA2.

The first optical element ES1 uses light or sound. For example, the first optical element ES1 is a sensor that receives and uses light, such as an infrared sensor, a sensor that outputs and senses light or sound to measure a distance or recognize a fingerprint, a small lamp that outputs light, or a speaker that outputs sound, etc. For an electronic element that uses light, light of various wavelength bands, such as visible light, infrared light, and ultraviolet light, can be used.

The second optical element ES2 is at least one of a camera, an infrared camera (an IR camera), a dot projector, an infrared illuminator, or a time-of-flight sensor (a ToF sensor).

Referring to FIG. 3, in an embodiment, the display device 1000 includes a display panel DP, a power supply module PM, a first electronic module EM1, and a second electronic module EM2. The display panel DP, the power supply module PM, the first electronic module EM1 and the second electronic module EM2 are electrically connected to each other. FIG. 3 shows the display pixel and the touch sensor TS as positioned in the display area DA as an example, however, embodiments are not necessarily limited thereto.

The power supply module PM supplies power for the overall operation of the display device 1000. The power supply module PM may include a conventional battery module.

The first electronic module EM1 and the second electronic module EM2 include various functional modules that operate the display device 1000. The first electronic module EM1 may be directly mounted on the motherboard electrically connected to the display panel DP, or may be mounted on a separate substrate and electrically connected to the motherboard through a connector.

The first electronic module EM1 includes a control module CM, a wireless communication module TM, an image input module IIM, an audio input module AIM, a memory MM, and an external interface IF. Some of the modules might not be mounted on the motherboard and may be electrically connected to the motherboard through a flexible printed circuit board connected thereto.

The control module CM controls the overall operation of the display device 1000. The control module CM may be a microprocessor. For example, the control module CM activates or deactivates the display panel DP. The control module CM controls other modules such as the image input module IIM or the audio input module AIM based on a touch signal received from the display panel DP.

The wireless communication module TM can transmit/receive a wireless signal with other terminals using wireless protocol such as Bluetooth or Wi-Fi. The wireless communication module TM can transmit/receive voice signals by using a general communication line. The wireless communication module TM includes a transmitter TM1 that modulates and transmits a signal, and a receiver TM2 that demodulates a received signal.

The image input module JIM processes an image signal to be converted into image data that can be displayed on the display panel DP. The audio input module AIM receives an external sound signal by a microphone in a recording mode or a voice recognition mode, etc., to be converted into electrical audio data.

The external interface IF is connected to an external charger, a wired/wireless data port, or a card socket, such as a memory card, a SIM/UIM card, etc.

The second electronic module EM2 includes an audio output module AOM, a light emitting module LM, a light receiving module LRM, and a camera module CMM, and at least some of these are the optical elements ES, as shown in FIG. 1 and FIG. 2, that are positioned on the rear surface of the display panel DP. The optical element ES includes the light emitting module LM, the light receiving module LRM, and the camera module CMM. In addition, the second electronic module EM2 may be directly mounted on the motherboard, or may be mounted on a separate substrate and electrically connected to the display panel DP through a connector, or electrically connected to the first electronic module EM1.

The audio output module AOM converts audio data received from the wireless communication module TM or audio data stored in the memory MM to be output.

The light emitting module LM generates and outputs light. The light emitting module LM may output infrared light. For example, the light emitting module LM includes an LED element. The light receiving module LRM detects infrared light. For example, the light receiving module LRM is activated when infrared light above a predetermined level is detected. The light receiving module LRM includes a CMOS sensor. After outputting the infrared light generated by the light emitting module LM, the infrared light is reflected by an external subject, such as a user's finger or a face, and the reflected infrared light is incident on the light receiving module LRM. The camera module CMM can acquire an external image.

In an embodiment, the optical element ES additionally includes a light sensor or a thermal sensor. The optical element ES detects an external object through the front surface or outputs a sound signal such as voice through the front surface. In addition, in an embodiment, the optical element ES includes a plurality of additional components, and is not necessarily limited to any one embodiment.

Again referring to FIG. 2, in an embodiment, the housing HM is coupled with the cover window WU. The cover window WU is disposed in a front side of the housing HM. The housing HM is combined with the cover window WU to provide a predetermined accommodation space. The display panel DP and the optical element ES are accommodated in the predetermined accommodation space provided between the housing HM and the cover window WU.

The housing HM includes a highly stiff material. For example, the housing HM includes a plurality of frames and/or plates made of one of glass, plastic, or metal, or a combination thereof. The housing HM reliably protects the components of the display device 1000 in the interior space from an external impact.

Figure 4:
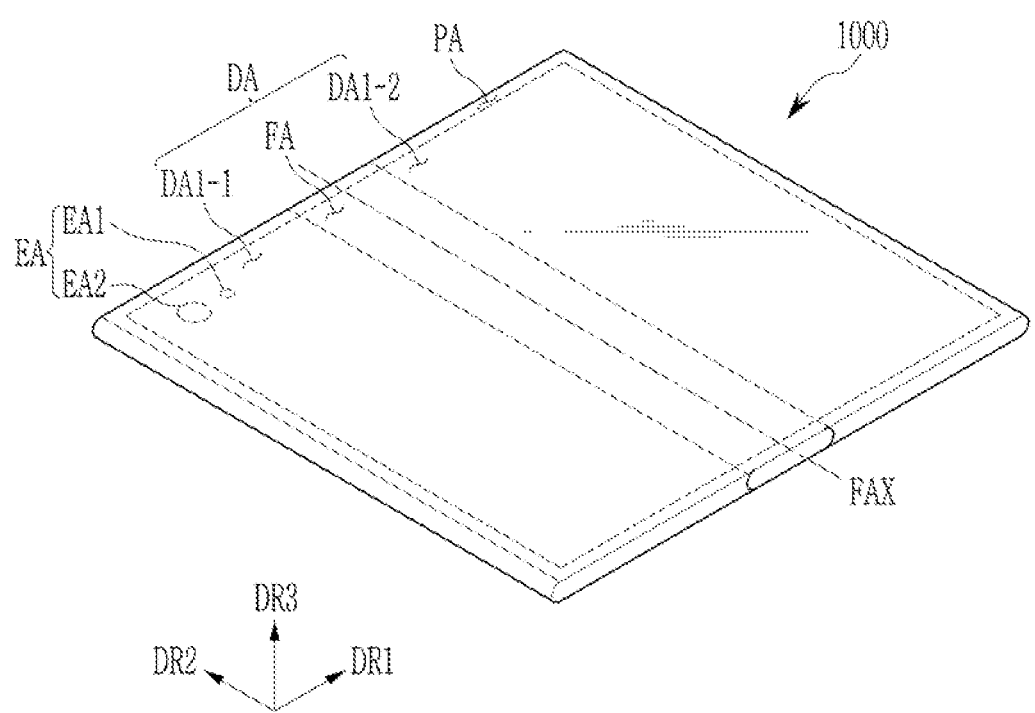
FIG. 4 is a perspective view of a light emitting display device according to an embodiment.

Hereinafter, a structure of the display device 1000 according to an embodiment is described with reference to FIG. 4. FIG. 4 is a perspective view of a display device according to an embodiment. A repeated description of the same configurations as described with reference to FIGS. 1-3 is omitted.

The embodiment of FIG. 4 is a foldable display device in which the display device 1000 is folded based on a folding line FAX.

Referring to FIG. 4, in an embodiment, the display device 1000 is a foldable display device. The display device 1000 can be folded outward or inward based on the folding axis FAX. When being folded outward, the display surface of the display device 1000 is positioned on the outside in the third direction DR3, so that the images is displayed in both directions. When being folded inward, the display surface is positioned on the inside in the third direction DR3 and cannot be visually perceived from the outside.

In an embodiment, the display device 1000 includes a display area DA, a component area EA, and a non-display area PA. The display area DA is divided into a first/first display area DA1-1, a first/second display area DA1-2, and a foldable area FA. The first/first display area DA1-1 and the first/second display area DA1-2 are positioned on the left and right sides, respectively, of the folding axis FAX, and the foldable area FA is positioned between the first/first display area DA1-1 and the first/second display area DA1-2. For example, when being folded outward about the folding axis FAX, the first/first display area DA1-1 and the first/second display area DA1-2 face outward in the third direction DR3, and the images can be displayed in both directions. In addition, when being folded inward about the folding axis FAX, the first/first display area DA1-1 and the first/second display area DA1-2 face inward, and images cannot be visually perceived from the outside.

Figure 5:
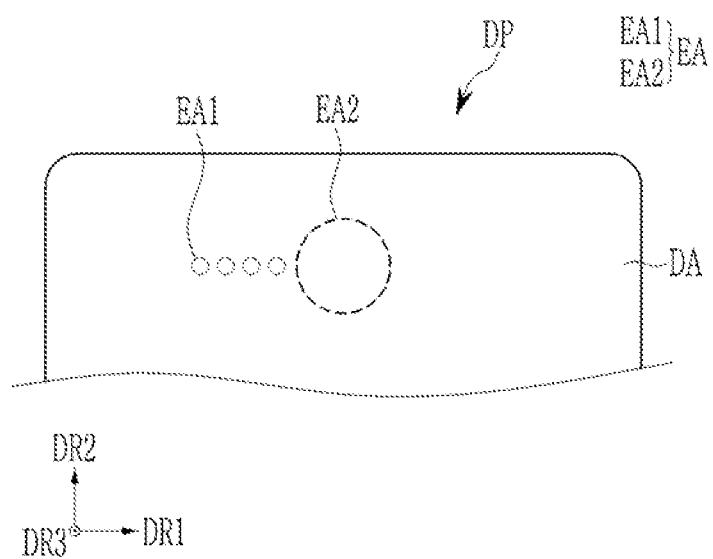
FIG. 5 is a top plan view of a partial area of a light emitting display device according to an embodiment.

FIG. 5 is a top plan view of a partial area of a light emitting display device according to an embodiment.

FIG. 5 shows a part of the light emitting display panel DP of a mobile phone according to an embodiment.

The light emitting display panel DP includes a display area DA positioned on the front surface and a component area EA on the front surface, and specifically includes a first component area EA1 and a second component area EA2. In addition, in an embodiment of FIG. 5, the first component area EA1 is positioned adjacent to the second component area EA2. In an embodiment of FIG. 5, the first component area EA1 is positioned to the left of the second component area EA2. The position and number of first component areas EA1 may vary for each embodiment. In FIG. 5, the optical element corresponding to the second component area EA2 may be a camera, and the optical element corresponding to the first component area EA1 may be an optical sensor.

A plurality of light emitting diodes LED and a plurality of pixel circuit parts that generate and transmit a light emitting current to each of a plurality of light emitting diodes LED are formed in the display area DA. For example, one light emitting diode LED and one pixel circuit part are referred to as a pixel PX. In the display area DA, the pixel circuit parts and the light emitting diodes LED are formed one-to-one. The display area DA is hereinafter also referred to as 'a normal display area'. Although FIG. 5 does not show the structure of the light emitting display panel DP under the cut line, the display area DA extends below the cut line.

The first component area EA1 includes a transparent layer that allows light to pass through. The transparent layer does not have a conductive layer or a semiconductor layer, but includes a sub-photosensor area OPS (illustrated in FIG. 17) in a lower panel layer, and an opening, hereinafter, also referred to as an additional opening, is formed at a position corresponding to the sub-photosensor area (OPS), thereby having a structure that does not block light.

A plurality of adjacent sub-photosensor area OPSs constitute one first component area EA1. Even if the sub-photosensor area OPS is positioned in the lower panel layer, there might not be an opening in upper layers of the lower panel layer. For example, an opening is formed in an upper panel layer that both partially overlaps and partially blocks the sub-photosensor area OPS positioned in the first component area EA1. These upper layers include a black pixel definition layer 380 and a light blocking layer 220, which will be described below. The part of the sub-photosensor area OPS of the first component area EA1 transmits light, so that even if a sensor is formed on the rear surface of the light emitting display device, the front surface can be detected. On the other hand, if the sub-photosensor area OPS is positioned in the display area, it is blocked by the upper layers, such as the aforementioned black pixel definition layer 380 and/or light blocking layer 220, and accordingly, there is not an area through which light can pass, so that the sensor cannot be positioned on the rear surface. FIG. 7 to FIG. 19, described below, show one pixel and one sub-photosensor area OPS, and has the pixel structure of the first component area EA1 or the display area DA. On the other hand, according to an embodiment, the pixel of FIG. 7 to FIG. 19 is also formed in the second component area EA2.

The light emitting display panel DP according to an embodiment is divided into the lower panel layer and an upper panel layer. The lower panel layer is where the light emitting diode LED and the pixel circuit part that constitute the pixel are positioned, and include an encapsulation layer (referring to 400 of FIG. 20) that covers the pixels. That is, the lower panel layer extends from the substrate (referring to 110 in FIG. 20) to the encapsulation layer and also includes an anode (referring to Anode in FIG. 20), a black pixel definition layer (referring to 380 in FIG. 20), an emission layer (referring to EML in FIG. 20), a spacer (referring to 385 in FIG. 20), a functional layer (referring to FL in FIG. 20), and a cathode (referring to Cathode in FIG. 20), and includes an insulating layer, a semiconductor layer, and a conductive layer between the substrate and the anode. On the other hand, the upper panel layer is positioned above the encapsulation layer and includes a sensing insulating layer (referring to 501, 510, and 511 in FIG. 20) and a plurality of sensing electrodes (referring to 540 and 541 of FIG. 20) that can sense a touch, and also includes a light blocking layer (referring to 220 of FIG. 20), a color filter (referring to 230 of FIG. 20), and a planarization layer (referring to 550 of FIG. 20).

The structure of the lower panel layer of the display area DA is described with reference to FIG. 7 to FIG. 20.

FIG. 5 shows that the peripheral area is further positioned outside the display area DA. In addition, FIG. 5 shows a display panel for a mobile phone, but embodiments are not necessarily limited thereto, as long as an optical element can be positioned on the rear surface of the display panel, and that the display panel is a flexible display device. In the case of the foldable display device, the second component area EA2 and the first component area EA1 may be formed in positions that differ from those shown in FIG. 5.

In the following, the circuit structure of a pixel positioned on the lower panel layer of the light emitting display panel DP is described in detail with reference to FIG. 6.

Figure 6:
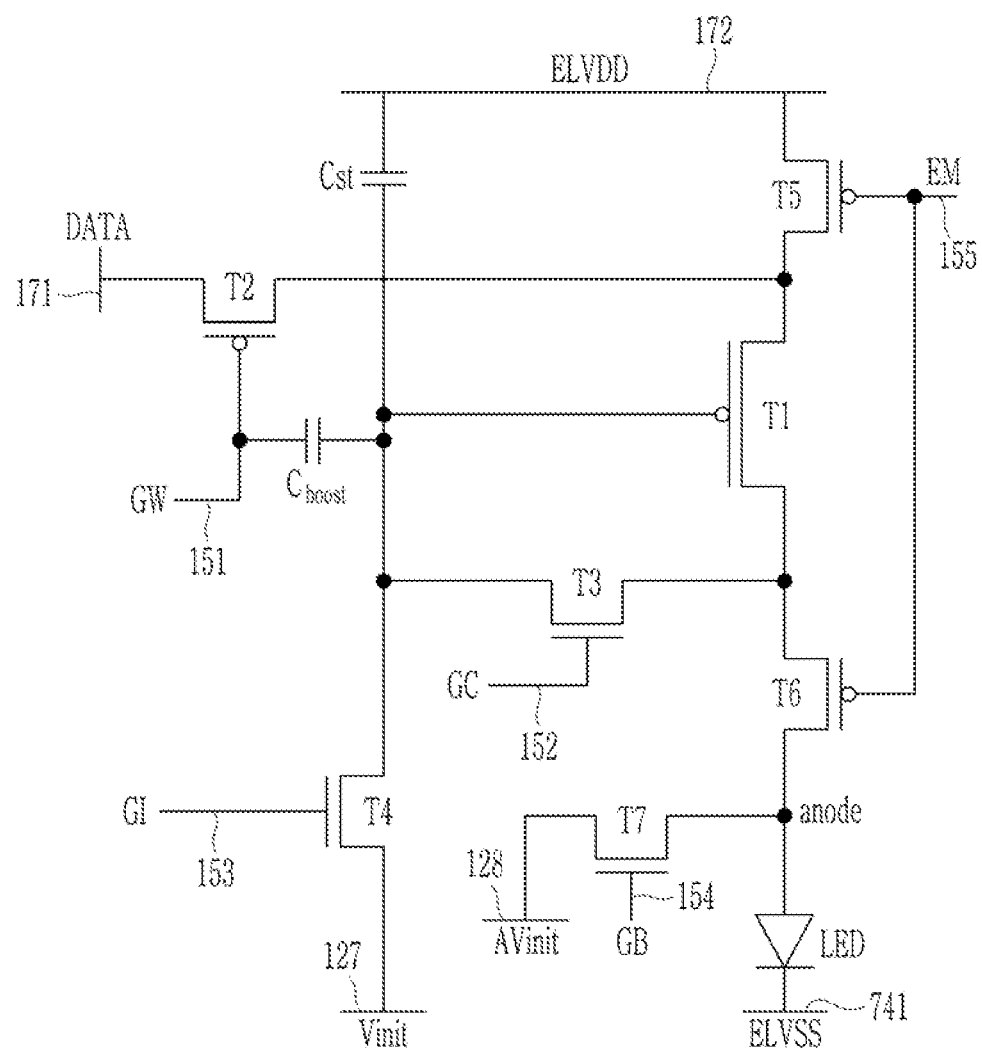
FIG. 6 is a circuit diagram of a pixel of a light emitting display device according to an embodiment.

FIG. 6 illustrates a pixel structure of the display area DA and/or the first component area EA1, which includes the sub-photosensor area OPS. For example, a plurality of adjacent sub-photosensor areas OPS may constitute one first component area EA1. For example, the sub-photosensor area OPS is positioned in the first component area EA1 when a light blocking part such as the light blocking layer is removed, and the sub-photosensor area OPS is positioned in the display area DA when the light is blocked by the light blocking layer on the upper part of the sub-photosensor area OPS. On the other hand, some sub-photosensor areas OPS may be positioned in the first component area EA1 even if light is blocked by the light blocking layer on the upper part. In addition, according to an embodiment, the pixel is formed in the second component area EA2, and the circuit diagram of the pixel is the same as that shown in FIG. 6.

First, the circuit structure of the pixel will be described with reference to FIG. 6.

FIG. 6 is a circuit diagram of one pixel of a light emitting display device according to an embodiment.

According to an embodiment, FIG. 6 shows a circuit structure of a pixel circuit part and a light emitting diode LED formed in the display area DA, the first component area EA1, and the second component area EA2.

A pixel according to an embodiment includes a plurality of transistors T1, T2, T3, T4, T5, T6, and 17, a storage capacitor Cst, a boost capacitor $C_{boost}$, and a light emitting diode LED that are connected to a plurality of wires 127, 128, 151, 152, 153, 154, 155, 171, 172, and 741. For example, the transistors and the capacitors, except for the light emitting diode LED, constitute the pixel circuit part. According to an embodiment, the boost capacitor Cboost is omitted. The plurality of transistors T1, T2, T3, T4, T5, T6, and 17 are divided into polycrystalline semiconductor transistors that include a polycrystalline semiconductor and oxide semiconductor transistors that include an oxide semiconductor. The polycrystalline semiconductor transistor include a driving transistor T1, a second transistor T2, a fifth transistor T5, and a sixth transistor T6, and the oxide semiconductor transistors include a third transistor T3, a fourth transistor T4, and a seventh transistor T7.

The plurality of wires 127, 128, 151, 152,153, 154, 155, 171, 172, and 741 are connected to the pixel PX. The plurality of wires include a first initialization voltage line 127, a second initialization voltage line 128, a first scan line 151, a second scan line 152, an initialization control line 153, a bypass control line 154, a light emission control line 155, a data line 171, a driving voltage line 172, and a common voltage line 741.

The first scan line 151 is connected to a scan driver that transmits a first scan signal GW to the second transistor T2 and the seventh transistor T7. The second scan line 152 transmits a second scan signal GC to the third transistor T3. A voltage of an opposite polarity to the voltage applied to the first scan line 151 is applied to the second scan line 152 at the same time as the signal of the first scan line 151. For example, when a negative voltage is applied to the first scan line 151, a positive voltage is applied to the second scan line 152. The initialization control line 153 transmits an initialization control signal GI to the fourth transistor T4, the light emitting control line 155 transmits a light emitting control signal EM to the fifth transistor T5 and the sixth transistor T6, and the bypass control line 154 transmits a bypass control signal GB to the seventh transistor T7. A voltage of the opposite polarity is applied to the bypass control signal GB at the same time as the first scan signal GW, and is the same signal as the second scan signal GC.

The data line 171 transmits a data voltage DATA generated by a data driver, and accordingly, the magnitude of a light emitting current transmitted to the light emitting diode LED changes, and thus the luminance of the light emitting diode LED changes. The driving voltage line 172 applies a driving voltage ELVDD. The first initialization voltage line 127 transmits a first initialization voltage Vinit, and the second initialization voltage line 128 transmits a second initialization voltage AVinit. The common voltage line 741 applies a common voltage ELVSS to the cathode of the light emitting diode LED. In an embodiment, the voltages applied to the driving voltage line 172, the first and second initialization voltage lines 127 and 128, and the common voltage line 741 are constant voltages, respectively.

The driving transistor T1, also called a first transistor, is a p-type transistor and has a polycrystalline silicon semiconductor as a semiconductor layer. The driving transistor T1 adjusts the magnitude of the light emitting current output to the anode of the light emitting diode LED according to the magnitude of the voltage of the gate electrode of the driving transistor T1, such as the voltage stored in the storage capacitor Cst. Since the brightness of the light emitting diode LED is adjusted according to the magnitude of the light emitting current output to the anode of the light emitting diode LED, the light emitting luminance of the light emitting diode LED is adjusted according to the data voltage DATA applied to the pixel. For this purpose, the first electrode of the driving transistor T1 receives the driving voltage ELVDD and is connected to the driving voltage line 172 via the fifth transistor T5. In addition, the first electrode of the driving transistor T1 is also connected to the second electrode of the second transistor T2 to receive the data voltage DATA. The second electrode of the driving transistor T1 outputs the light emitting current to the light emitting diode LED and is connected to the anode of the light emitting diode LED via the sixth transistor T6, hereinafter referred to as an output control transistor. In addition, the second electrode of the driving transistor T1 is also connected to the third transistor T3 and transmits the data voltage DATA applied to the first electrode to the third transistor T3. The gate electrode of the driving transistor T1 is connected to an electrode, hereinafter referred to as 'a second storage electrode', of the storage capacitor Cst. Accordingly, the voltage of the gate electrode of the driving transistor T1 changes according to the voltage stored in the storage capacitor Cst, and accordingly, the light emitting current output by the driving transistor T1 changes. The storage capacitor Cst maintains the voltage of the gate electrode of the driving transistor T1 constant for one frame. The gate electrode of the driving transistor T1 is also be connected to the third transistor T3 so that the data voltage DATA applied to the first electrode of the driving transistor T1 is transmitted to the gate electrode of the driving transistor T1 through the third transistor T3. The gate electrode of the driving transistor T1 is also connected to the fourth transistor T4 and is initialized by receiving the first initialization voltage Vinit.

The second transistor T2 is a p-type transistor and has a polycrystalline silicon semiconductor as a semiconductor layer. The second transistor T2 receives the data voltage DATA into the pixel. The gate electrode of the second transistor T2 is connected to the first scan line 151 and an electrode, hereinafter referred to as 'a lower boost electrode', of the boost capacitor Cboost. The first electrode of the second transistor T2 is connected to the data line 171. The second electrode of the second transistor T2 is connected to the first electrode of the driving transistor T1. When the second transistor T2 is turned on by a negative voltage of the first scan signals GW received through the first scan line 151, the data voltage DATA received through the data line 171 is transmitted to the first electrode of the driving transistor T1, and the data voltage DATA is transferred to the gate electrode of the driving transistor T1 and stored in the storage capacitor Cst.

The third transistor T3 is an n-type transistor and has an oxide semiconductor as a semiconductor layer. The third transistor T3 electrically connects the second electrode of the driving transistor T1 and the gate electrode of the driving transistor T1. As a result, that the third transistor T3 allows the data voltage DATA to be compensated by the threshold voltage of the driving transistor T1 and then stores the data voltage in the second storage electrode of the storage capacitor Cst. The gate electrode of the third transistor T3 is connected to the second scan line 152, and the first electrode of the third transistor T3 is connected to the second electrode of the driving transistor T1. The second electrode of the third transistor T3 is connected to the second storage electrode of the storage capacitor Cst, the gate electrode of the driving transistor T1, and the other electrode, hereinafter referred to as 'an upper boost electrode', of the boost capacitor Cboost. The third transistor T3 is turned on by a positive voltage of the second scan signals CC received through the second scan line 152, and connects the gate electrode of the driving transistor T1 and the second electrode of the driving transistor T1. The voltage applied to the gate electrode of the driving transistor T1 is transmitted to the second storage electrode of the storage capacitor Cst and stored in the storage capacitor Cst. The voltage stored in the storage capacitor Cst is stored so that when the driving transistor T1 is turned off, the voltage of the gate electrode of the driving transistor T1 is stored so that the threshold voltage Vth of the driving transistor T1 is compensated.

The fourth transistor T4 is an n-type transistor and has an oxide semiconductor as a semiconductor layer. The fourth transistor T4 initializes the gate electrode of the driving transistor T1 and the second storage electrode of the storage capacitor Cst. The gate electrode of the fourth transistor T4 is connected to the initialization control line 153, and the first electrode of the fourth transistor T4 is connected to the first initialization voltage line 127. The second electrode of the fourth transistor T4 is connected to the second electrode of the third transistor T3, the second storage electrode of the storage capacitor Cst, the gate electrode of the driving transistor T1, and the upper boost electrode of the boost capacitor Cboost. The fourth transistor T4 is turned on by a positive voltage of the initialization control signal GI received through the initialization control line 153, and the first initialization voltage Vinit is transmitted to the gate electrode of the driving transistor T1, the second storage electrode of the storage capacitor Cst, and the upper boost electrode of the boost capacitor Cboost to be initialized.

The fifth transistor T5 and the sixth transistor T6 are p-type transistors and have a polycrystalline silicon semiconductor as a semiconductor layer.

The fifth transistor T5 transmits a driving voltage (ELVDD) to the driving transistor T1. The gate electrode of the fifth transistor T5 is connected to the light emitting control line 155, the first electrode of the fifth transistor T5 is connected to the driving voltage line 172, and the second electrode of the fifth transistor T5 is connected to the first electrode of the driving transistor T1.

The sixth transistor T6 transmits the light emitting current output from the driving transistor T1 to the light emitting diode LED. The gate electrode of the sixth transistor T6 is connected to the light emitting control line 155, the first electrode of the sixth transistor T6 is connected to the second electrode of the driving transistor T1, and the second electrode of the sixth transistor T6 is connected to the anode of the light emitting diode LED.

The seventh transistor T7 is an n-type transistor and has an oxide semiconductor as a semiconductor layer. The seventh transistor T7 initializes the anode of the light emitting diode LED. Hereinafter, the seventh transistor T7 is also referred to as an anode initialization transistor. The gate electrode of the seventh transistor T7 is connected to the bypass control line 154, the first electrode of the seventh transistor T7 is connected to the anode of the light emitting diode LED, and the second electrode of the seventh transistor T7 is connected to the second initialization voltage line 128. When the seventh transistor T7 is turned on by a positive voltage of the bypass control signals GB flowing through the bypass control line 154, the second initialization voltage AVinit is applied to the anode of the light emitting diode LED and is initialized.

Although one pixel PX has been described as including seven transistors T1 to 17 and two capacitors, such as the storage capacitor Cst, the boost capacitor Cboost, embodiments of the disclosure are not necessarily limited thereto, and in an embodiment, the boost capacitor Cboost is omitted. In addition, although the third transistor T3, the fourth transistor T4, and the seventh transistor T7 are n-type transistors, in an embodiment, one of them is an n-type transistor and the other transistors are formed as a p-type transistor.

In the above, the circuit structure of a pixel formed in the display area DA was described with reference to FIG. 6.

Hereinafter, the detailed planar structure and stacked structure of a pixel formed in the display area DA will be described through FIG. 7 to FIG. 20, and each pixel of a following embodiment includes one sub-photosensor area OPS.

FIG. 7 to FIG. 19 illustrate a structure of each layer according to a manufacturing order of a lower panel layer of a light emitting display device according to an embodiment.

Figure 7:
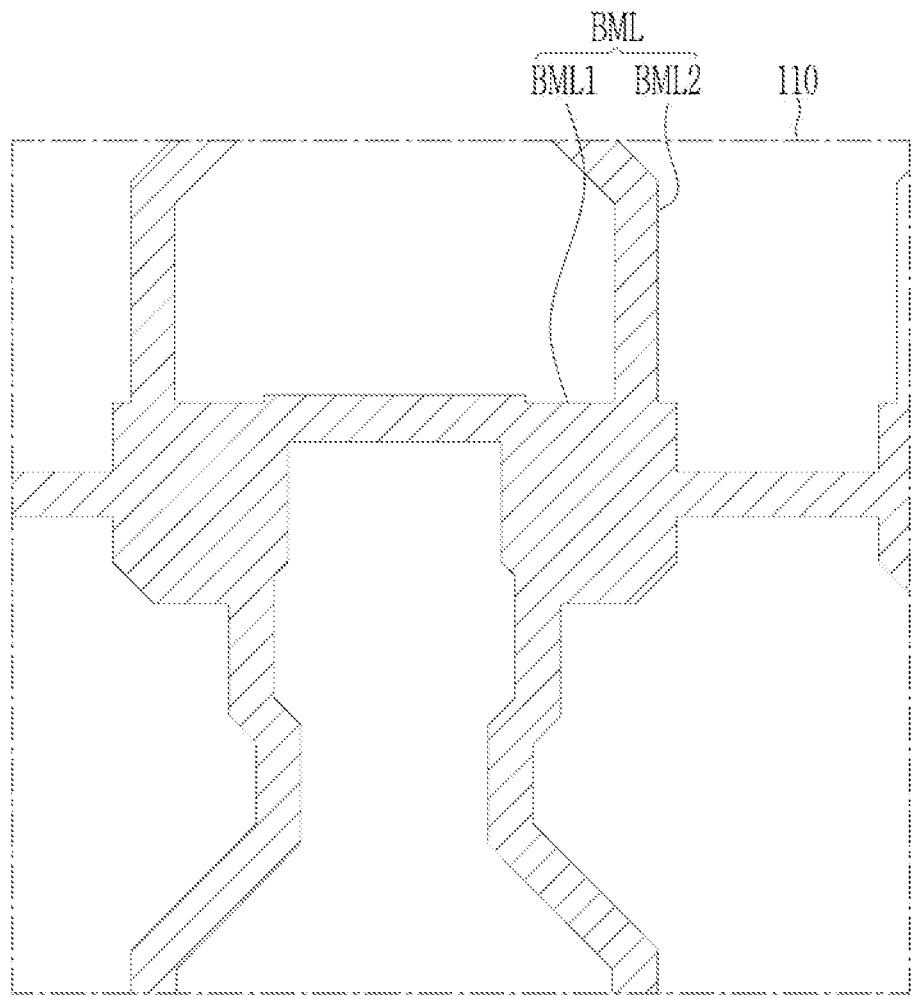
FIG. 7 to FIG. 19 illustrate a structure of each layer according to a manufacturing order of a lower panel layer of a light emitting display device according to an embodiment.

Referring to FIG. 7, in an embodiment, a metal layer BML is positioned on a substrate 110.

The substrate 110 may include a rigid material that does not bend, such as glass, or a flexible material that can be bent, such as plastic or polyimide. In the case of a flexible substrate, as shown in FIG. 20, the substrate 110 has a double-layered structure of a polyimide and a barrier layer formed of an inorganic insulating material.

The metal layer BML includes a plurality of expansion parts BML1 and a connection part BML2 that connects the plurality of expansion parts BML1 to each other. The expansion part BML1 of the metal layer BML overlaps with a channel 1132 (see FIG. 8) of the driving transistor T1 of a first semiconductor layer that is subsequently formed. The metal layer BML is also called a lower shielding layer, and includes a metal or a metal alloy such as at least one of copper (Cu), molybdenum (Mo), aluminum (Al), or titanium (Ti), etc., and may additionally include amorphous silicon and may include a single layer or multiple layers.

Figure 20:
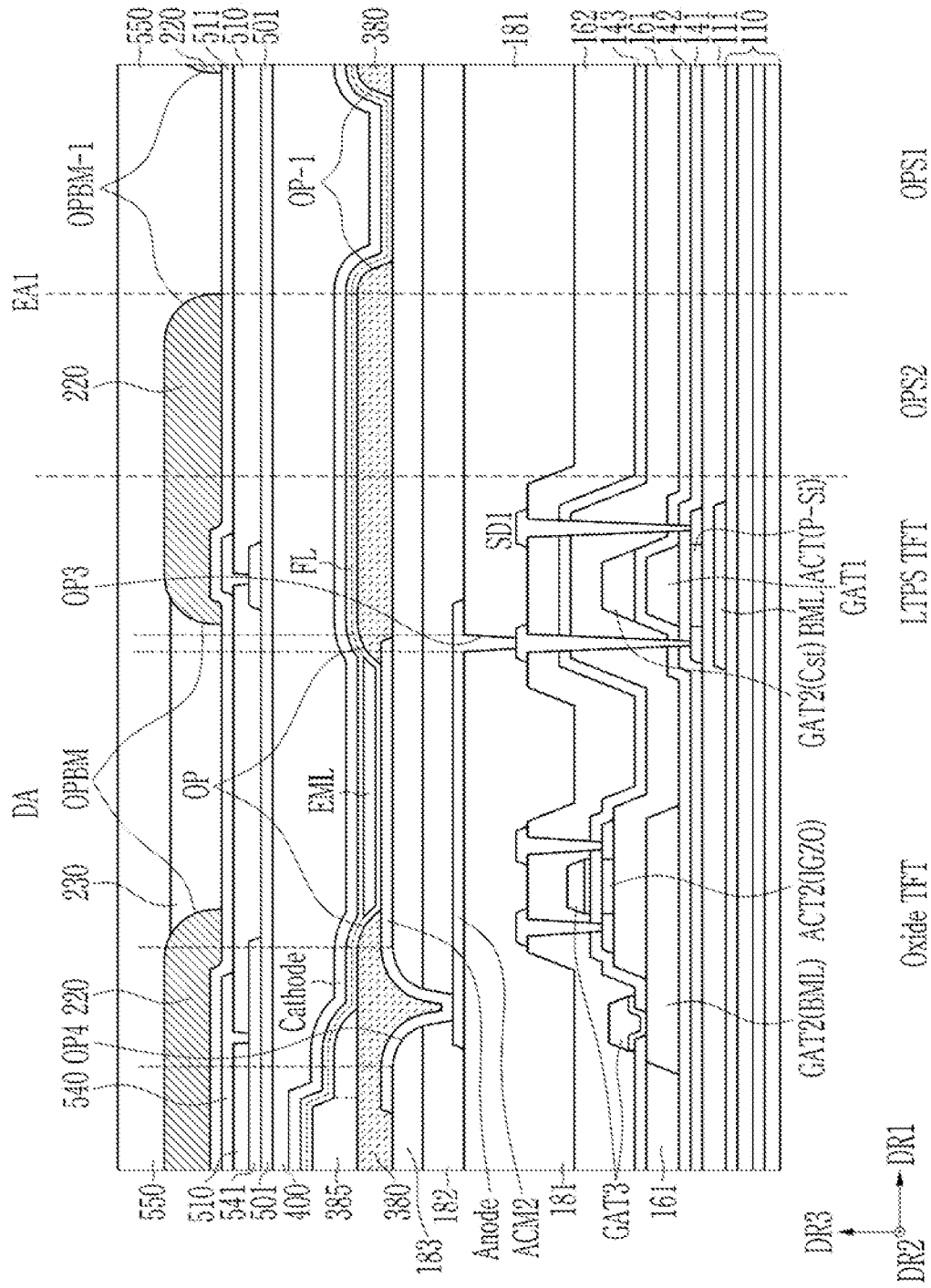
FIG. 20 is a cross-sectional view of a light emitting display device according to an embodiment.

Referring to FIG. 20, in an embodiment, a buffer layer 111 that covers the substrate 110 and the metal layer BML is disposed on the substrate 110 and the metal layer BML. The buffer layer 111 blocks penetration of impurity elements into a first semiconductor layer 130, described below with reference to FIG. 8, and is an inorganic insulating layer that includes at least one of a silicon oxide (SiOx), a silicon nitride (SiNx), or a silicon oxynitride (SiOxNy), etc.

Figure 8:
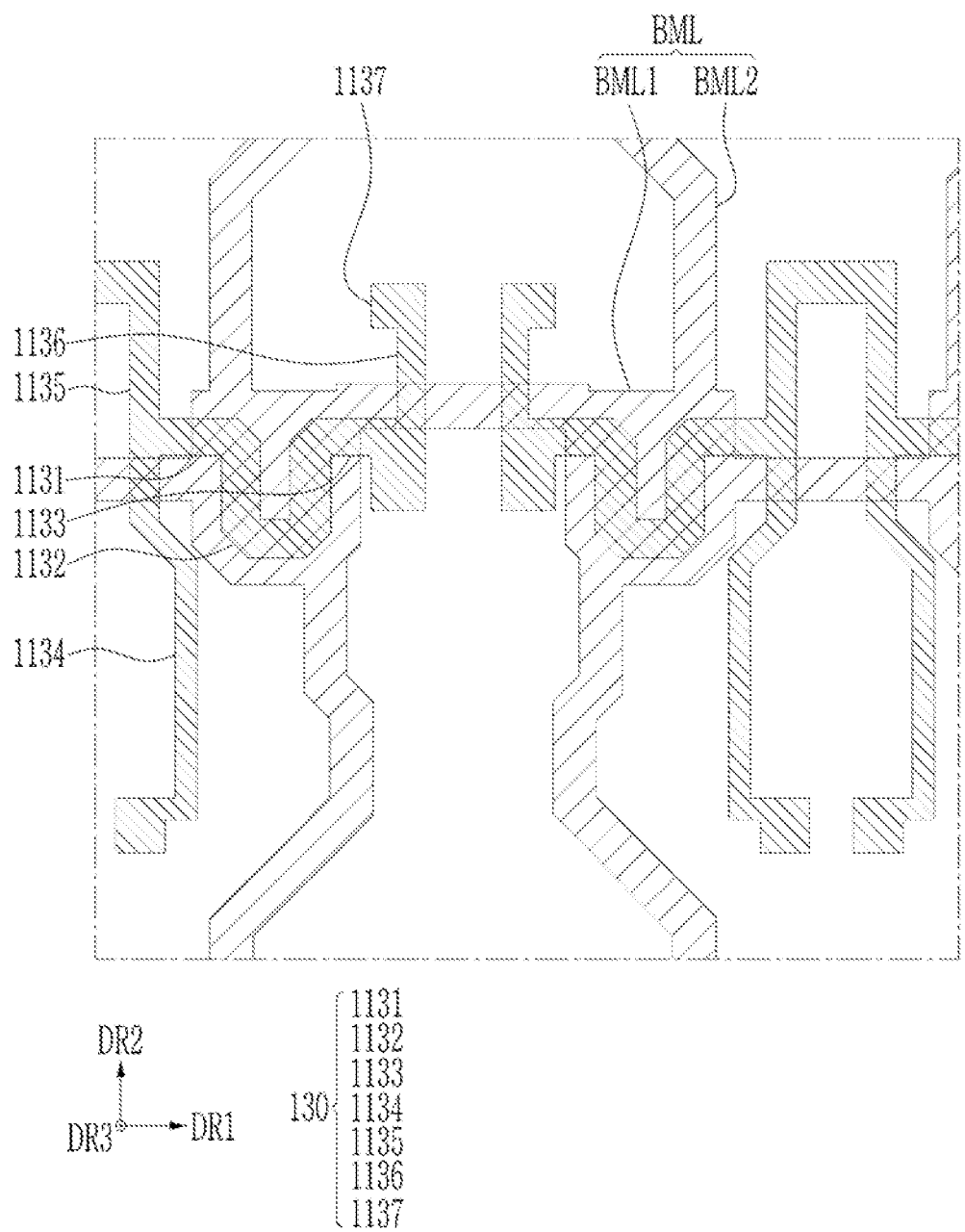

Referring to FIG. 8, in an embodiment, the first semiconductor layer 130 formed of a silicon semiconductor, such as a polycrystalline semiconductor, is formed on the buffer layer 111. The first semiconductor layer 130 includes a channel 1132, a first area 1131, and a second area 1133 of the driving transistor T1. In addition, the first semiconductor layer 130 includes channels of the second transistor T2, the fifth transistor T5, the sixth transistor T6, and the seventh transistor T7 as well as the driving transistor T1, and has a conductive layer characteristic by plasma processing or doping on both sides of each channel to serve as the first and second electrodes. A transistor that includes the first semiconductor layer 130 may be referred to as a polycrystalline semiconductor transistor.

The channel 1132 of the driving transistor T1 has a curved shape on a plane. However, the shape of channel 1132 of the driving transistor T1 is not necessarily limited thereto, and can be variously changed. For example, the channel 1132 of the driving transistor T1 may be bent into a different shape or may have a bar shape. The first area 1131 and the second area 1133 of the driving transistor T1 are positioned on both sides of the channel 1132 of the driving transistor T1. The first area 1131 and the second area 1133 in the first semiconductor layer 130 serve as the first electrode and the second electrode of the driving transistor T1.

A channel, a first area, and a second area of the second transistor T2 are positioned in a portion 1134 that extends downward from the first area 1131 of the driving transistor T1 in the first semiconductor layer 130. A channel, a first area, and a second area of the fifth transistor T5 are positioned in a portion 1135 that extends upward from the first area 1131 of the driving transistor T1. A portion 1136 of the first semiconductor layer 130 extends upward from second area 133, and a channel, a first area, and a second area of the seventh transistor T7 are positioned in a portion 1137 that further extends while being bent from the portion 1136.

Referring to FIG. 20, in an embodiment, a first gate insulating layer 141 is formed on the first semiconductor layer 130. The first gate insulating layer 141 is an inorganic insulating layer that includes at least one of a silicon oxide (SiOx), a silicon nitride (SiNx), or a silicon oxynitride (SiOxNy), etc.

Figure 9:
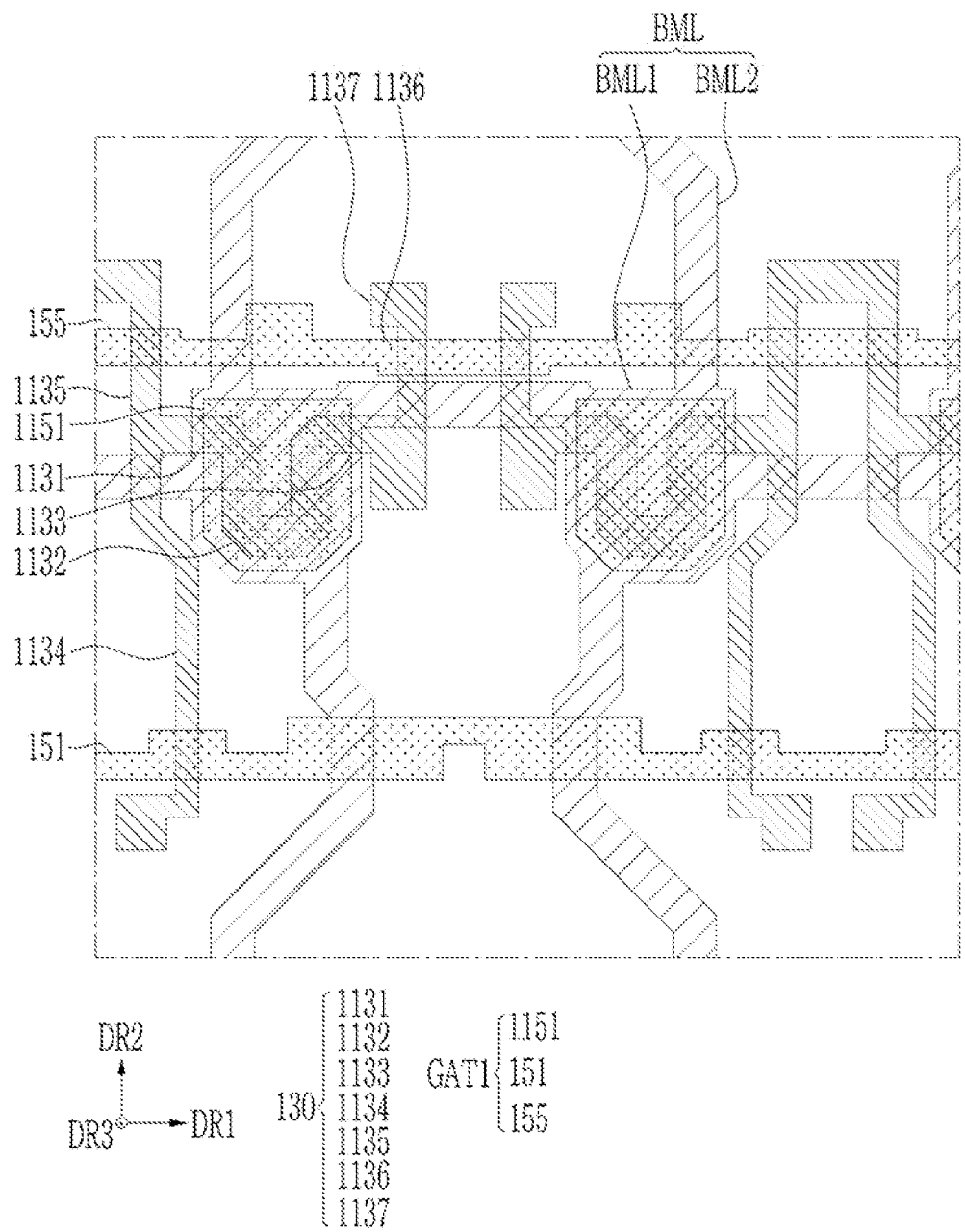

Referring to FIG. 9, in an embodiment, a first gate conductive layer GAT1 that includes a gate electrode 1151 of the driving transistor T1 is formed on the first gate insulating layer 141. The first gate conductive layer GAT1 includes a gate electrode of each of the second transistor T2, the fifth transistor T5, the sixth transistor T6, and the seventh transistor T7 as well as the driving transistor T1. The gate electrode 1151 of the driving transistor T1 overlaps the channel 1132 of the driving transistor T1. The channel 1132 of driving transistor T1 is covered by the gate electrode 1151 of the driving transistor T1.

The first gate conductive layer GAT1 further includes a first scan line 151 and a light emission control line 155. The first scan line 151 and the light emission control line 155 extend in an approximately horizontal direction, hereinafter also referred to as a first direction. The first scan line 151 is connected to the gate electrode of the second transistor T2. The first scan line 151 is integrally formed with the gate electrode of the second transistor T2.

The light emission control line 155 is connected to the gate electrode of the fifth transistor T5 and the gate electrode of the sixth transistor T6, and the light emission control line 155 and the gate electrode of the fifth transistor T5 and the sixth transistor T6 are integrally formed.

The first gate conductive layer GAT1 includes a metal, such as at least one of copper (Cu), molybdenum (Mo), aluminum (Al), titanium (Ti), or a metal alloy, and may be configured as a single layer or multiple layers.

After the first gate conductive layer GAT1 is formed, a plasma treatment or a doping process is performed to make the exposed area of the first semiconductor layer 130 conductive. For example, a portion of the first semiconductor layer 130 that is covered by the first gate conductive layer GAT1 is not conductive, and a portion of the first semiconductor layer 130 that is not covered by the first gate conductive layer GAT1 has the same characteristic as a conductive layer. As a result, the transistor that includes the conductive portion has a p-type transistor characteristic, and the driving transistor T1, the second transistor T2, the fifth transistor T5, the sixth transistor T6, and the seventh transistor T7 may be p-type or n-type transistors.

Referring to FIG. 20, in an embodiment, a second gate insulating layer 142 is formed on the first gate conductive layer GAT1 and the first gate insulating layer 141. The second gate insulating layer 142 is an inorganic insulating layer that includes at least one of a silicon oxide (SiOx), a silicon nitride (SiNx), or a silicon oxynitride (SiOxNy), etc.

Figure 10:
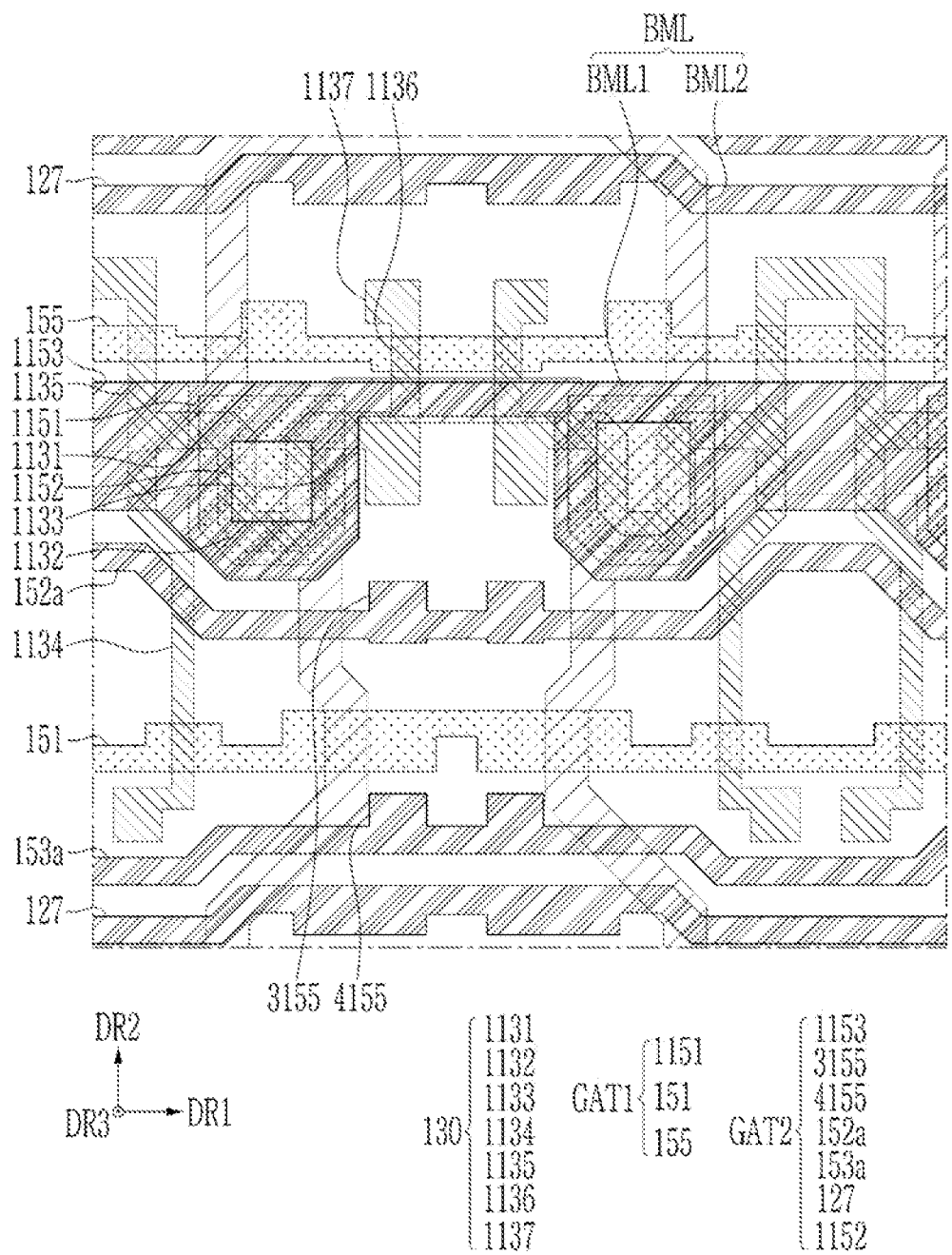

Referring to FIG. 10, in an embodiment, a second gate conductive layer GAT2 that includes a first storage electrode 1153 of a storage capacitor Cst, a lower shielding layer 3155 of a third transistor T3, and a lower shielding layer 4155 of a fourth transistor T4 is formed on the second gate insulating layer 142. The lower shielding layers 3155 and 4155 are positioned below the channels of the third transistor T3 and the fourth transistor T4, respectively, and shield the lower side of the channel from optical or electromagnetic interference.

The first storage electrode 1153 overlaps the gate electrode 1151 of the driving transistor T1 to form a storage capacitor Cst. An opening 1152 is formed in the first storage electrode 1153 of the storage capacitor Cst. The opening 1152 of the first storage electrode 1153 of the storage capacitor Cst overlaps the gate electrode 1151 of the driving transistor T1. The first storage electrode 1153 extends in the horizontal direction (the first direction DR1) and is connected to an adjacent first storage electrode 1153.

The lower shielding layer 3155 of the third transistor T3 overlaps a channel 3137 (see FIG. 11) and a gate electrode 3151 (see FIG. 12) of the third transistor T3. The lower shielding layer 4155 of the fourth transistor T4 overlaps a channel 4137 (see FIG. 11) and a gate electrode 4151 (see FIG. 12) of the fourth transistor T4.

The second gate conductive layer GAT2 further includes a lower second scan line 152a, a lower initialization control line 153a, and a first initialization voltage line 127. The lower second scan line 152a, the lower initialization control line 153a, and the first initialization voltage line 127 extend approximately in the horizontal direction (the first direction). The lower second scan line 152a is connected to the lower shielding layer 3155 of the third transistor T3. The lower initialization control line 153a is connected to the lower shielding layer 4155 of the fourth transistor T4. The lower initialization control line 153a is integrally formed with the lower shielding layer 4155 of the fourth transistor T4.

The second gate conductive layer GAT2 includes a metal or a metal alloy such as one or more of copper (Cu), molybdenum (Mo), aluminum (Al), or titanium (Ti), and may have a single layer or multiple layers.

Referring to FIG. 20, in an embodiment, a first interlayer insulating layer 161 is formed on the second gate conductive layer GAT2 and the second gate insulating layer 142. The first interlayer insulating layer 161 includes an inorganic insulating material that includes at least one of a silicon oxide (SiOx), a silicon nitride (SiNx), or a silicon oxynitride (SiOxNy), etc., and the inorganic insulating material is thickly formed, according to an embodiment.

Figure 11:
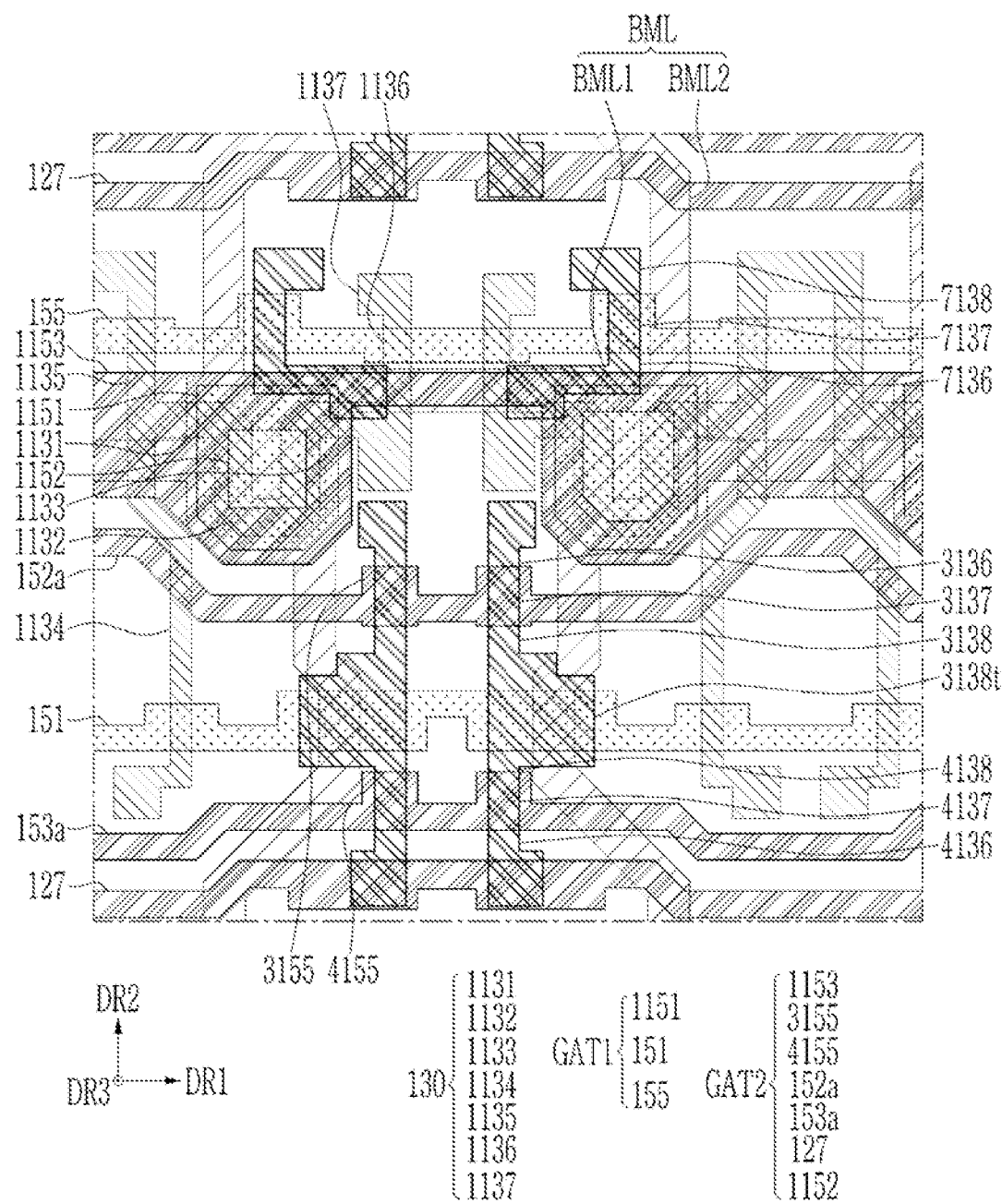

Referring to FIG. 11, in an embodiment, an oxide semiconductor layer that includes a channel 3137, a first area 3136 and a second area 3138 of the third transistor T3, a channel 4137, a first area 4136 and a second area 4138 of the fourth transistor T4, and a channel 7137, a first area 7136, and a second area 7138 of the seventh transistor T7 is formed on the first interlayer insulating layer 161. In addition, the oxide semiconductor layer includes an upper boost electrode 3138t of the capacitor Cboost.

The channel 3137, the first area 3136, and the second area 3138 of the third transistor T3, and the channel 4137, the first area 4136, and the second area 4138 of the fourth transistor T4 are connected to each other to form an integral body. In addition, since the channel 7137, the first area 7136, and the second area 7138 of the seventh transistor T7 are separated from the channel 3137 of the third transistor T3 and the channel 4137 of the fourth transistor T4, the oxide semiconductor layer is divided into two parts separated from each other.

The first area 3136 and the second area 3138 of third transistor T3 are positioned on both sides of the channel 3137 of the third transistor T3, and the first area 4136 and the second area 4138 of the fourth transistor T4 are positioned on both sides of the channel 4137 of the fourth transistor T4. The second area 3138 of the third transistor T3 is connected to the second area 4138 of the fourth transistor T4. The channel 3137 of the third transistor T3 overlaps the lower shielding layer 3155, and the channel 4137 of the fourth transistor T4 overlaps the lower shielding layer 4155. The first area 7136 and the second area 7138 of the seventh transistor T7 are positioned on both sides of the channel 7137 of the seventh transistor T7. A transistor that includes an oxide semiconductor layer may be referred to as an oxide semiconductor transistor.

The upper boost electrode 3138t of the capacitor Cboost is positioned between the second area 3138 of the third transistor T3 and the second area 4138 of the fourth transistor T4. The upper boost electrode 3138t of the boost capacitor Cboost overlaps a portion of the first scan line 151, hereinafter also referred to as a lower boost electrode of the boost capacitor Cboost, to configure the boost capacitor Cboost.

Referring to FIG. 20, in an embodiment, a third gate insulating layer 143 is formed on the oxide semiconductor layer and the first interlayer insulating layer 161.

The third gate insulating layer 143 is positioned on the entire surface of the oxide semiconductor layer and the first interlayer insulating layer 161. Accordingly, the third gate insulating layer 143 covers the upper surface and the side of the channel 3137, the first area 3136 and the second area 3138 of the third transistor T3, the channel 4137, the first area 4136, and the second area 4138 of the fourth transistor T4, and the upper boost electrode 3138t of the boost capacitor Cboost. However, embodiments are not necessarily limited thereto, and in an embodiment, the third gate insulating layer 143 is not positioned on the entire surface of the oxide semiconductor layer and the first interlayer insulating layer 161. For example, in an embodiment, the third gate insulating layer 143 overlaps the channel 3137 of the third transistor T3 but not the first area 3136 and the second area 3138. In addition, in an embodiment, the third gate insulating layer 143 overlaps the channel 4137 of the fourth transistor T4 but not the first area 4136 and the second area 4138.

The third gate insulating layer 143 includes an inorganic insulating layer that includes at least one of a silicon oxide (SiOx), a silicon nitride (SiNx), or a silicon oxynitride (SiOxNy), etc.

Figure 12:
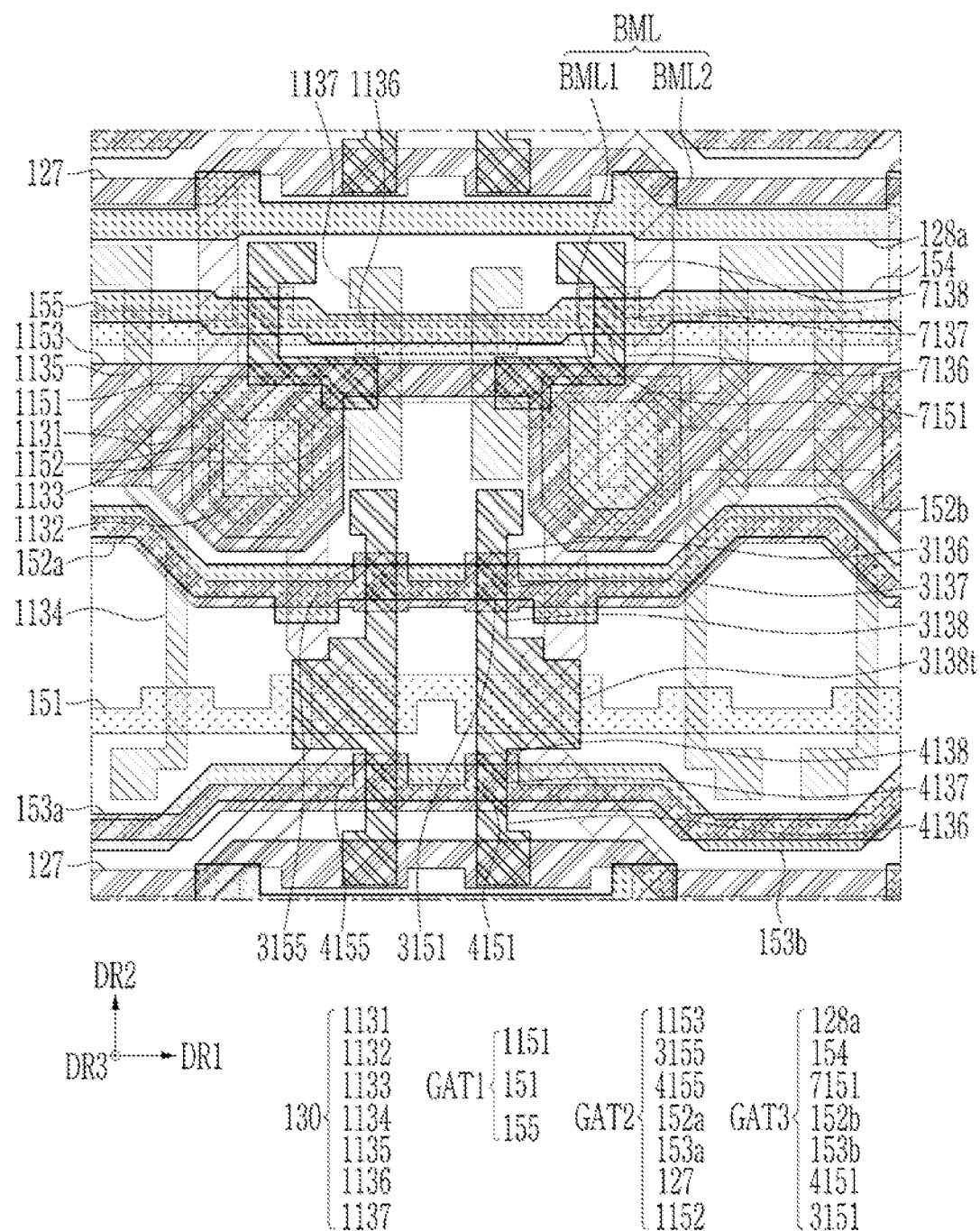

Referring to FIG. 12, in an embodiment, a third gate conductive layer GAT3 that includes a gate electrode 3151 of the third transistor T3, a gate electrode 4151 of the fourth transistor T4, and a gate electrode 7151 of the seventh transistor T7 is formed on the third gate insulating layer 143.

The gate electrode 3151 of the third transistor T3 overlaps the channel 3137 of the third transistor T3. The gate electrode 3151 of the third transistor T3 overlaps the lower shielding layer 3155 of the third transistor T3.

The gate electrode 4151 of the fourth transistor T4 overlaps the channel 4137 of the fourth transistor T4. The gate electrode 4151 of the fourth transistor T4 overlaps the lower shielding layer 4155 of the fourth transistor T4.

The gate electrode 7151 of the seventh transistor T7 overlaps the channel 7137 of the seventh transistor T7.

The third gate conductive layer GAT3 further includes an upper second scan line 152b, an upper initialization control line 153b, and a bypass control line 154.

The upper second scan line 152b, the upper initialization control line 153b, and the bypass control line 154 extend in approximately the horizontal direction (the first direction). The upper second scan line 152b forms a second scan line 152 together with the lower second scan line 152a. The upper second scan line 152b is connected to the gate electrode 3151 of the third transistor T3. The upper second scan line 152b is integrally formed with the gate electrode 3151 of the third transistor T3. The upper initialization control line 153b together with the lower initialization control line 153a constitutes the initialization control line 153. The upper initialization control line 153b is connected to the gate electrode 4151 of the fourth transistor T4. The upper initialization control line 153b is integrally formed with the gate electrode 4151 of the fourth transistor T4.

The bypass control line 154 is connected to the gate electrode 7151 of the seventh transistor T7, and the bypass control line 154 is integrally formed with the gate electrode 7151 of the seventh transistor T7.

In addition, the third gate conductive layer GAT3 further includes a lower second initialization voltage line 128a. The lower second initialization voltage line 128a extends in approximately the horizontal direction (the first direction), and receives the second initialization voltage AVinit.

The third gate conductive layer GAT3 includes a metal or a metal alloy such as at least one of copper (Cu), molybdenum (Mo), aluminum (Al), or titanium (Ti), and may be composed of a single layer or multiple layers.

After forming the third gate conductive layer GAT3, a portion of the oxide semiconductor layer covered by the third gate conductive layer GAT3 is formed into a channel through a plasma treatment or a doping process, and a portion of the oxide semiconductor layer not covered by the third gate conductive layer GAT3 becomes conductive. The channel 3137 of the third transistor T3 is positioned under the gate electrode 3151 and overlaps the gate electrode 3151. The first area 3136 and the second area 3138 of the third transistor T3 do not overlap the gate electrode 3151. The channel 4137 of the fourth transistor T4 is positioned under the gate electrode 4151 and overlaps the gate electrode 4151. The first area 4136 and the second area 4138 of the fourth transistor T4 do not overlap the gate electrode 4151. The channel 7137 of the seventh transistor T7 is positioned below the gate electrode 7151 and overlaps the gate electrode 7151. The first area 7136 and the second area 7138 of the seventh transistor T7 do not overlap the gate electrode 7151. The upper boost electrode 3138t does not overlap the third gate conductive layer GAT3, and has the same or similar conductive characteristic as the third gate conductive layer GAT3. A transistor that includes an oxide semiconductor layer may have characteristics of an n-type transistor.

Referring to FIG. 20, in an embodiment, a second interlayer insulating layer 162 is formed on the third gate conductive layer GAT3 and the third gate insulating layer 143. The second interlayer insulating layer 162 may have a single-layer or multi-layered structure. The second interlayer insulating layer 162 includes an inorganic insulating material such as one of a silicon nitride (SiNx), a silicon oxide (SiOx), or a silicon oxynitride (SiOxNy), and may include an organic material according to an embodiment.

Figure 13:
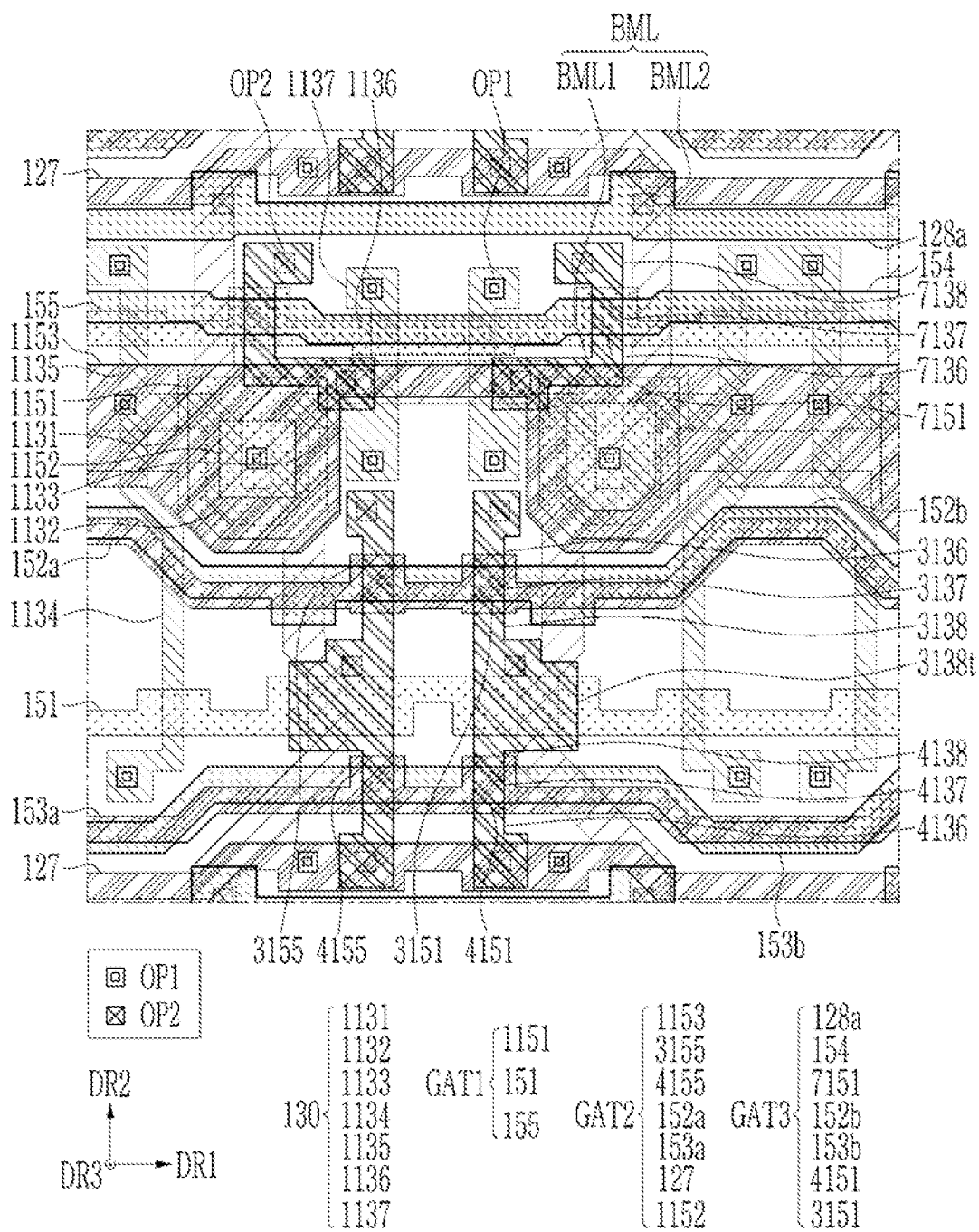

Referring to FIG. 13, in an embodiment, two types of openings OP1 and OP2 are formed in the second interlayer insulating layer 162. Two types of openings OP1 and OP2 are formed using different masks.

The opening OP1 is formed in at least one of the second interlayer insulating layer 162, the third gate insulating layer 143, the first interlayer insulating layer 161, the second gate insulating layer 142, or the first gate insulating layer 141, and exposes the first semiconductor layer 130, the first gate conductive layer, or the second gate conductive layer.

The opening OP2 is formed in the second interlayer insulating layer 162 and/or the third gate insulating layer 143, and exposes the oxide semiconductor layer or the third gate conductive layer.

One of the openings OP1 overlaps at least a portion of the gate electrode 1151 of the driving transistor T1, and is also formed in the third gate insulating layer 143, the first interlayer insulating layer 161, and the second gate insulating layer 142. In this case, one of the openings OP1 overlaps the opening 1152 of the first storage electrode 1153, and is positioned inside the opening 1152 of the first storage electrode 1153.

One of the openings OP2 overlaps at least a portion of the boost capacitor Cboost, and is further formed in the third gate insulating layer 143.

Another one of the openings OP1 overlaps at least a part of the second area 1133 of the driving transistor T1, and a third opening 3165 is formed in the third gate insulating layer 143, the first interlayer insulating layer 161, the second gate insulating layer 142, and the first gate insulating layer 141.

Another one of the openings OP2 overlaps at least a part of the first area 3136 of the third transistor T3 and is formed in the third gate insulating layer 143.

Figure 14:
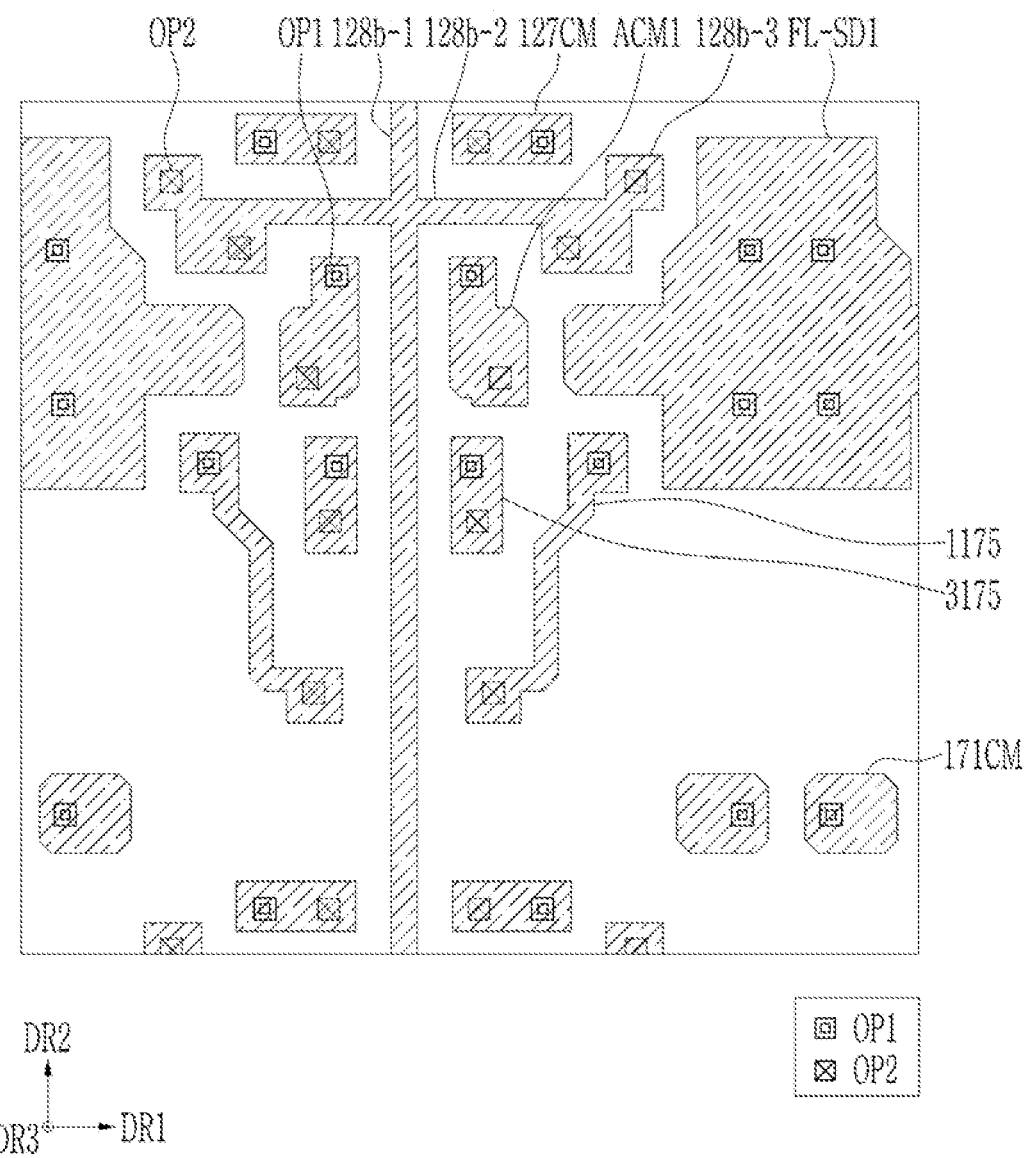
Figure 15:
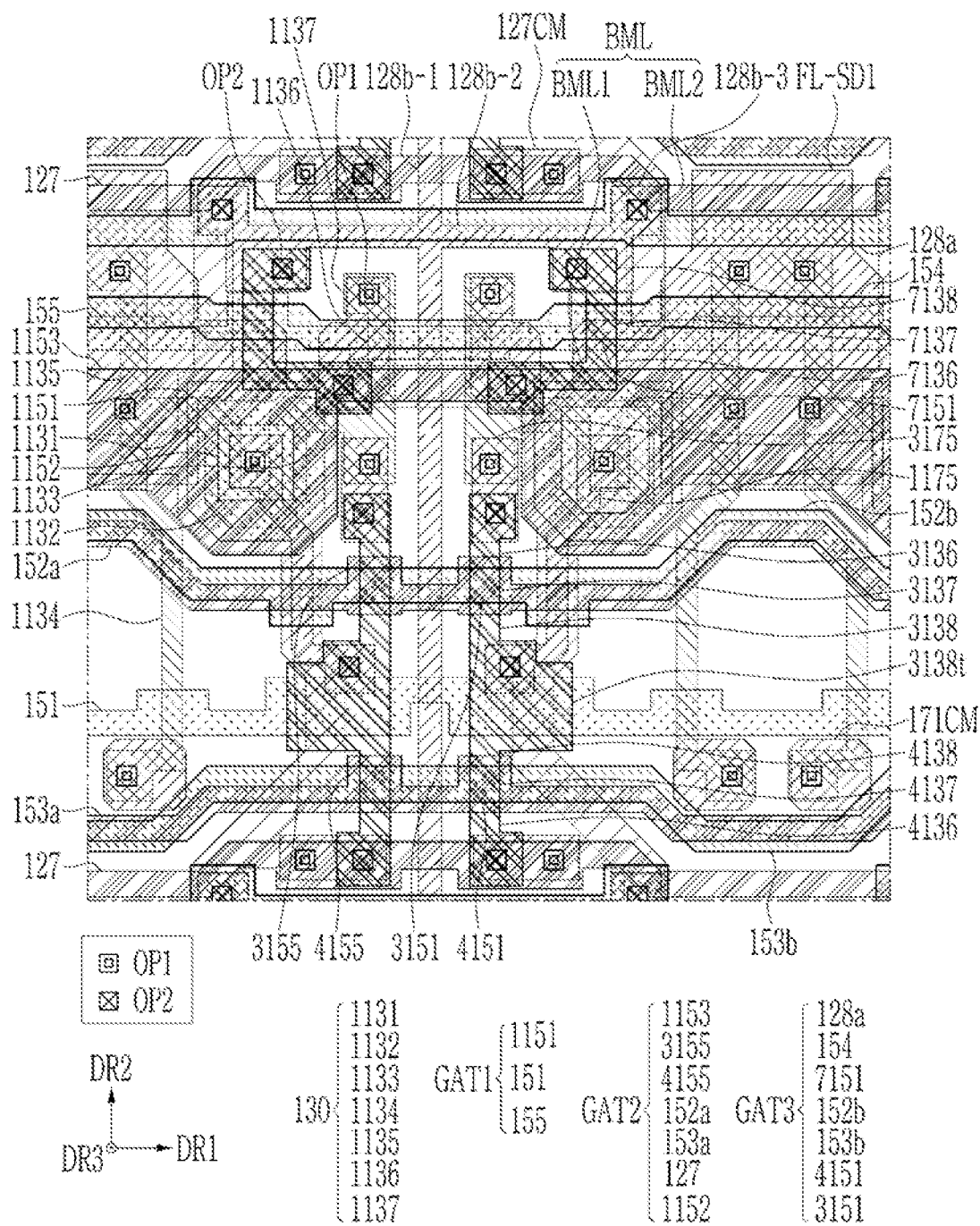

Referring to FIG. 14 and FIG. 15, in an embodiment, a first data conductive layer that includes a first connection electrode 1175 and a second connection electrode 3175 is formed on the second interlayer insulating layer 162. FIG. 14 is a top plan view that shows only the first data conductive layer, the opening OP1, and the opening OP2 to easily recognize the first data conductive layer, and FIG. 15 is a top plan view showing all layers below the first data conductive layer.

The first connection electrode 1175 overlaps the gate electrode 1151 of the driving transistor T1. The first connection electrode 1175 is connected to the gate electrode 1151 of the driving transistor T1 through the opening OP1 and the opening 1152 of the first storage electrode 1153. The first connection electrode 1175 overlaps the boost capacitor Cboost. The first connection electrode 1175 is connected to the upper boost electrode 3138t of the boost capacitor Cboost through the opening OP2. Accordingly, the gate electrode 1151 of the driving transistor T1 and the upper boost electrode 3138t of the boost capacitor Cboost are connected by the first connection electrode 1175. The gate electrode 1151 of the driving transistor T1 is also connected to the second area 3138 of the third transistor T3 and the second area 4138 of the fourth transistor T4 by the first connection electrode 1175.

One end of the second connection electrode 3175 overlaps the second area 1133 of the driving transistor T1. One end of the second connection electrode 3175 is connected to the second area 1133 of the driving transistor T1 through the opening OP1. The other end of the second connection electrode 3175 overlaps the first area 3136 of the third transistor T3. The other end of the second connection electrode 3175 is connected to the first area 3136 of the third transistor T3 through the opening OP2. Accordingly, the second area 1133 of the driving transistor T1 and the first area 3136 of the third transistor T3 are connected by the second connection electrode 3175, and the first semiconductor layer 130 and the oxide semiconductor layer are electrically connected.

The first data conductive layer further includes a second initialization voltage line 128b. The second initialization voltage line 128 includes a wiring part 128b-1 that extends in a vertical direction (a second direction DR2) and a first extending part 128b-2 that protrudes at both sides of the horizontal direction (the first direction DR1) from the wiring part 128b-1, and includes a second extending part 128b-3 that bends in the vertical direction (the second direction DR2) from the first extending part 128b-2. The extended end of the first extending part 128b-2 is electrically connected to the second initialization voltage line 128a positioned in the third gate conductive layer GAT3 and the second area 7138 of the seventh transistor T7 positioned in the oxide semiconductor layer through two different openings OP2. As a result, the second initialization voltage AVinit is transmitted in the horizontal direction (the first direction DR1) through the second initialization voltage line 128a positioned on the third gate conductive layer GAT3, and the first data conductive layer transmits the second initialization voltage AVinit in the vertical direction (the second direction DR2) through the second initialization voltage line 128b. In addition, a second initialization voltage AVinit is provided to the second area 7138 of the seventh transistor T7.

The first data conductive layer further includes connection parts 127CM and 171CM, an anode connecting member ACM1, and an expansion part FL-SD1.

The connection part 127CM is connected to the first initialization voltage line 127 of the second gate conductive layer GAT2 through the opening OP1, and is connected to portion 4136 of the second semiconductor layer (the oxide semiconductor layer) through the opening OP2 to transmit the first initialization voltage Vinit flowing through the first initialization voltage line 127 to the fourth transistor T4 of the oxide semiconductor layer.

The connection part 171CM is electrically connected to portion 1134 of the first semiconductor layer 130, i.e., the second transistor T2, through the opening OP1.

The anode connecting member ACM1 is electrically connected to portion 1136 of the first semiconductor layer 130, that is, the sixth transistor T6, through the opening OP1.

The expansion part FL-SD1 is widely formed to planarize the overlying anode. In addition, the expansion part FL-SD1 is connected to portion 1135 of the first semiconductor layer 130 through the opening OP1, that is, the fifth transistor T5, and is also electrically connected to the first storage electrode 1153 through the opening OP1.

The first data conductive layer SD1 includes a metal such as one of aluminum (Al), copper (Cu), molybdenum (Mo), titanium (Ti), or a metal alloy, and may be configured as a single layer or multiple layers.

Referring to FIG. 20, a first organic layer 181 is formed on the first data conductive layer and the second interlayer insulating layer 162. The first organic layer 181 includes an organic insulator that includes an organic material, and the organic material includes at least one of a polyimide, a polyamide, an acryl resin, benzocyclobutene, or phenol resin.

Figure 16:
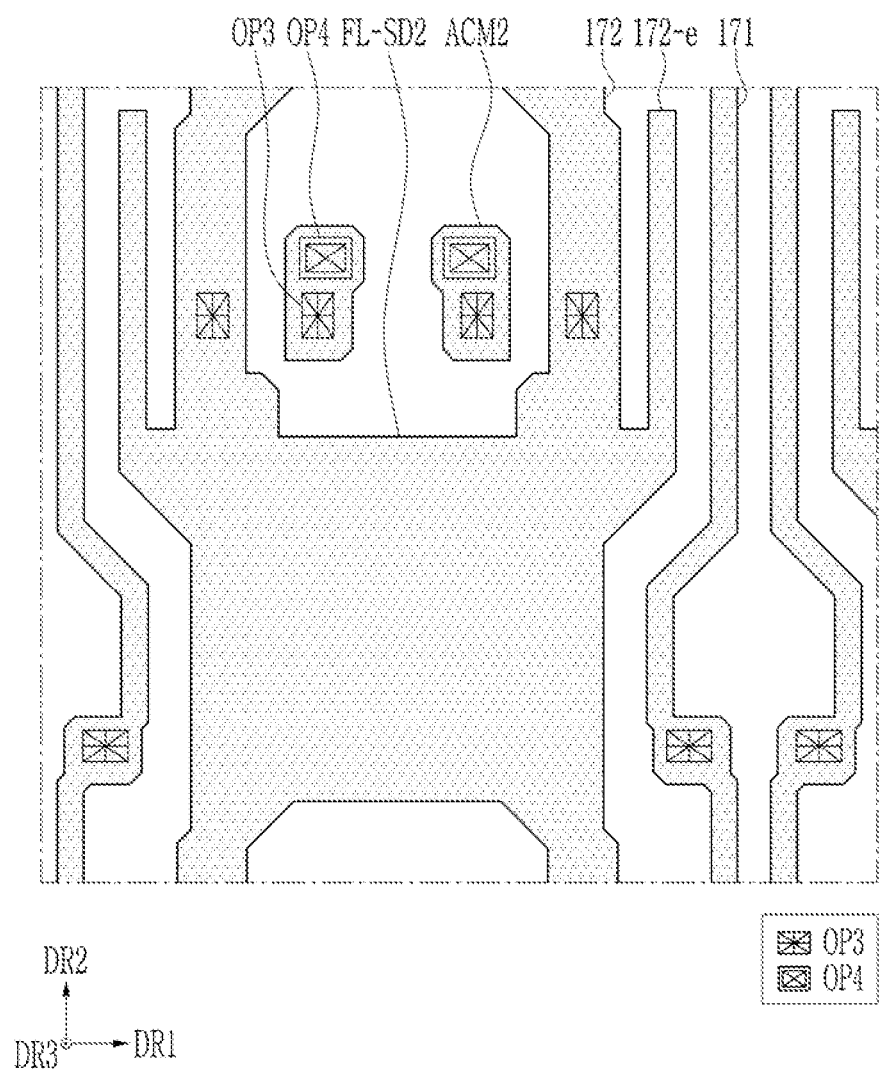
Figure 17:
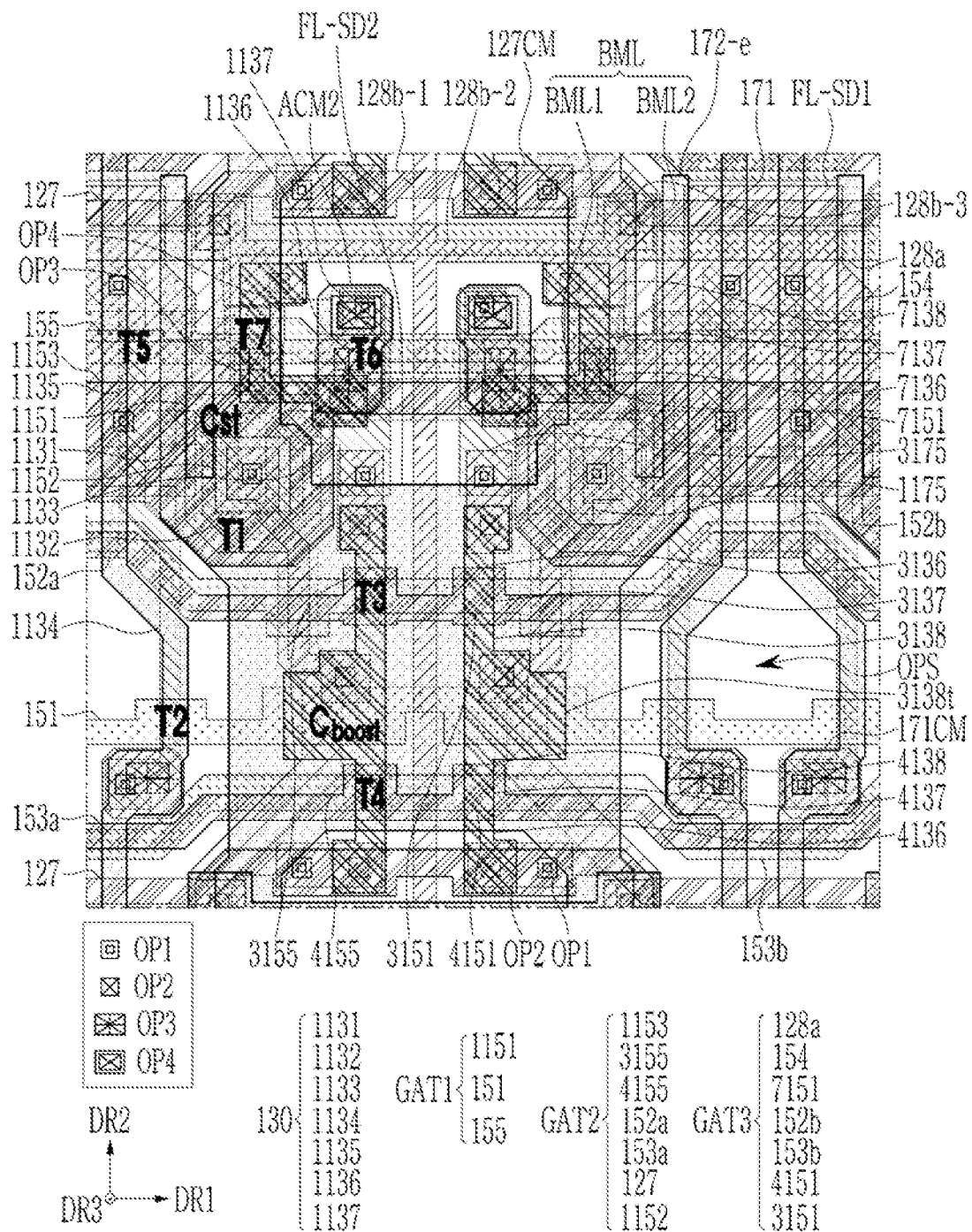

Referring to FIG. 16, FIG. 17, and FIG. 20, in an embodiment, the first organic layer 181 has an opening OP3.

A second data conductive layer that includes a data line 171, a driving voltage line 172, and an anode connecting member ACM2 is formed on the first organic layer 181.

A second organic layer 182 and a third organic layer 183 are formed on the second data conductive layer and the first organic layer 181, and an anode connection opening OP4 is formed in the second organic layer 182 and the third organic layer 183. The anode connecting member ACM2 is electrically connected to an anode (see FIG. 20) through the anode connection opening OP4. FIG. 16 is a top plan view that shows only the second data conductive layer and the openings OP3 and OP, and FIG. 17 is a top plan view showing the second data conductive layer and all surrounding layers.

Referring to FIG. 16 and FIG. 17, in an embodiment, the lower organic layer opening OP3 overlaps and exposes the connection part 171CM, the anode connecting member ACM1, and the expansion part FL-SD1 positioned in the first data conductive layer.

The second data conductive layer includes a data line 171, a driving voltage line 172, and an anode connecting member ACM2.

The data line 171 and the driving voltage line 172 extend in an approximately vertical direction (a second direction). The data line 171 is connected to the connection part 171CM of the first data conductive layer through the lower organic layer opening OP3 and is connected to the second transistor T2 through the connection part 171CM. The data line 171 extends in the vertical direction and then bends, and the data line 171 constitutes a boundary of the sub-photosensor area OPS. A plurality of adjacent sub-photosensor areas OPS constitute one first component area EA1.

The driving voltage line 172 is electrically connected to the fifth transistor T5 and the first storage electrode 1153 through the expansion part FL-SD1 of the first data conductive layer through the lower organic layer opening OP3.

The anode connecting member ACM2 is electrically connected to the anode connecting member ACM1 of the first data conductive layer through the opening OP3 and is electrically connected to the sixth transistor T6.

Referring to FIG. 16, in an embodiment, the driving voltage line 172 further includes an expansion part FL-SD2 and a protruding wiring part 172-e, and is not formed at the portion where the anode connecting member ACM2 is formed.

The expansion part FL-SD2 is formed wide to planarize the overlying anode.

In addition, the protruding wiring part 172-e of the driving voltage line 172 is also formed on both sides of two data lines 171 to flatly form the overlying anode, thereby providing a total of four wires 171 and 172-e positioned below the anode. Referring to FIG. 17, in an embodiment, two data lines 171 formed adjacent to each other are bent in opposite directions and have a large gap, which corresponds to the sub-photosensor area OPS. One sub-photosensor area OPS is positioned between two adjacent pixel circuit parts. The left and right boundaries of the sub-photosensor area OPS are composed of two data lines 171, the lower boundary is formed by a first scan line 151, and the upper boundary is formed by the lower second scan line 152a and/or the second scan line 152b. According to an embodiment, portion 1134 of the first semiconductor layer 130 that overlaps the data line 171 constitutes the left and right boundaries of the sub-photosensor area OPS.

The anode has a planarizing characteristic by the structure, such as the expansion part FL-SD1 and the wiring part 128b-1 of the first data conductive layer, under the anode as described above, and the expansion part FL-SD2 of the second data conductive layer, the data line 171, the wiring part 172-e, and the organic layers 181, 182, and 183.

In an embodiment, the expansion part FL-SD1 and the expansion part FL-SD2 are electrically connected to the driving voltage line 172 to transmit the driving voltage ELVDD.

The second data conductive layer SD2 includes a metal or a metal alloy such as at least one of aluminum (Al), copper (Cu), molybdenum (Mo), or titanium (Ti), and may be configured of a single layer or multiple layers.

Referring to FIG. 20, in an embodiment, the second organic layer 182 and the third organic layer 183 are positioned on the second data conductive layer and the first organic layer 181. The second organic layer 182 and the third organic layer 183 are organic insulators, and include at least one of a polyimide, a polyamide, an acryl resin, benzocyclobutene, or a phenol resin. According to an embodiment, the third organic layer 183 is omitted.

The anode connection opening OP4 is formed in the second organic layer 182 and the third organic layer 183, through which the anode and the anode connecting member ACM2 are electrically connected.

Figure 18:
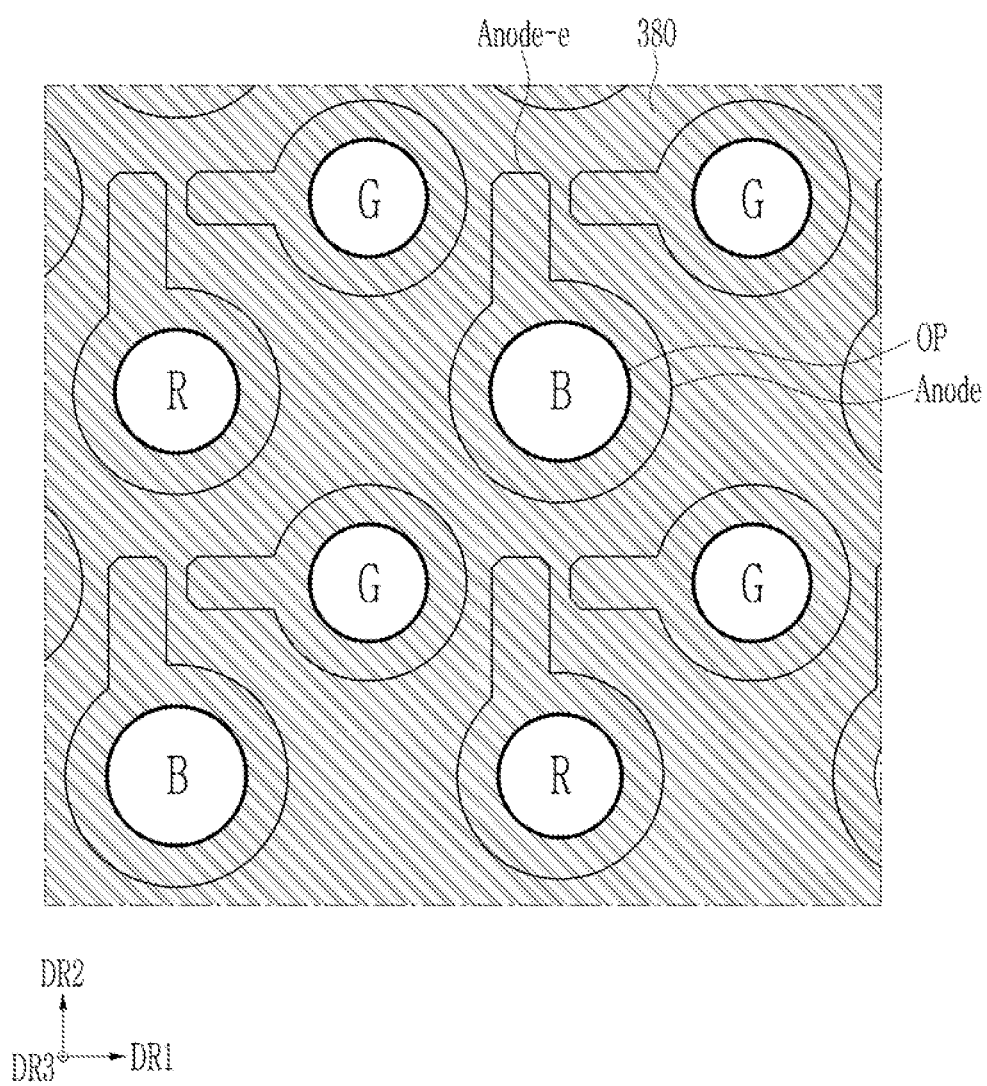
Figure 19:
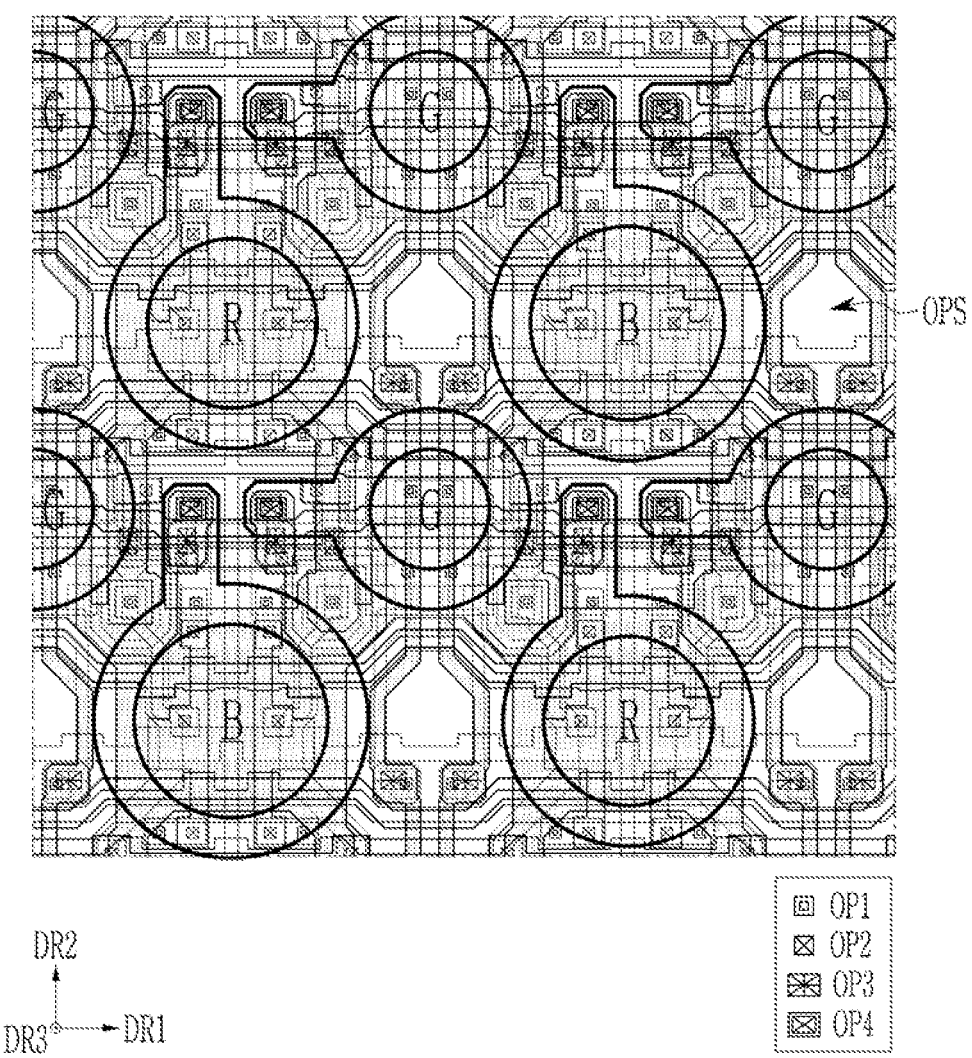

Referring to FIG. 18, FIG. 19, and FIG. 20, in an embodiment, the anode Anode is formed on the third organic layer 183. The anode (Anode) further includes an extension part Anode-e that receives a current from the pixel circuit unit through the opening OP4. Referring to FIG. 19, in an embodiment, two anode connection openings OP4 are positioned adjacent to each other and include one extension part Anode-e that extends in the first direction DR1 to be connected to the anode of a green light emitting diode LED and the other extension part Anode-e extends in the second direction to be connected to the anode of a blue or red light emitting diode LED.

Referring to FIG. 19 and FIG. 20, in an embodiment, a black pixel definition layer 380 is positioned on the anode Anode, and the opening OP of the black pixel definition layer 380 is formed to overlap the anode Anode. The extension part Anode-e of the anode Anode is not exposed by the opening OP of the black pixel definition layer 380 and overlaps the black pixel definition layer 380. As a result, the anode connection opening OP4 overlaps the black pixel definition layer 380.

Referring to FIG. 20, in an embodiment, since the anode connection opening OP4 does not overlap the opening OP of the black pixel definition layer 380 and the opening OPBM of the light blocking layer 220, the anode connection opening OP4 overlaps the black pixel definition layer 380 and the light blocking layer 220 (described below).

In addition, a part of the lower organic layer opening OP3 overlaps at least a part of the opening OPBM of the light blocking layer 220, and a remaining part of the lower organic layer opening OP3 overlaps the light blocking layer 220. In addition, all lower organic layer openings OP3 overlap the black pixel definition layer 380.

In addition, in an embodiment, due to the expansion part FL-SD1 of the first data conductive layer and the expansion part FL-SD2 of the second data conductive layer being positioned below the anode, a portion of the anode Anode exposed by the opening OP of at least the black pixel definition layer 380 can be formed to be flat.

Based on the planar structure as described above, the cross-sectional structure of the display area, the first component area EA1, and the sub-photosensor area OPS of the light emitting display device are described with reference to FIG. 20.

FIG. 20 is a cross-sectional view of a light emitting display device according to an embodiment.

In FIG. 20, in addition to a stacked structure of the display area DA, a stacked structure of the first component area EA1 is also shown.

The detailed stacked structure of a pixel of the display area DA, up to the anode Anode, shown in FIG. 20 is described together while referring to FIG. 7 to FIG. 19. In an embodiment of FIG. 20, the pixel circuit part includes the second organic layer 182 and the third organic layer 13 and the structure positioned thereunder, and the light emitting diode LED includes the configuration positioned above the third organic layer 183 and below the encapsulation layer 400.

Referring to FIG. 20, in an embodiment, the stacked structure on the anode in the pixel of display area DA is as follows.

The black pixel definition layer 380 that includes the opening OP that exposes the anode Anode and covers at least a part of the anode Anode is formed on the anode Anode. The black pixel definition layer 380 is formed of a black organic material so that light incident from the outside is not reflected. According to an embodiment, the black pixel definition layer 380 includes a negative-type black color organic material, and may include a black color pigment.

A spacer 385 is formed on the black pixel definition layer 380. Unlike the black pixel definition layer 380, the spacer 385 is formed of a transparent organic insulating material. According to an embodiment, the spacer 385 is formed of a positive-type transparent organic material.

The spacer 385, the black pixel definition layer 380, a functional layer FL and a cathode Cathode are sequentially formed on the anode Anode, and the functional layer FL and the cathode Cathode are positioned over the entire area of the display area DA and the first component area EA1. An emission layer EML is formed between the functional layers FL only within the opening OP of the black pixel definition layer 380. Hereinafter, the functional layer FL and the emission layer EML combine to form an intermediate layer. The functional layer FL includes at least one of an auxiliary layer such as an electron injection layer, an electron transport layer, a hole transport layer, or a hole injection layer, where the hole injection layer and the hole transport layer are positioned under the emission layer EML, and the electron transport layer and the electron injection layer are positioned over the emission layer EML.

An encapsulation layer 400 is formed on the cathode Cathode. The encapsulation layer 400 includes at least one inorganic layer and at least one organic layer, and according to an embodiment, has a triple-layer structure that includes a first inorganic encapsulation layer, an organic encapsulation layer, and a second inorganic encapsulation layer. The encapsulation layer 400 protects the emission layer EML from moisture or oxygen that can permeate from the outside. According to an embodiment, the encapsulation layer 400 has a structure in which an inorganic layer and an organic layer are sequentially stacked.

In an embodiment of FIG. 20, sensing insulating layers 501, 510, and 511 and a plurality of sensing electrodes 540 and 541 are formed on the encapsulation layer 400 for touch sensing. In an embodiment of FIG. 20, a touch may be capacitively sensed using two sensing electrodes 540 and 541.

For example, the first sensing insulating layer 501 is formed on the encapsulation layer 400, and a plurality of sensing electrodes 540 and 541 are formed thereon. A plurality of sensing electrodes 540, and 541 are insulated by the second sensing insulating layer 510 interposed therebetween, and portions are electrically connected through an opening formed in the sensing insulating layer 510. The sensing electrodes 540 and 541 include a metal or metal alloy such as at least one of aluminum (Al), copper (Cu), silver (Ag), gold (Au), molybdenum (Mo), titanium (Ti), or tantalum (Ta), etc., and may be composed of a single layer or multiple layers. The third sensing insulating layer 511 is formed on the sensing electrode 540.

The light blocking layer 220 and the color filter layer 230 are formed on the sensing electrode 540 and the third sensing insulating layer 511.

The light blocking layer 220 overlaps the sensing electrodes 540 and 541 but does not overlap the anode. This prevents an anode Anode capable of displaying an image from being covered by the light blocking layer 220 and the sensing electrodes 540 and 541.

The color filter layer 230 is formed on the third sensing insulating layer 511 and the light blocking layer 220. The color filter layer 230 includes a red color filter that transmits red light, a green color filter that transmits green light, and a blue color filter that transmits blue light. Each color filter layer 230 overlaps the anode Anode of the light emitting diode LED. Light emitted from the emission layer EML passes through the color filter and is changed into the corresponding color.

The light blocking layer 220 is positioned between the color filter layers 230, respectively. According to an embodiment, the color filter layer 230 are replaced with a color conversion layer, or further include a color conversion layer. The color conversion layer includes quantum dots. In addition, according to an embodiment, a reflection adjustment layer that fills an opening OPBM of the light blocking layer 220 is formed instead of the color filter layer 230. The reflection adjustment layer covers the light blocking layer 220, and is described with reference to FIG. 35.

A planarization layer 550 that covers the color filter layer 230 is formed on the color filter layer 230, and a polarizer may be additionally attached thereon.

In addition, FIG. 20 also shows the cross-sectional structure of the first component area EA1.

The first component area EA is where a plurality of sub-photosensor areas OPS are positioned on the lower panel layer, and FIG. 20 shows the cross-sectional structure of the sub-photosensor area OPS that differ from the display area DA. On the other hand, the sub-photosensor area OPS can be positioned in the display area DA, but all sub-photosensor areas OPS of the display area DA are covered by the black pixel definition layer 380 and/or the light blocking layer 220 so that light is not transmitted.

The first component area EA1 includes the sub-photosensor area OPS through which light can pass, and the conductive layer or the semiconductor layer is not positioned in the sub-photosensor area OPS so that light can pass through, while an additional opening OP-1 and OPBM-1 is formed in the black pixel definition layer 380 and the light blocking layer 220 OPS at a position that corresponds to the sub-photosensor area OPS to provide a structure that does not block light. On the other hand, a part of the sub-photosensor area OPS positioned in the first component area EA1 overlaps the black pixel definition layer 380 and/or the light blocking layer 220 so that light is not transmitted. As described above, a portion of the plurality of sub-photosensor area OPS positioned in the first component area EA allow light to pass through, and the remaining portion of the plurality of sub-photosensor area OPS is non-transmissive. The sub-photosensor area OPS that transmits light in the first component area EA1 is called "a first photosensor area or a transmissive photosensor area", and the sub-photosensor area OPS that blocks light is "a second photosensor area or a non-transmissive photosensor area". One of the first sub-photosensor area or the second sub-photosensor area is adjacent to all pixel circuit parts in the first component area. As such, if the number of first photosensor areas OPS1 and second photosensor areas OPS2 is adjusted in one first component area EA1, a sensor positioned on the rear surface of the first component area EA can detect the front surface of the light emitting display device, and additionally, the color of the reflection of light in the first component area EA1 is improved. In addition, according to an embodiment, the first component area EA1 is prevented from being perceived by a user because the reflectance or the reflection color differs from the display area that surrounds the first component area EA1.

In an embodiment, the light blocking layer 220 and/or the black pixel definition layer 380 is positioned on the front surface of the sub-photosensor area OPS between adjacent pixel circuit parts, and the light blocking layer 220 and/or the black pixel definition layer 380 include additional openings OPBM-1 and OP-1 that overlap the sub-photosensor area OPS of the first photosensor area OPS1. However, the additional opening is not formed in the sub-photosensor area OPS of the second photosensor area OPS2, thereby providing a structure in which the light blocking layer 220 and/or the black pixel definition layer 380 overlaps the sub-photosensor area OPS.

For example, the stacked structure of the first component area EA1 according to an embodiment is described based on FIG. 20 as follows.

A buffer layer 111, which is an inorganic insulating layer, is formed on the substrate 110, and a first gate insulating layer 141 and a second gate insulating layer 142, which are inorganic insulating layers, are sequentially formed thereon. In addition, the first interlayer insulating layer 161, the third gate insulating layer 143, and the second interlayer insulating layer 162, which are inorganic insulating layers, are sequentially stacked on the second gate insulating layer 142. The first organic layer 181, the second organic layer 182, and the third organic layer 183, which are organic insulators, are sequentially stacked on the second interlayer insulating layer 162. From the substrate 110 to the anode Anode, that is, in the embodiment of FIG. 20, the stacked structure up to the third organic layer 183 corresponds to the sub-photosensor area OPS. The above-described sub-photosensor area OPS lacks the metal layer BML, the first semiconductor layer ACT1, the first gate conductive layer GAT1, the second gate conductive layer GAT2, the oxide semiconductor layer ACT2, the third gate conductive layer GAT3, the first data conductive layer SD1, and the second data conductive layer SD2.

The sub-photosensor area OPS is divided into the first photosensor area OPS1, through which light can pass at the upper part, and the second photosensor area OPS2, which blocks light.

The upper layered structure of the first photosensor area OPS1 (the transmissive photosensor area) through which light can pass is described as follows.

The additional opening OP-1 in the black pixel definition layer 380 is located on the third organic layer 183, which is the sub-photosensor area OPS through which light can pass. Therefore, the functional layer FL is formed on the third organic layer 183, and the cathode Cathode is formed thereon. The encapsulation layer 400 is formed on the cathode Cathode, and the sensing insulating layers 501, 510, and 511 are sequentially formed thereon. The encapsulation layer 400 has a triple layer structure that includes a first inorganic encapsulation layer, an organic encapsulation layer, and a second inorganic encapsulation layer. In addition, the sensing insulating layers 501, 510, and 511 are all inorganic insulating layers. An additional opening OPBM-1 in the light blocking layer 220 is located on the third sensing insulating layer 511. Therefore, the light blocking layer 220 and the black pixel definition layer 380 are not formed in the first photosensor area OPS1 of the first component area EA1 through which light is transmitted, so that light can pass therethrough. The planarization layer 550 is formed on the third sensing insulating layer 511. The stacked structure of the second photosensor area (OPS2; the non-transmissive photosensor area) which blocks light is described as follows.

The black pixel definition layer 380 is formed on the third organic layer 183, which is the sub-photosensor area OPS, and lacks an additional opening, so that it blocks light. The functional layer FL, the cathode Cathode, and the encapsulation layer 400 are sequentially formed on the black pixel definition layer 380, and the sensing insulating layers 501, 510, and 511 are sequentially formed thereon. The encapsulation layer 400 has a triple layer structure that includes a first inorganic encapsulation layer, an organic encapsulation layer, and a second inorganic encapsulation layer. In addition, the sensing insulating layers 501, 510, and 511 are all inorganic insulating layers. The light blocking layer 220 is formed on the third sensing insulating layer 511 and lacks an additional opening, so that it blocks light. Therefore, the second photosensor area (OPS2; the non-transmissive photosensor area) of the first component area EA1 through which light is blocked overlaps the light blocking layer 220 and/or the black pixel definition layer 380, so that light is blocked. A planarization layer 550 is formed on the light blocking layer 220.

In an above embodiment, a total of three organic layers are formed, and an embodiment in which the anode connection opening is formed in the second organic layer and the third organic layer was described. However, embodiments are not necessarily limited thereto, and in an embodiment, two organic layers are formed, and the anode connection opening is positioned in the upper organic layer positioned away from the substrate, and the lower organic layer opening is positioned in the lower organic layer.

The cross-sectional structure of the first photosensor area OPS1 and the second photosensor area OPS2 of the first component area EA1 in a light emitting display device was described above. Hereinafter, various embodiments of forming the first photosensor area OPS1 and the second photosensor area OPS2 on a plane in the first component area EA1 will be described with reference to FIG. 21 to FIG. 23.

Figure 21:
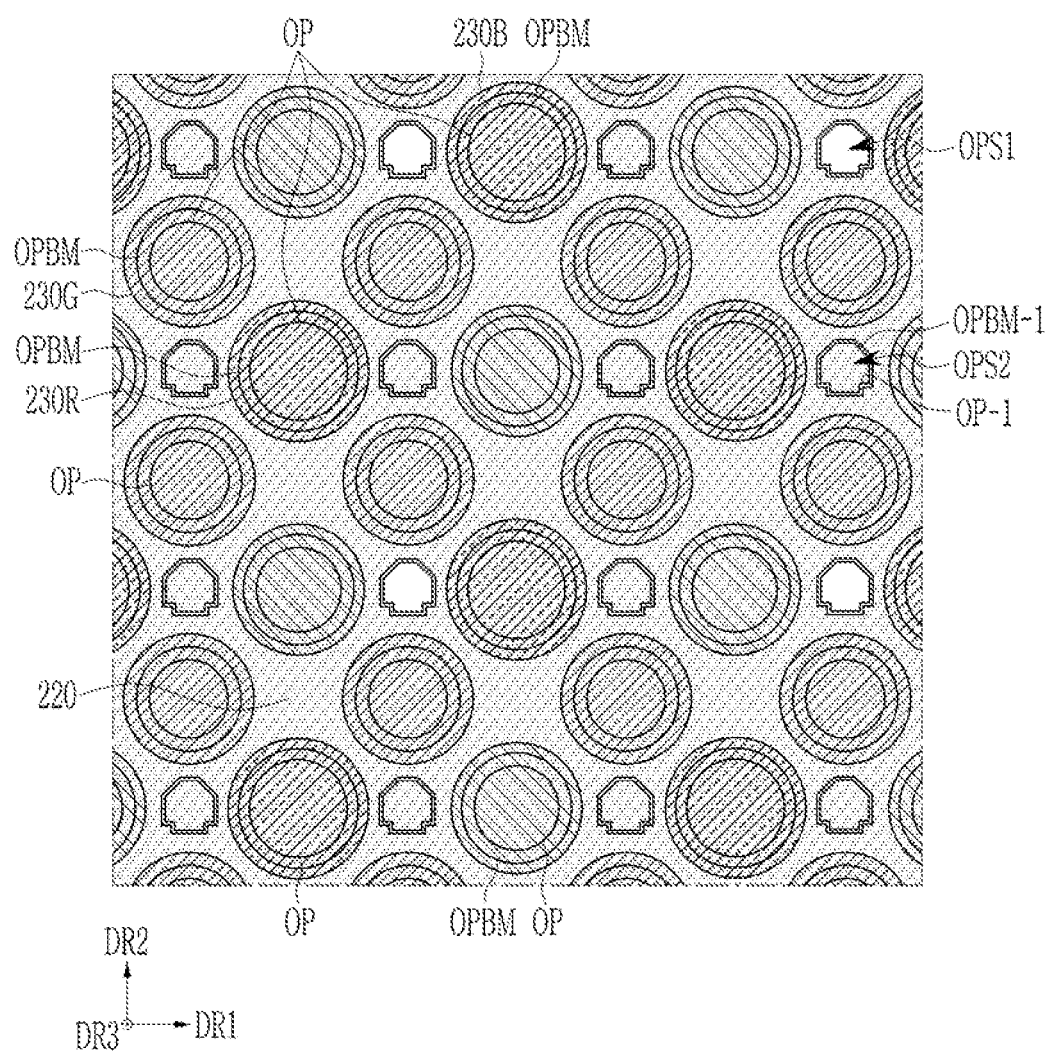
FIG. 21 to FIG. 23 are top plan views of a first component area according to an embodiment.
Figure 22:
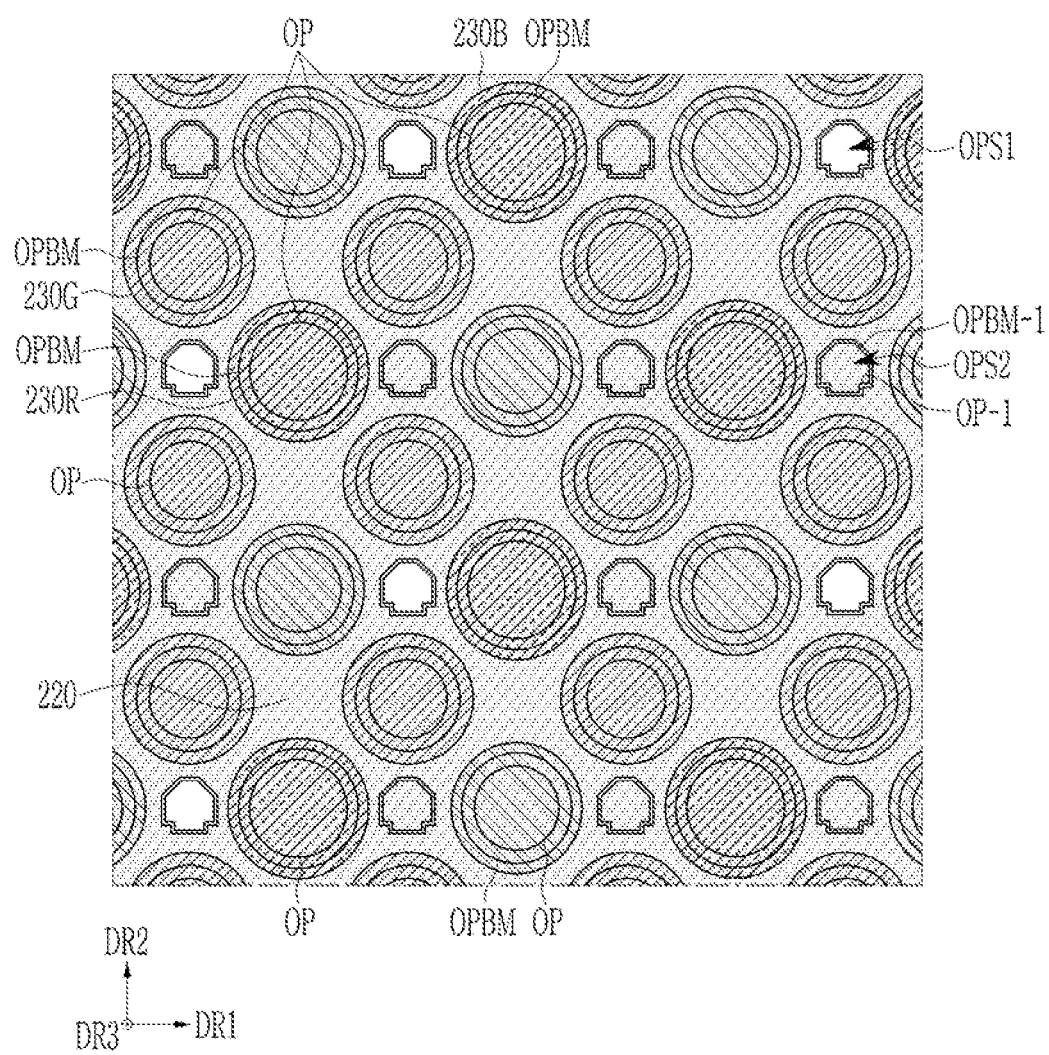
Figure 23:
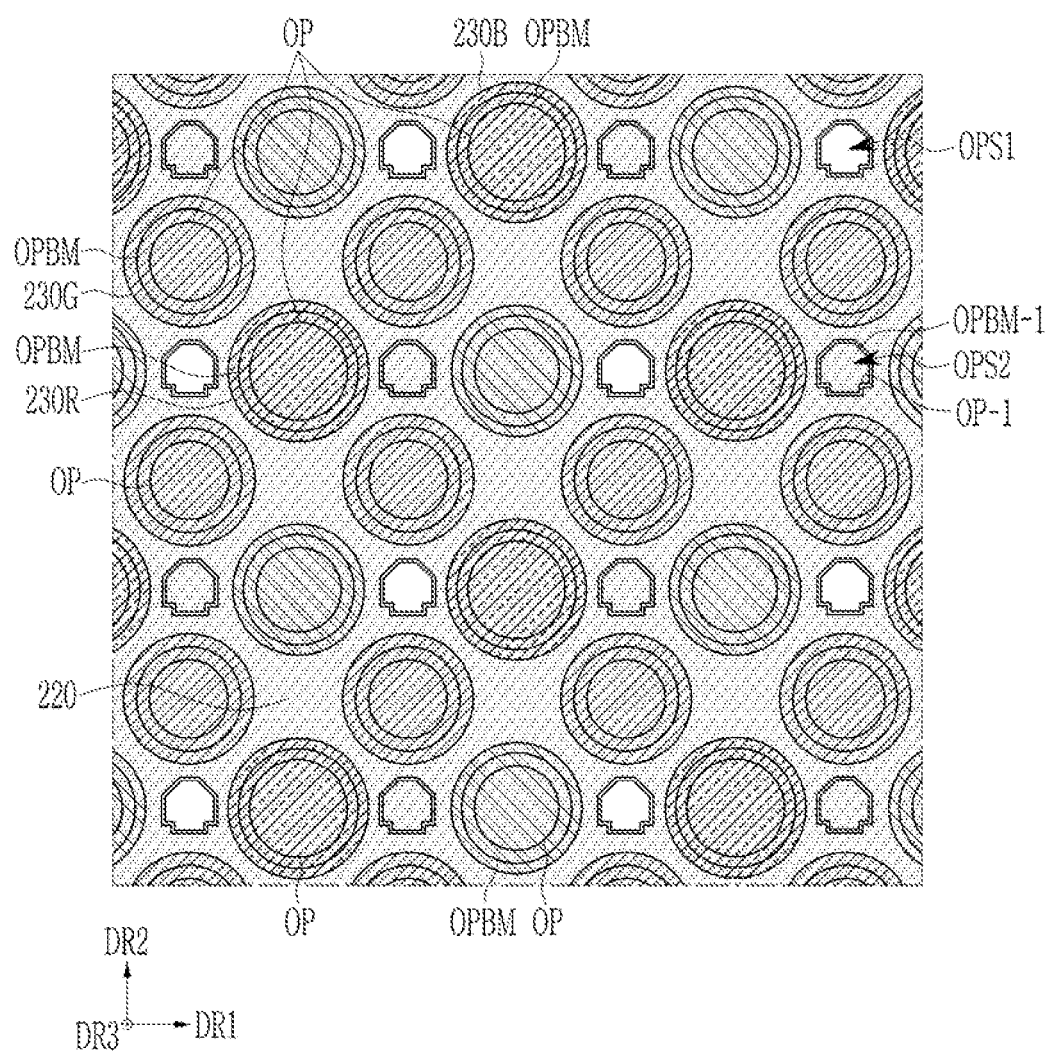

FIG. 21 to FIG. 23 are top plan views of a first component area according to an embodiment.

FIG. 21 to FIG. 23 display the light blocking layer 220 as a dot pattern, and the parts where the dot pattern is shown correspond to the light blocking layer 220, and the parts where the dot pattern is not positioned corresponds to the additional opening OPBM-1 in the light blocking layer 220. An additional opening OP-1 in the black pixel definition layer 380 is positioned under the additional opening OPBM-1 in the light blocking layer 220, thereby providing a structure through which light is transmitted.

First, the planar relationship of the black pixel definition layer 380, the light blocking layer 220, and the color filter layer 230 of the first component area will be described with reference to FIG. 21.

According to FIG. 21, in an embodiment, the light blocking layer 220 includes the opening OPBM, and the opening OPBM is wider than and overlaps the opening OP of the black pixel definition layer 380. Color filters 230R, 230G, and 230B are positioned on the light blocking layer 220. The color filters 230R, 230G, and 230B fill the opening OPBM of the light blocking layer 220, and are wider than the opening OPBM of the light blocking layer 220. In FIG. 21, different color filters is shown with a different hatched line so that they can be easily distinguished.

Hereinafter, the upper structure in the sub-photosensor area OPS of the first component area EA1 will be described.

First, the upper structure of the first photosensor area OPS1, which is a transmissive photosensor area, through which light is transmitted is as follows.

In the first photosensor area OPS1, which corresponds to the sub-photosensor area OPS, an additional opening OP-1 is formed in the black pixel definition layer 380, and an additional opening OPBM-1 is formed in the light blocking layer 220. As a result, there is no light blocking structure in the first photosensor area OPS1 due to the additional opening OPBM-1 of the light blocking layer 220 and the additional opening OP-1 of the black pixel definition layer 380. As a result, even if the sensor, which could be an optical sensor or an infrared sensor, etc., is positioned on the rear surface of the light emitting display panel DP, the front surface of the light emitting display panel DP can sense light.

In addition, the upper structure of the second photosensor area OPS2, which is a non-transmissive photosensor area, through which light is not transmitted is as follows.

In the second photosensor area OPS2, which corresponds to the sub-photosensor area OPS, no additional opening OP-1 is formed in the black pixel definition layer 380, and no additional opening OPBM-1 is formed in the light blocking layer 220, thereby providing a structure that blocks light due to the black pixel definition layer 380 and/or the light blocking layer 220. As a result, in the first component area EA, the sub-photosensor area OPS is not used for sensor operation, but is used to adjust the reflectance or the reflection color. For example, when external light is incident on the first component area EA1, some light is reflected, and the number and arrangement of the first photosensor areas OPS1 and the second photosensor areas OPS2 are adjusted to configure the first component area EA1 to correspond to the reflectance or reflection color of the display area DA. As a result, while allowing the sensor positioned on the rear surface of the first component area EA1 to detect the front surface of the light emitting display device, the reflection color of light in the first component area EA1 is also improved, and the display area DA and the first component area EA1 are similar in the reflectance or reflection color. As a result, the user might not perceive the display area DA and the first component area EA1 separately.

In an embodiment FIG. 21, one adjacent sub-photosensor area OPS is surrounded by two green pixels, one red pixel, and one blue pixel. In an embodiment, one sub-photosensor area OPS is the first photosensor area OPS1, which is the transmissive photosensor area, through which light is transmitted, and the remaining three sub-photosensor areas OPS are the second photosensor area OPS2, which is the non-transmissive photosensor area, through which light is not transmitted. Hereinafter, this arrangement is also briefly referred to as a light emitting display device of a '¼ period'. In addition, one first photosensor area OPS1 is disposed at a certain position, so that an interval between the adjacent first photosensor areas OPS1 is also uniformly formed.

However, even if the same '¼ period' is formed, the positions of the first photosensor areas OPS1 may differ even within one light emitting display device.

On the other hand, unlike in FIG. 21, FIG. 22 shows an embodiment formed of a '⅜ period', and FIG. 23 shows an embodiment formed of a '½ period'.

The arrangements of FIG. 21 to FIG. 23 show different embodiments, and the number, period, and position of the first photosensor areas OPS1 may be formed in various ways for each embodiment. In addition, in the first photosensor area OPS1, the sensor positioned on the rear surface of the first component area EA1 can detect the front surface, so the first photosensor areas OPS1 has the minimum number and arrangement for the required transmittance of the sensor etc.

Figure 37:
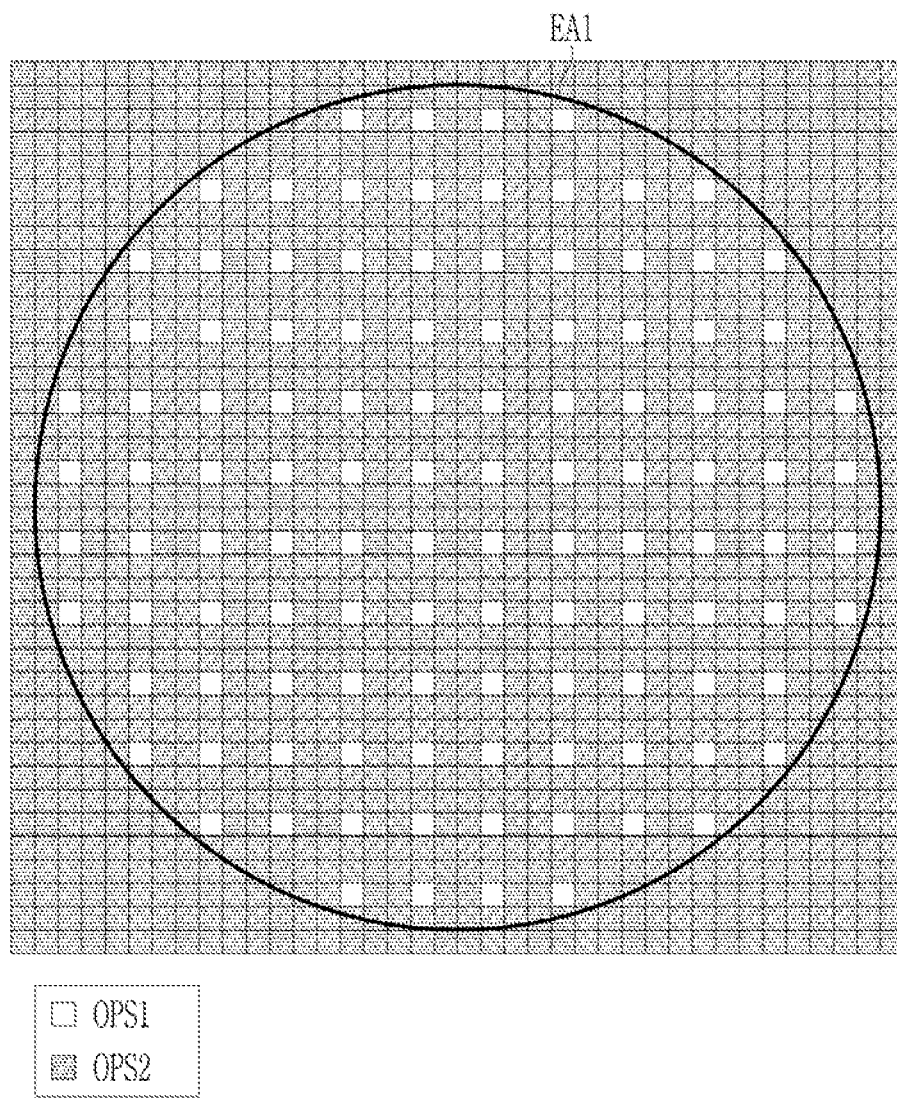
FIG. 37 to FIG. 39 are schematic top plan views of a first component area according to an embodiment.
Figure 38:
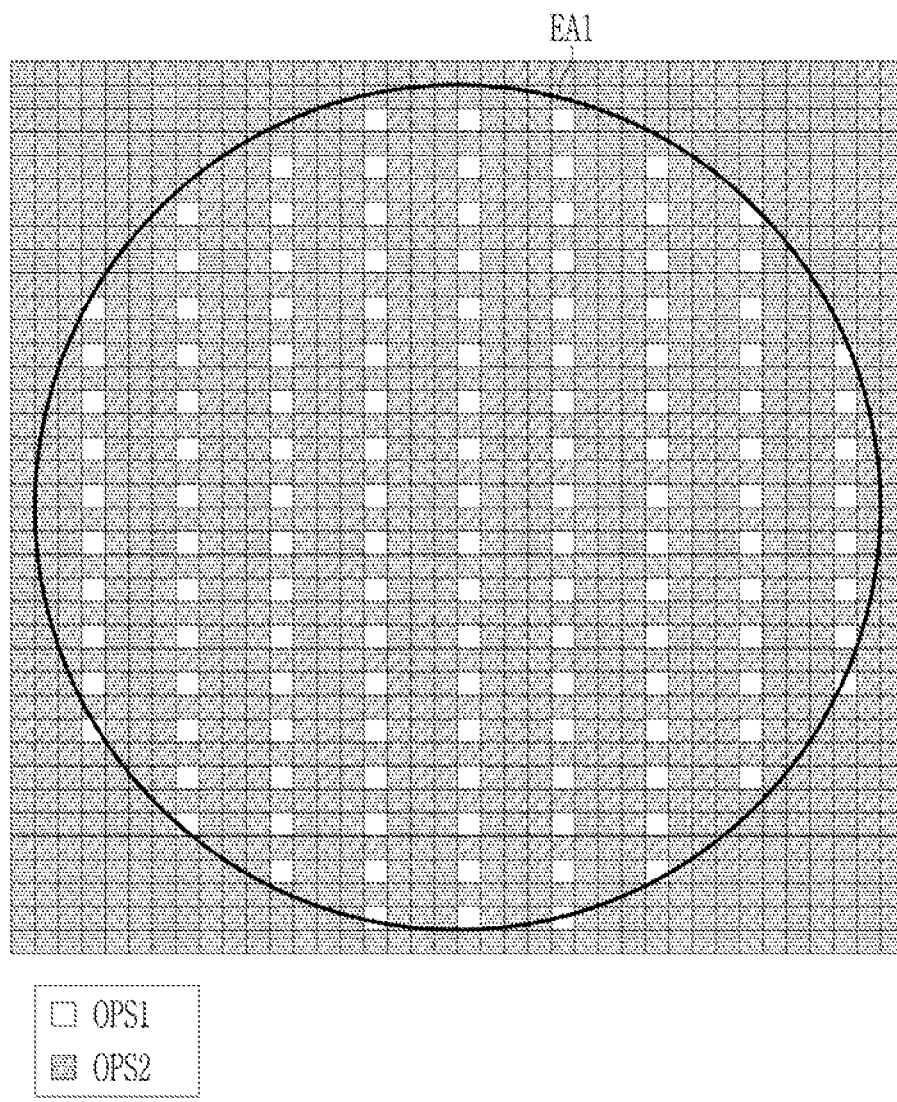

In a present embodiment, referring to FIG. 17 or FIG. 19, the sub-photosensor area OPS is adjacent to all pixel circuit parts positioned in the first component area EA1, and the first component area EA1 includes a plurality of first photosensor areas OPS1 and a plurality of second photosensor areas OPS2, and a number first photosensor areas OPS1 is equal to or less than a number of second photosensor areas OPS2. That is, as shown in FIG. 23, the first component area EA1 has a ½ period in which one second photosensor area OPS2 is formed for one first photosensor area OPS1, or as shown in FIG. 21 and FIG. 34, a ¼ period in which three second photosensor areas OPS2 are formed for one first photosensor area OPS1, or as shown in FIG. 22, a ⅜ period in which five second photosensor areas OPS2 are formed for three first photosensor areas OPS1, or as shown in FIG. 38, a ⅛ period in which seven second photosensor areas OPS2 or formed for one first photosensor area OPS1, or as shown in FIG. 37, a ⅑ period in which eight second photosensor areas OPS2 or formed for one first photosensor area OPS1.

Figure 39:
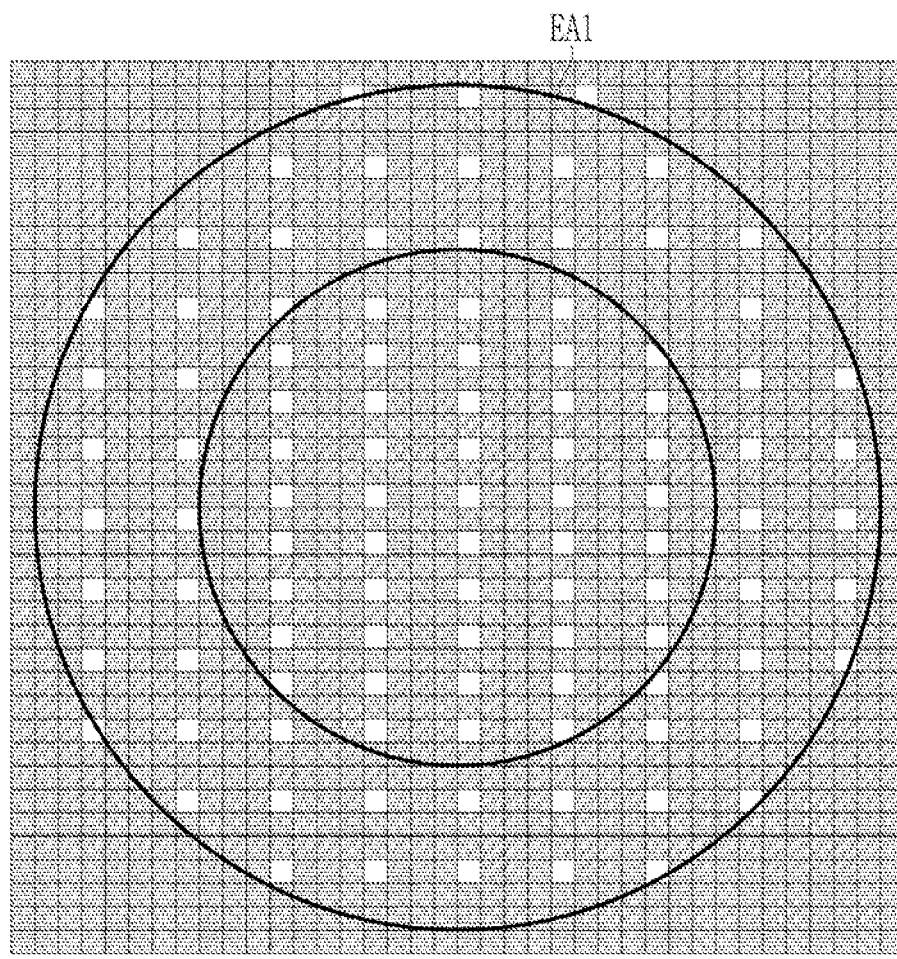

In addition, as shown in FIG. 39, the first component area EA is divided into at least two areas that have different periods. FIGS. 34 and 37-39 will be described below.

In the above, the structure of the first component area EA has been described, and according to an embodiment, the arrangement of the first photosensor area OPS1 and the second photosensor area OPS2 applies to the second component area EA2 as well.

Hereinafter, some other various planar shapes of one sub-photosensor area OPS according to an embodiment will be described through FIG. 24 and FIG. 25.

Figure 24:
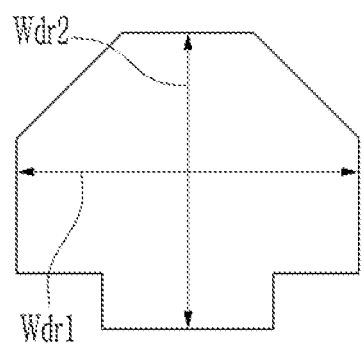
FIG. 24 and FIG. 25 illustrate a planar shape of a photosensor area according to an embodiment.
Figure 25:
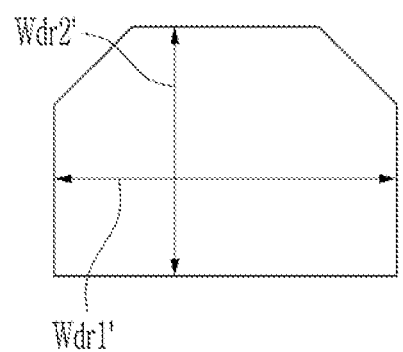

FIG. 24 and FIG. 25 are top plan views of a planar shape of a photosensor area according to an embodiment.

The sub-photosensor area OPS of FIG. 24 corresponds to the shape of the sub-photosensor area OPS of embodiments of FIG. 7 to FIG. 19.

The sub-photosensor area OPS of FIG. 24 has a planar shape that further includes a downwardly protruded structure in addition to a hexagonal shape. The maximum horizontal width Wdr1 and the maximum vertical width Wdr2 are shown in the planar shape of the sub-photosensor area OPS of FIG. 24, and the maximum horizontal width Wdr1 is greater than the maximum vertical width Wdr2. For example, the maximum horizontal width Wdr1 and vertical width Wdr2 may be 15 μm or less and 5 μm or more, respectively. The gap between the boundaries of the sub-photosensor area OPS, and the additional opening OP-1 of the black pixel definition layer 380 and/or the additional opening OPBM-1 of the light blocking layer 220, may be 1 μm or more and 2 μm or less. The additional opening OP-1 and the additional opening OPBM-1 may be misaligned, and the gap prevents the sub-photosensor area OPS from being covered.

The sub-photosensor area OPS of FIG. 25, unlike the sub-photosensor area OPS of FIG. 24, does not include a convex protruded structure at the bottom, and has a hexagonal shape. The maximum horizontal width Wdr1' and the maximum vertical width Wdr2' are shown in the planar shape of the sub-photosensor area OPS of FIG. 25, and the maximum horizontal width Wdr1' is greater that the maximum vertical width Wdr2'. For example, the maximum horizontal width Wdr1' and vertical width Wdr2' may be 15 µm or less and 5 µm or more, respectively. The gap between the boundaries of the sub-photosensor area OPS, and the additional opening OP-1 of the black pixel definition layer 380 and/or the additional opening OPBM-1 of the light blocking layer 220 may be 1 µm or more and 2 µm or less. The additional opening OP-1 and the additional opening OPBM-1 may be misaligned, and to the gap prevents the sub-photosensor area OPS from being covered.

The sub-photosensor areas OPS shown in FIG. 24 and FIG. 25 are embodiments, and may be formed in various other shapes such as circles and polygons.

Hereinafter, photographs of the first component areas EA1 of a light emitting display device that have different periods will be described with reference to FIG. 26 and FIG. 27.

Figure 26:
FIG. 26 and FIG. 27 illustrate a first component area according to an embodiment.
Figure 27:

FIG. 26 and FIG. 27 illustrate a first component area EA1 according to the embodiment.

FIG. 26 is a photograph of the first component area EA1 that includes the first photosensor area OPS1 formed with a ¼ period, and FIG. 27 is a photograph of the first component area EA1 that includes the first photosensor area OPS1 formed with a ⅑ period (referring to FIG. 37). The visible dots portions in FIG. 26 and FIG. 27 are the first photosensor areas OPS1, and the second photosensor areas OPS2 are not visible because the second photosensor areas OPS2 are covered with the light blocking layer 220 and/or the black pixel definition layer 380.

In an embodiment of FIG. 26, only one of the four adjacent sub-photosensor areas OPS formed in a ¼ period is formed as the first photosensor area OPS1, and the remaining three are formed as the second photosensor area OPS2. In contrast, in the embodiment of FIG. 27, only one of the nine adjacent sub-photosensor areas OPS formed in a ⅑ period is formed as the first photosensor area OPS1, and the remaining eight are formed as the second photosensor area OPS2.

Based on these two embodiments, a relationship between the period in which the first photosensor area OPS1 is formed and the transmittance is described through FIG. 28 to FIG. 33.

FIG. 28 to FIG. 33 are graphs of transmittance according to a period.

Figure 28:
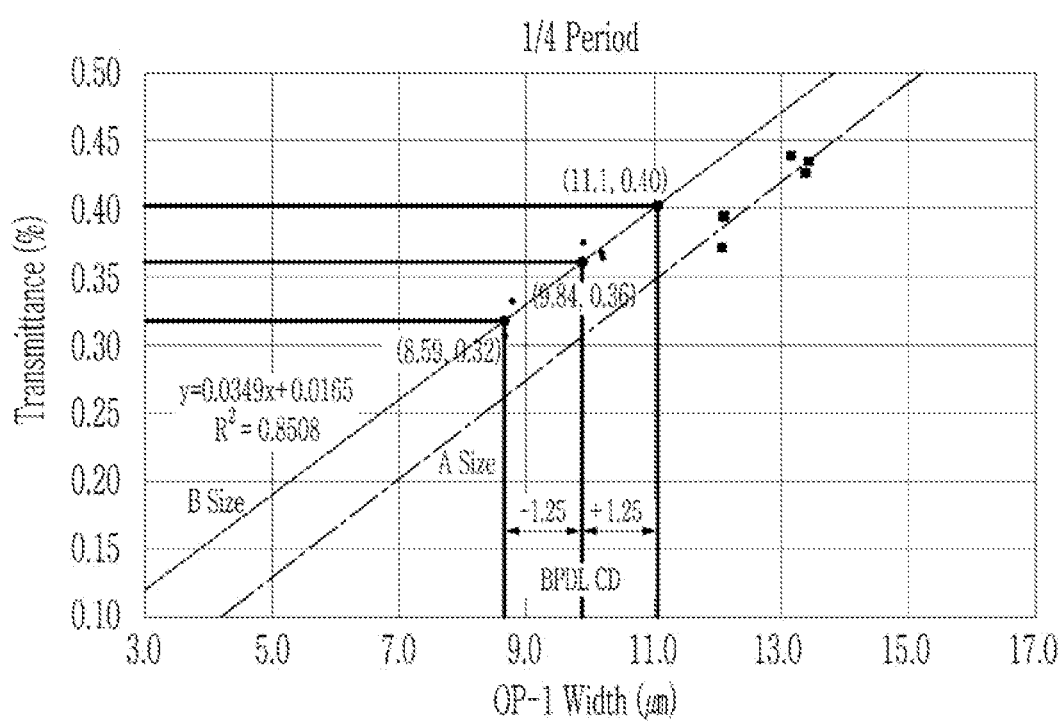
FIG. 28 to FIG. 33 are graphs of transmittance according to a period.
Figure 29:
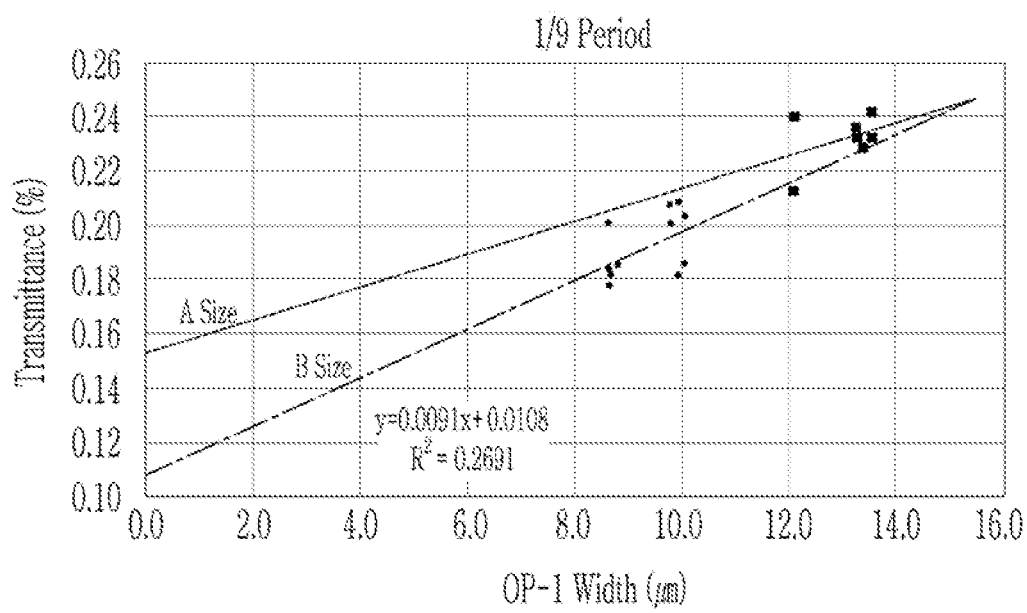
Figure 30:
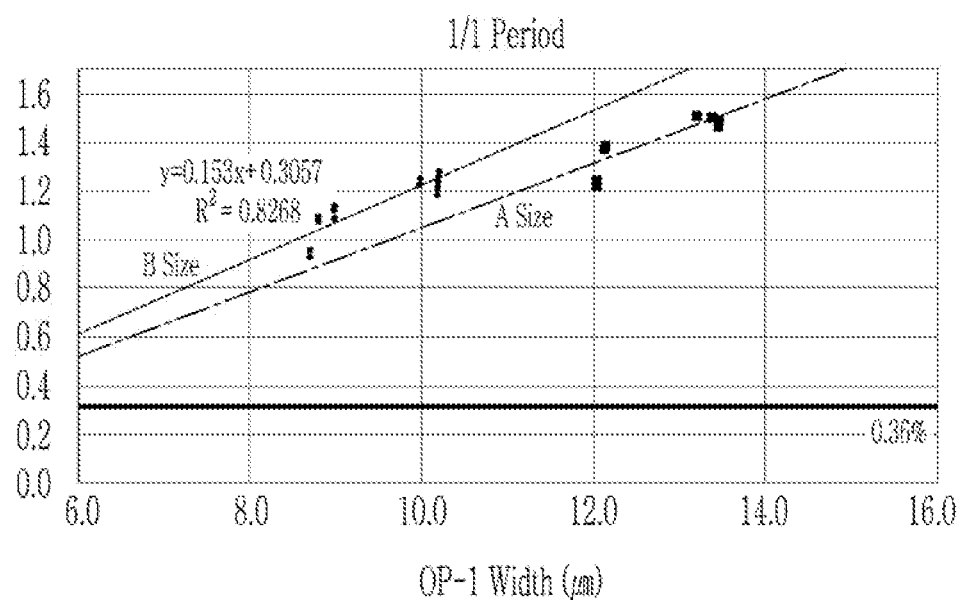

First, FIG. 28 shows the transmittance of the first component area EA1 in the ¼ period, FIG. 29 shows the transmittance of the first component area EA1 in the ⅑ period, and FIG. 30 shows the transmittance of the first component area EA in the 1/1 period. "A size" shows the first component area EA1 has a photosensor area of FIG. 24, and "B size" shows the first component area EA1 has a photosensor area of FIG. 25. In addition, in FIG. 28 to FIG. 30, a vertical axis represents transmittance, and a horizontal axis represents a width of the additional opening OP-1 of the black pixel definition layer 380 formed in the first photosensor area OPS1. Here, a reference wavelength for measuring the transmittance was 550 nm.

In FIG. 28 to FIG. 30, the transmittance in a plurality of first component areas EA1 was measured, respectively, the positions were marked with dots, and the relationship between them was shown with a line. In addition, the transmittance was measured in first component areas EA1 that have two additional openings with significantly different sizes.

Based on FIG. 28 to FIG. 30, the transmittance increases as the width of the additional opening OP-1 of the black pixel definition layer 380 increases, and the transmittance increases as the period of the first photosensor area OPS1 is increased.

Considering only the transmittance, as shown in FIG. 30, the transmittance is greatest when all sub-photosensor areas OPS are first photosensor areas OPS1. However, such high transmittance has an effect that a user can distinguish and recognize the boundary between the display area DA and the first component area EA1 because of reflectance and reflection color differences between the display area DA and the first component area EA. Accordingly, only a part of the sub-photosensor area OPS is the first photosensor area OPS1, which enables sensing and lowers transmittance. In addition, the reflectance and/or reflection color can be adjusted to match the display area DA, which improves display quality by preventing a user from recognizing the boundary between the display area DA and the first component area EA1.

Figure 31:
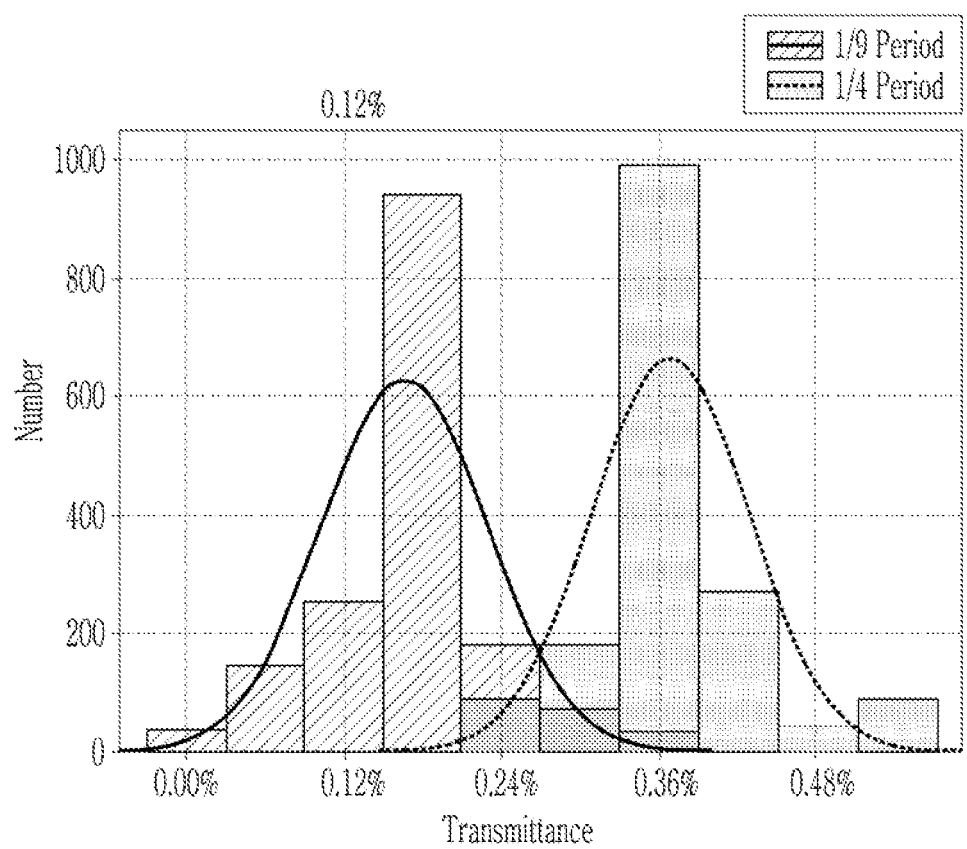

FIG. 31 shows a distribution of the transmittance based on the transmittance of the first component area EA1 of the ¼ period measured in FIG. 28 and the transmittance of the first component area EA1 of the ⅑ period measured in FIG. 29.

The numerical values shown in FIG. 31 are summarized in Table 1 below.

TABLE 1

| | Target | | Measured result | | | |
|---|---|---|---|---|---|---|
| | | | | | Standard | Expected |
| Embodiment | Average transmittance | Minimum transmittance | Measuring number | Average transmittance | Deviation 4σ | minimum transmittance |
| 1/9 period | 0.16 | 0.12 | 46 | 0.17 | 0.25 | 0.00 |
| 1/4 period | 0.36 | 0.26 | 37 | 0.37 | 0.20 | 0.17 |

Referring to Table 1 and FIG. 31 above, the requested minimum transmittance is 0.12%, of which an embodiment of the ⅑ period has an average transmittance of 0.17%, which is greater than the minimum transmittance. However, the expected minimum transmittance may be 0.00%, and some measured transmittance may be lower than 0.12%, so when being applied to the first component area EA1, a sensor cannot sense a required amount of light. As a result, to have greater that 0.12% transmittance, the width of the additional opening OP-1 of the black pixel definition layer 380 or the additional opening OPBM-1 of the light blocking layer 220 may be increased, or additional openings of the same size may be provided, the period may be increased.

Referring to FIG. 28 and FIG. 29, the transmittance of the first component area EA1 exceeds 0.12%.

Figure 32:
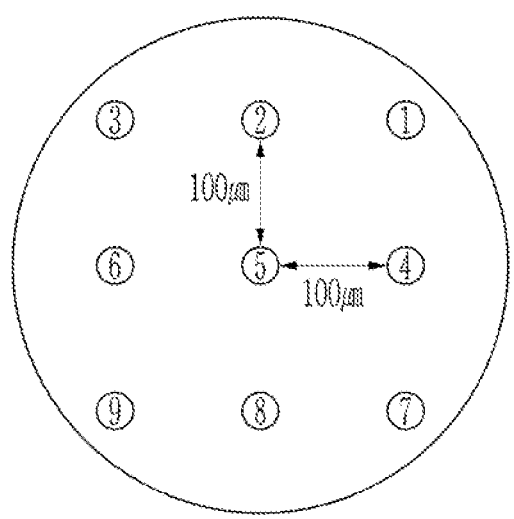
Figure 33:
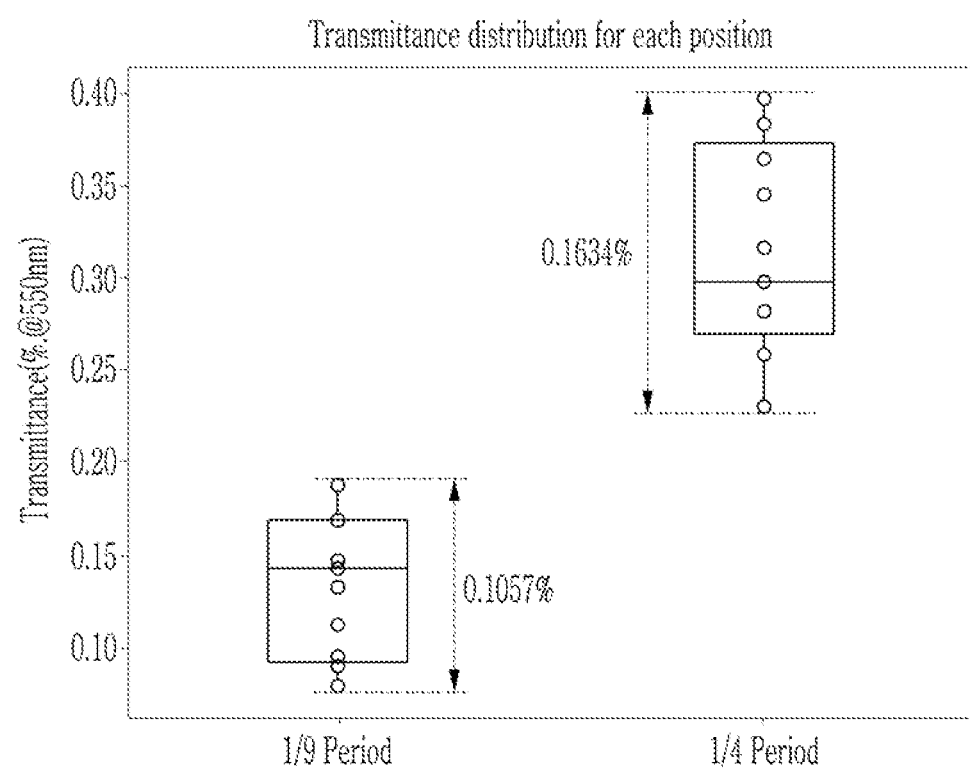

FIG. 32 and FIG. 33 illustrate transmittance as described in another way and this is described first with reference to FIG. 32.

The circle shown in FIG. 32 represents one spot to be photographed, and the diameter of one spot is 300 μm. The transmittance of a total of 9 positions was photographed within one spot and the difference in transmittance for each position was examined.

The experimental results are shown in FIG. 33 and Table 2 below.

TABLE 2

|  | 1/9 period | 1/4 period |
|---|---|---|
| ① | 0.1697 | 0.3454 |
| ② | 0.1694 | 0.2817 |
| ③ | 0.0888 | 0.2811 |
| ④ | 0.1427 | 0.3947 |
| ⑤ | 0.0814 | 0.259 |
| ⑥ | 0.1469 | 0.2981 |
| ⑦ | 0.0951 | 0.3829 |
| ⑧ | 0.1871 | 0.2313 |
| ⑨ | 0.1122 | 0.3648 |
| Average | 0.1326 | 0.3154 |
| Maximum value | 0.1871 | 0.3947 |
| Minimum value | 0.0814 | 0.2313 |
| Difference between maximum value and minimum value | 0.1057 | 0.1634 |

The results according to Table 2 are shown in FIG. 3 and confirm the distribution.

Referring to FIG. 33, the distribution of the transmittance for each position occurs in both an embodiment of the 1/9 period and an embodiment of the 1/4 period, and in an embodiment of the 1/9 period, there are many parts that are measured lower than the targeted minimum transmittance of 0.12%, so the transmittance should be further improved. On the other hand, in an embodiment of the 1/4 period, the sensor positioned on the rear surface can operate with the appropriate transmittance. In the embodiment of the 1/4 period, the display quality can be improved by additionally checking whether the reflectance and the reflection color of the display area DA are similar at the boundary between the display area DA and the first component area EA1 so that the boundary cannot be easily recognized.

On the other hand, in an embodiment of the 1/9 period, transmittance can be increased by increasing the width of the additional opening OP-1 of the black pixel definition layer 380 or the additional opening OPBM-1 of the light blocking layer 220, or increasing the period when additional openings of the same size are similar in reflectance and the reflection color of the display area DA. The sensor can operate on the rear surface, and the boundary between the display area DA and the recognition of the first component area EA1 are reduced.

In the above, the transmittance relationship of the 1/4 period and the 1/9 period has been described focusing on the experimental result.

Hereinafter, various embodiments for each period are described with reference to FIG. 34 to FIG. 39.

Figure 35:
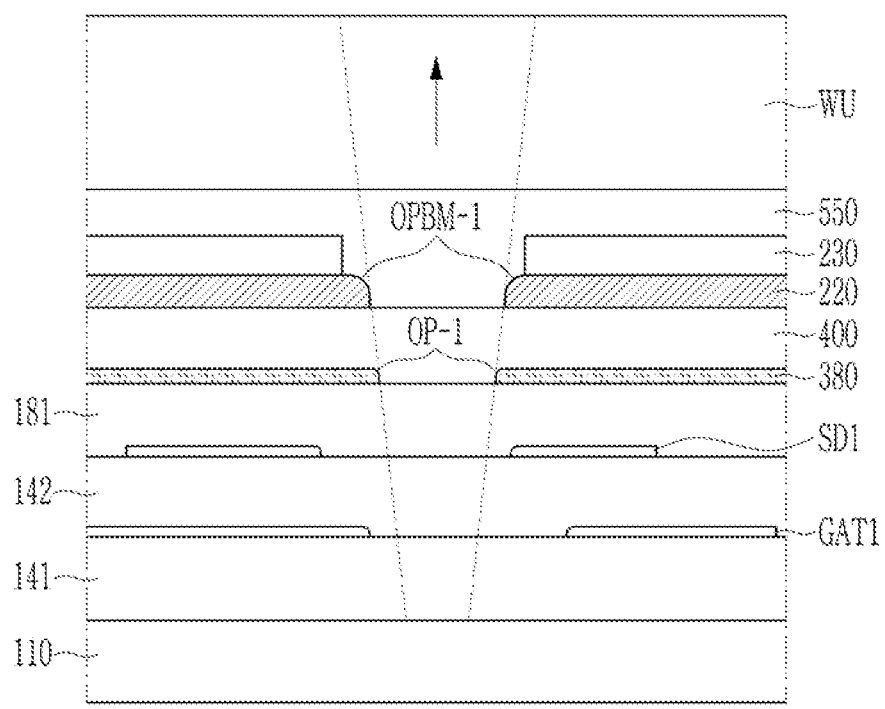
FIG. 35 and FIG. 36 are cross-sectional views of a first photosensor area and a second photosensor area according to an embodiment.
Figure 36:
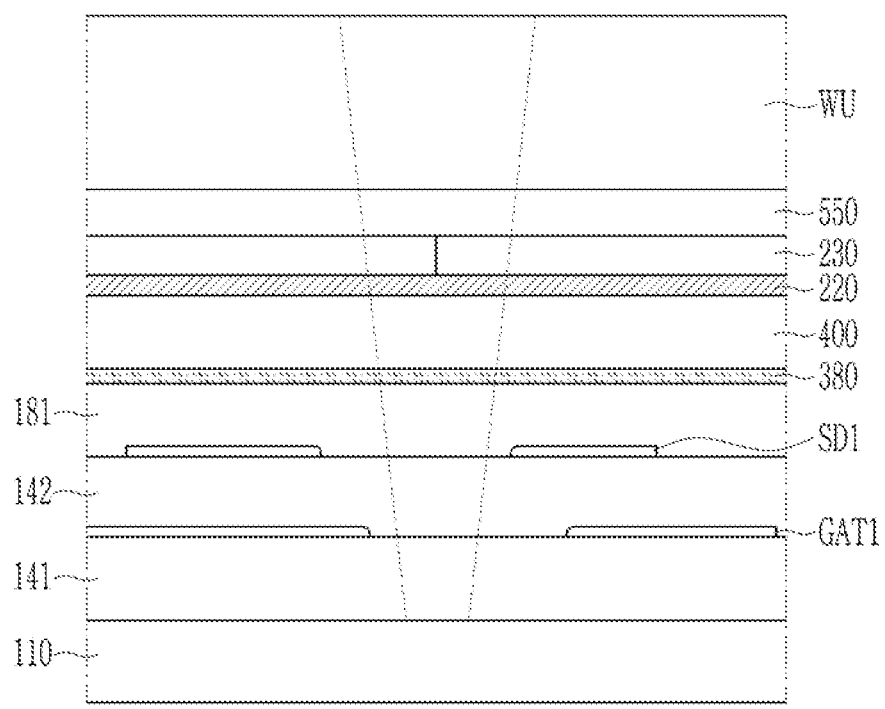

First, the structure of the 1/4 period is briefly reviewed with reference to FIG. 34 to FIG. 36.

FIG. 34 is a schematic top plan view of a first component area according to an embodiment, and FIG. 35 and FIG. 36 are cross-sectional views of a first photosensor area and a second photosensor area, according to an embodiment.

First, the top plan view of FIG. 34 corresponds to that of FIG. 21, and the structure of FIG. 21 is more schematically illustrated based on the characteristics of an embodiment of the present disclosure. FIG. 34 illustrates the first photosensor area OPS1 without a dot pattern and the second photosensor area OPS2 with a dot pattern. In addition, FIG. 34 shows one first component area EA1 that includes a plurality of first photosensor areas OPS1 and a plurality of second photosensor areas OPS2.

The cross-sectional structure of the first photosensor area OPS1 in FIG. 34 is illustrated in FIG. 35, and the cross-sectional structure of the second photosensor area OPS2 is illustrated in FIG. 36.

According to embodiments, FIG. 35 and FIG. 36 show the lower structure of the black pixel definition layer 380, as compared with FIG. 20, unlike embodiments of FIG. 7 to FIG. 20. According to an embodiment, the lower structure of the black pixel definition layer 380 has fewer layers between the substrate 110 and the black pixel definition layer 380 than an embodiment shown in FIG. 20. In FIG. 35 and FIG. 36, the semiconductor layer on the substrate 110 is omitted, and the first gate insulating layer 141, the first gate conductive layer GAT1, the second gate insulating layer 142, the first data conductive layer SD1, and the first organic layer 181 are sequentially disposed on the substrate 110.

The anode is disposed on the first organic layer 181, but is not shown, and the black pixel definition layer 380 is disposed on the first organic layer 181. Comparing FIG. 35 and FIG. 36, an additional opening OP-1 that corresponds to the first photosensor area OPS1 is formed in the black pixel definition layer 380, but there is no additional opening in the portion that corresponds to the second photosensor area OPS2, so light is blocked and not transmitted to the black pixel definition layer 380.

The cathode is disposed on the black pixel definition layer 380, but is omitted in FIG. 35 and FIG. 36, and an encapsulation layer 400 is disposed thereon. The light blocking layer 220 is disposed on the encapsulation layer, and comparing FIG. 35 and FIG. 36, an additional opening OPBM-1 that corresponds to the first photosensor area OPS1 is formed in the light blocking layer 220, however there is no additional opening in the portion that corresponds to the second photosensor area OPS2, so that the light blocking layer 220 blocks light from being transmitted.

A color filter layer 230 is disposed on the opening OPBM of the light blocking layer 220 and a part of the light blocking layer 220. The color filter layer 230 includes a color filter of each of the three primary colors. Comparing FIG. 35 and FIG. 36, the color filter layer 230 is not formed in a portion that corresponds to the first photosensor area OPS1, and the color filter layer 230 is formed in a portion that corresponds to the second photosensor area OPS2.

A planarization layer 550 is disposed on the light blocking layer 220 and the color filter layer 230, and a cover window WU is disposed thereon.

The first photosensor area OPS1 and the second photosensor area OPS2, which have the same structure as FIG. 35 and FIG. 36, can be arranged on a plane as shown in FIG. 37 to FIG. 39.

FIG. 37 to FIG. 39 are schematic top plan views of a first component area EA1 according to an embodiment.

FIG. 37 shows the first component area EA1 as including the first photosensor area OPS1 arranged with the 1/9 period.

Referring to the experimental results of FIG. 28 to FIG. 33, when disposing the first photosensor area OPS1 with a ⅑ period in a case in which the minimum transmittance should exceed 0.12%, the minimum transmittance can be increased by increasing the width of the additional opening OP-1 of the black pixel definition layer 380 or the additional opening OPBM-1 of the light blocking layer 220. Accordingly, by using a larger additional opening OP-1 and/or additional opening OPBM-1 so that the transmittance exceeds the minimum transmittance with a ⅑ period, the sensor can be accurately operated.

FIG. 38 shows the first component area EA1 as including the first photosensor area OPS1 arranged with a ⅛ period, according to an embodiment.

Since the transmittance of the first photosensor area OPS1 arranged with the ⅛ period of FIG. 38 has a higher transmittance than the first photosensor area OPS1 arranged with a ⅑ period, the transmittance may be greater than the minimum transmittance of 0.12% and may have the transmittance needed by the sensor positioned on the rear surface so that the sensor may accurately operate.

On the other hand, FIG. 39 shows an embodiment in which the first component area EA1 includes two areas that have different periods. For example, FIG. 39 shows a first photosensor area OPS1 arranged with a ⅛ period in an area A of the first component area EA1, hereinafter referred to as 'a center area of the first component area', and a first photosensor area OPS1 arranged with a ⅑ period in an area B, hereinafter, referred to as 'a peripheral area of the first component area'. For example, in an embodiment of FIG. 39, the first period of area A is greater than the second period of the area B. An embodiment may apply to a case where the sensor of the rear surface mainly senses through a part that corresponds to the area A.

In an embodiment of FIG. 39, the entire first component area EA1, which includes both area A and area B, has period that is less than ⅛ and greater than ⅑. As a result, the transmittance of the first component area EA1 is greater than an embodiment that has a ⅑ period, and as a result, has a transmittance that exceeds 0.12%, which is the minimum transmittance, and has a transmittance needed by a sensor positioned on the rear surface, so that the sensor operates correctly.

On the other hand, according to an embodiment, unlike an embodiment of FIG. 39, an embodiment in which the first period of the area A is less than that of the second period of the area B is also possible. However, the transmittance should satisfy the transmittance required by the sensor.

The first component area EA1 can have various different periods and arrangements from embodiments illustrated in FIG. 34, FIG. 37, FIG. 38, and FIG. 39.

Hereinafter, embodiments 63 hat are variants of an embodiment of FIG. 20 will be described.

Figure 40:
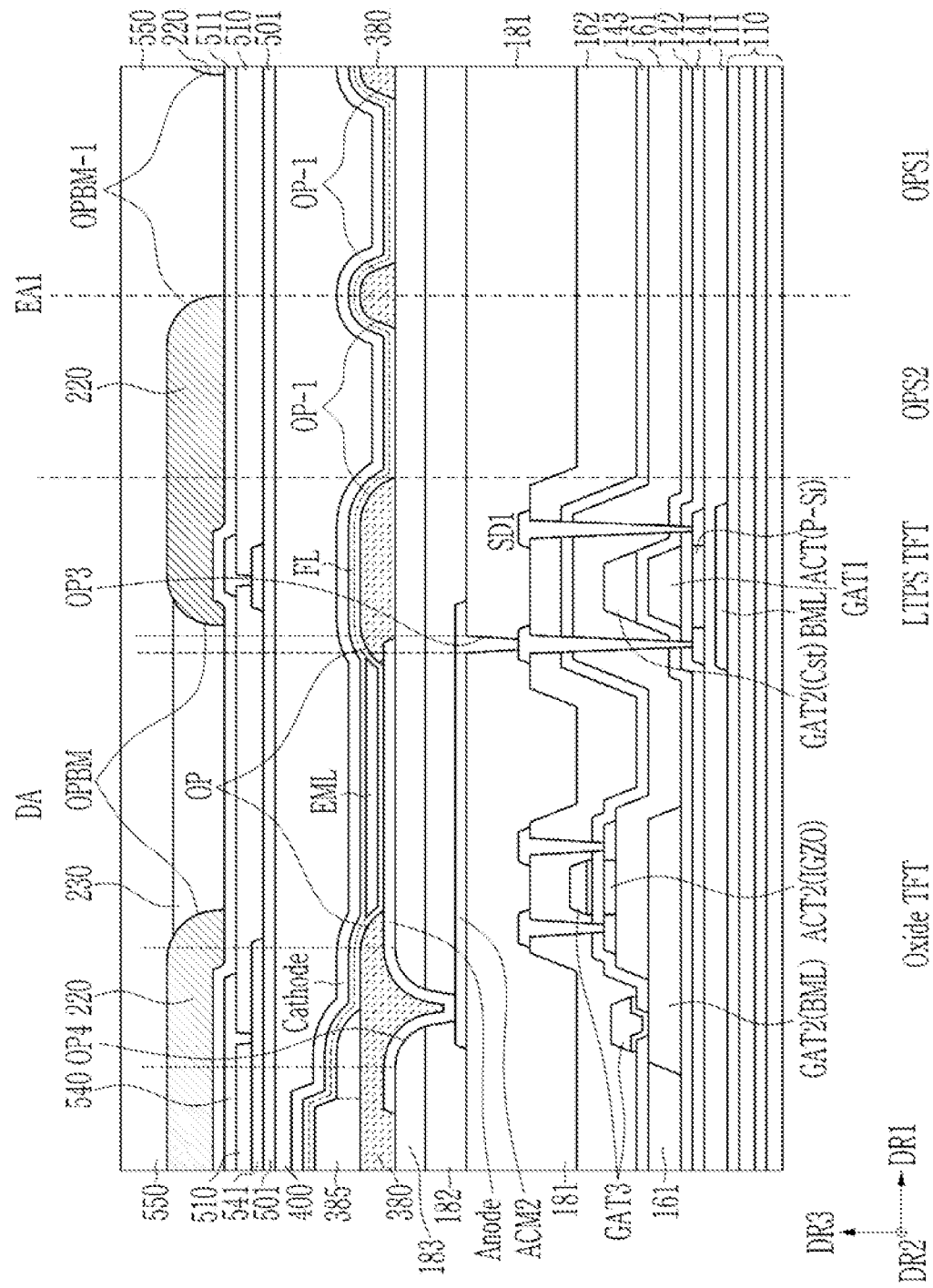
FIG. 40 to FIG. 42 are cross-sectional views of a light emitting display device according to an embodiment.
Figure 41:
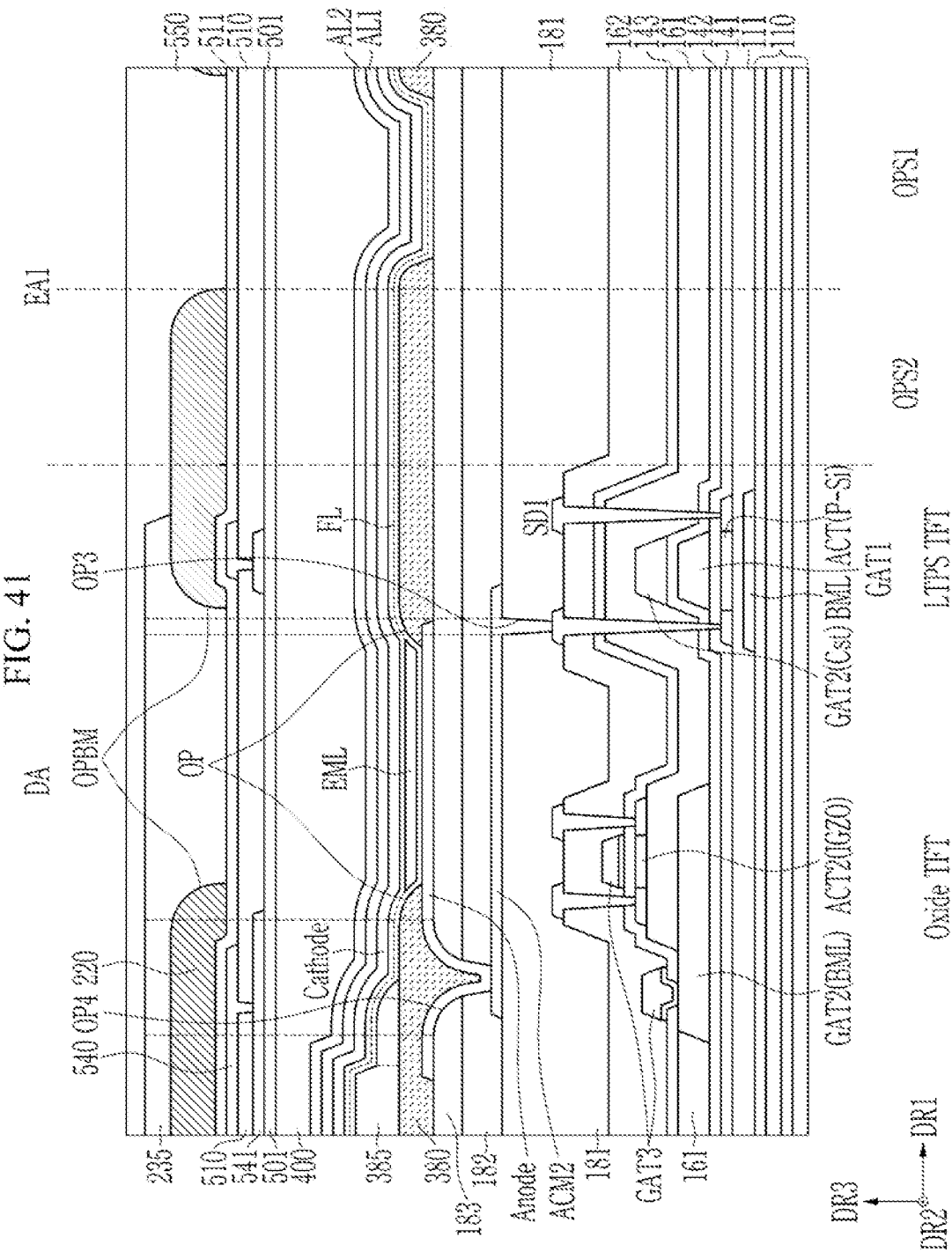
Figure 42:
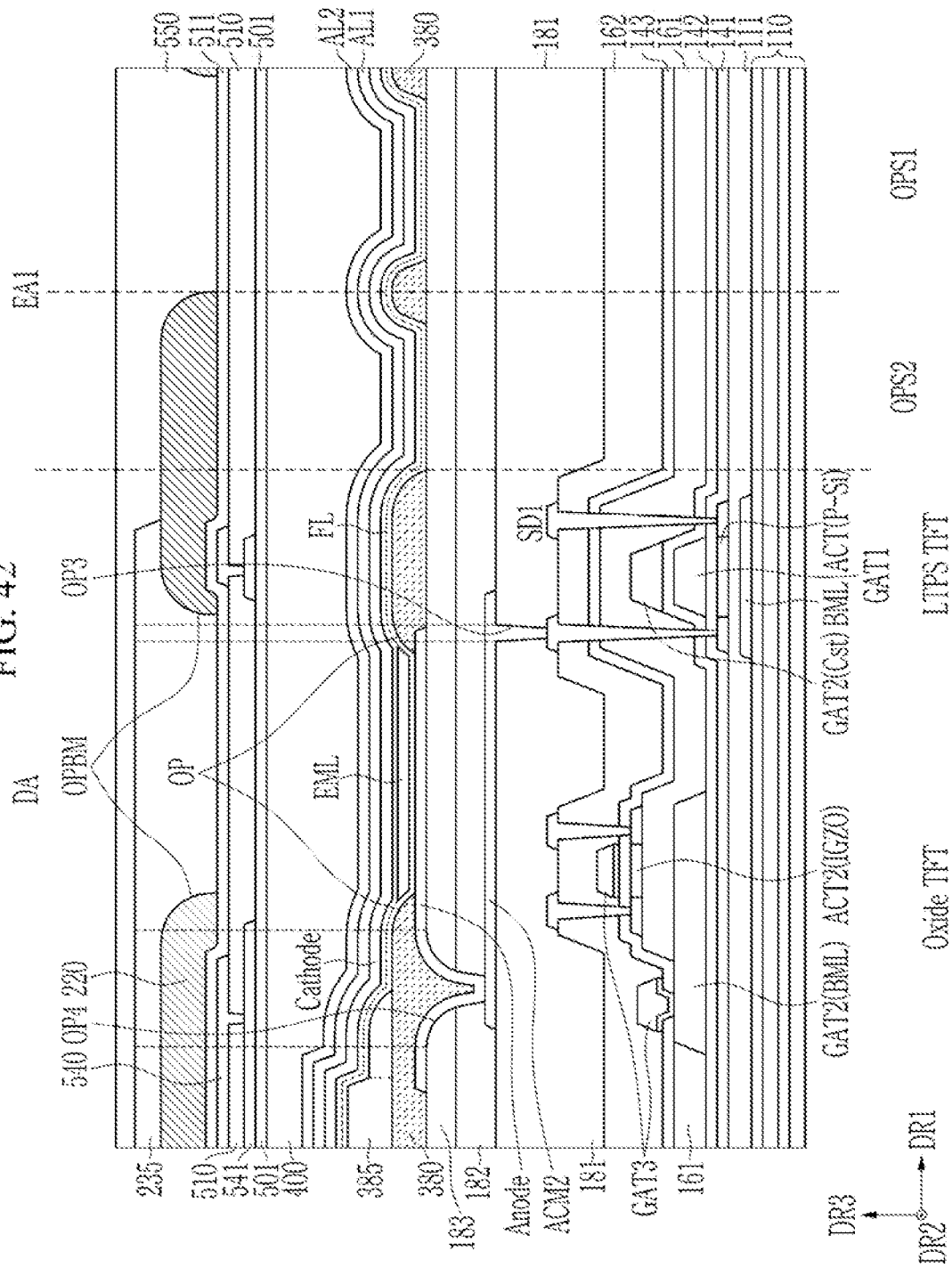

FIG. 40 to FIG. 42 are cross-sectional views of a light emitting display device according to embodiments.

First, referring to FIG. 40, in an embodiment of FIG. 40 unlike that of FIG. 20, the differences between the cross-sectional structures of the first photosensor area OPS1 and the second photosensor area OPS2 are present only in the light blocking layer 220. The area in which the additional opening OPBM-1 is formed in the light blocking layer 220 is the first photosensor area OPS1, and the area in which the additional opening OPBM-1 is not formed is the second photosensor area OPS2. In addition, an additional opening OP-1 is formed in the black pixel definition layer 380 that corresponds to the sub-photosensor areas OPS positioned in the first component area EA1. As a result, the first photosensor area OPS1 and the second photosensor area OPS2 are not distinguished by whether the black pixel definition layer 380 and the sub-photosensor area OPS overlap.

On the other hand, according to an embodiment, unlike FIG. 40, the difference between the cross-sectional structures of the first photosensor area OPS1 and the second photosensor area OPS2 is present only in the black pixel definition layer 380. That is, an embodiment has a structure in which only the black pixel definition layer 380 has the additional opening OP-1 that corresponds to the first photosensor area OPS1, and no additional opening OP-1 is formed in a part that corresponds to the second photosensor area OPS2 and is covered by the black pixel definition layer 380. An additional opening OPBM-1 is formed in the light blocking layer 220 that corresponds to the sub-photosensor areas OPS positioned in the first component area EA1.

In addition, according to an embodiment, a reflection adjustment layer 235 is provided instead of the color filter layer 230, and this is described with reference to FIG. 41 and FIG. 42.

First, FIGS. 41 and 42 illustrate embodiments in which a reflection adjustment layer 235 is provided instead of the color filter layer 230 in FIG. 20.

In FIG. 41 and FIG. 42, only the parts that differ from FIG. 20 and FIG. 40 will be described as follows.

According to an embodiment, a reflection adjustment layer 235 is disposed on the light blocking layer 220. The reflection adjustment layer 235 selectively absorbs light of one or more predetermined wavelength bands of light reflected from inside the display device or incident from outside the display device. The reflection adjustment layer 235 fills the opening OP of the light blocking layer 220.

For example, the reflection adjustment layer 235 absorbs the first wavelength band of 490 nm to 505 nm and the second wavelength band of 585 nm to 600 nm, and the light transmittance in the first wavelength band and the second wavelength band is 40% or less. The reflection adjustment layer 235 absorbs light with a wavelength outside a wavelength range of red, green, or blue light emitted from the light emitting diode LED. As such, the reflection adjustment layer 235 absorbs light of wavelengths that do not belong to the wavelength range of red, green, or blue emitted from the light-emitting element, and prevents or minimizes a decrease of the luminance of the display device and simultaneously prevents or minimizes the deterioration of the light emitting efficiency of the display device and improves visibility.

In an embodiment, the reflection adjustment layer 235 is an organic material layer that includes one of a dye, a pigment, or a combination thereof. For example, the reflection adjustment layer 235 includes at least one of a tetraazaporphyrin (TAP)-based compound, a porphyrin-based compound, a metal porphyrin-based compound, an oxazine-based compound, a squarylium-based compound, a triarylmethane-based compound, a polymethine-based compound, an anthraquinone-based compound, a phthalocyanine-based compound, an azo-based compound, a perylene-based compound, a xanthene-based compound, a diimmonium-based compound, a dipyrromethene-based compound, or a cyanine-based compound, or a combination thereof.

In an embodiment, the reflectance measured in SCI (Specular Component Included) mode on the surface of the reflection adjustment layer 235 is 10% or less. For example, the reflection adjustment layer absorbs external light reflection of the display device, so that visibility is improved.

In an embodiment, the reflection adjustment layer 235 has a transmittance of about 64% to 72%. The transmittance of the reflection adjustment layer 235 is adjusted according to the content of the pigment and/or dye in the reflection adjustment layer 235.

According to the embodiment, the reflection adjustment layer 235 is not positioned in the first component area EA1.

In addition, in an embodiment that includes the reflection adjustment layer 235, a capping layer AL1 and a low reflection layer AL2 are additionally formed between the cathode Cathode and the encapsulation layer 400.

The capping layer AL1 increases the light emitting efficiency of the light-emitting element by constructive interference. For example, the capping layer AL1 includes a material that has a refractive index of 1.6 or more for light that having a wavelength of 589 nm.

The capping layer AL1 may be an organic capping layer that includes organic materials, an inorganic capping layer that includes inorganic materials, or a composite capping layer that includes organic materials and inorganic materials. For example, the capping layer AL1 includes at least one of a carbocyclic compound, a heterocyclic compound, an amine group-containing compound, a porphine derivative, a phthalocyanine derivative, a naphthalocyanine derivative, an alkali metal complex, or an alkaline earth metal complex, or any combination thereof. The carbocyclic compounds, heterocyclic compounds, and amine group-containing compounds may be optionally substituted with substituents that include at least one of O, N, S, Se, Si, F, Cl, Br, I, or any combination thereof.

The low reflection layer AL2 is disposed on the capping layer AL1. The low reflection layer AL2 overlaps the front surface of the substrate 110.

The low reflection layer AL2 includes an inorganic material that has low reflectance, and in an embodiment, a metal or a metal oxide. The metal, is one or more of ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), or a combination thereof may be included. In addition, the metal oxide is one of more of $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, SiNx, LiF, $CaF_2$, $MgF_2$, CdS, or a combination thereof.

In an embodiment, an absorption coefficient (k) of the inorganic material in the low reflection layer AL2 is 4.0 or less and 0.5 or more ($0.5 \leq k \leq 4.0$). In addition, the inorganic material in the low reflection layer AL2 has a refractive index (n) of 1 or more ($n \geq 1.0$).

The low reflection layer AL2 induces destructive interference between the light incident into the display device and the light reflected from the metal disposed under the low reflection layer AL2, thereby reducing external light reflectivity. Accordingly, the display quality and visibility of the display device are improved by reducing the reflectance of the external light from the display device through the low reflection layer AL2.

According to an embodiment, the capping layer AL1 is omitted so that the low reflection layer AL2 may be in contact with the cathode Cathode.

An encapsulation layer 400 is disposed on the low reflection layer AL2, and the other structures are the same as those of FIG. 20, and a repeated description thereof is omitted.

In an embodiment of FIG. 40, both the black pixel definition layer 380 and the light blocking layer 220 have an additional opening OP-1 and OPBM-1 in the first photosensor area OPS1, and no additional opening is formed in the second photosensor area OPS2, so that the black pixel definition layer 380 and the light blocking layer 220 overlap the sub-photosensor area OPS. On the other hand, in an embodiment of FIG. 41, only the light blocking layer 220 has the additional opening OPBM-1 that corresponds to the first photosensor area OPS1, and no additional opening is formed in the second photosensor area OPS2, and the light blocking layer 220 overlaps the sub-photosensor area OPS. However, according to an embodiment, only the black pixel definition layer 380 has an additional opening OP-1 in the first photosensor area OPS1, and no additional opening is formed in the second photosensor area OPS2, and the black pixel definition layer 380 overlaps the sub-photosensor area OPS.

While this disclosure has been described in connection with embodiments, it is to be understood that the disclosure is not limited to the disclosed embodiments. On the contrary, it is intended to cover various modifications and equivalent arrangements included within the spirit and scope of the appended claims.

What is claimed is:

1. A light emitting display device, comprising:
   a display area; and
   a first component area positioned within the display area and that includes a plurality of pixels, wherein each pixel of the plurality of pixels respectively includes a pixel circuit part, and the first component area further includes a first photosensor area and a second photosensor area between the plurality of pixels,
   wherein the first photosensor area includes:
      a first sub-photosensor area positioned between adjacent pixel circuit parts; and
      a light blocking layer positioned on a front surface of the first sub-photosensor area and that includes an opening that overlaps the first sub-photosensor area, and
   the second photosensor area includes:
      a second sub-photosensor area positioned between the adjacent pixel circuit parts; and
      the light blocking layer positioned on a front surface of the second sub-photosensor area and that overlaps the second sub-photosensor area.

2. The light emitting display device of claim 1, wherein:
   one of the first sub-photosensor area or the second sub-photosensor area is adjacent to all pixel circuit parts in the first component area,
   the first component area includes a plurality of the first photosensor areas and
   a plurality of the second photosensor areas, and
   a number of the first photosensor areas is equal to or less than a number of the second photosensor areas.

3. The light emitting display device of claim 2, wherein the first component area includes one or more of
   a ½ period in which one second photosensor area is formed for one first photosensor area,
   a ¼ period in which three second photosensor areas are formed for one first photosensor area,
   a ⅜ period in which five second photosensor areas are formed for three first photosensor areas,
   a ⅛ period in which seven second photosensor areas are formed for one first photosensor area, or
   a ⅑ period in which eight second photosensor areas are formed for one first photosensor area.

4. The light emitting display device of claim 3, wherein the first component area has a transmittance greater than 0.12%.

5. The light emitting display device of claim 1, wherein
the first component area is divided into a center area and a peripheral area, and
a first period of the center area of the first component area differs from a second period of the peripheral area of the first component area.

6. The light emitting display device of claim 5, wherein the first period has a greater value than the second period.

7. The light emitting display device of claim 1, further comprising
a black pixel definition layer disposed between the pixel circuit part and the light blocking layer, wherein
the black pixel definition layer includes an additional opening that overlaps the first sub-photosensor area in the first photosensor area and overlaps the second sub-photosensor area in the second photosensor area.

8. The light emitting display device of claim 1, further comprising
a black pixel definition layer disposed between the pixel circuit part and the light blocking layer, wherein
the black pixel definition layer includes an additional opening on a portion that overlaps the first sub-photosensor area in the first photosensor area and a portion that overlaps the second sub-photosensor area in the second photosensor area.

9. The light emitting display device of claim 1, further comprising
a color filter disposed on the light blocking layer.

10. The light emitting display device of claim 1, wherein
the plurality of pixels further includes a light-emitting element,
the light-emitting element includes an anode, an emission layer, and a cathode, and
the light emitting display device further comprises an encapsulation layer that covers the light-emitting element and the pixel circuit part and is positioned under the light blocking layer, and
a reflection adjustment layer disposed on a front surface of the light blocking layer and that selectively absorbs light of one or more predetermined wavelength bands.

11. The light emitting display device of claim 10, further comprising
a capping layer disposed on the cathode and between the cathode and the encapsulation layer, and a low reflection layer disposed on the capping layer.

12. A light emitting display device, comprising:
a display area; and
a first component area positioned within the display area and that includes a plurality of pixels, wherein each of the plurality of pixels respectively includes a pixel circuit part, and the first component area further includes a first photosensor area and a second photosensor area between the plurality of pixels,
wherein the first photosensor area includes:
a first sub-photosensor area positioned between adjacent pixel circuit parts; and
a black pixel definition layer positioned on a front surface of the first sub-photosensor area and that includes an opening that overlaps the first sub-photosensor area,
wherein the second photosensor area includes:
a second sub-photosensor area positioned between the adjacent pixel circuit parts; and
the black pixel definition layer positioned on a front surface of the second sub-photosensor area and that overlaps the second sub-photosensor area.

13. The light emitting display device of claim 12, wherein
one of the first sub-photosensor area or the second sub-photosensor area is adjacent to all pixel circuit parts in the first component area, and
the first component area includes a plurality of the first photosensor areas and
a plurality of the second photosensor areas, and
a number of the first photosensor areas is equal to or less than a number of the second photosensor areas.

14. The light emitting display device of claim 13, wherein the first component area includes one or more of
a ½ period in which one second photosensor area is formed for one first photosensor area,
a ¼ period in which three the second photosensor areas are formed for one the first photosensor area,
a ⅜ period in which five second photosensor areas are formed for three first photosensor areas,
a ⅛ period in which seven second photosensor areas are formed for one first photosensor area, or
a ⅑ period in which eight second photosensor areas are formed for one first photosensor area.

15. The light emitting display device of claim 14, wherein the first component area has transmittance of greater than 0.12%.

16. The light emitting display device of claim 12, wherein
the first component area is divided into a center area and a peripheral area, and
a first period of the center area of the first component area differs from a second period of the peripheral area of the first component area.

17. The light emitting display device of claim 16, wherein the first period has a greater value than the second period.

18. The light emitting display device of claim 12, further comprising
a light blocking layer disposed on the black pixel definition layer, and
a color filter disposed on the light blocking layer.

19. The light emitting display device of claim 12, wherein
the plurality of pixels further includes a light-emitting element,
the light-emitting element includes an anode, an emission layer, and a cathode, and
the light emitting display device further comprises an encapsulation layer that covers the light-emitting element and the pixel circuit part,
a light blocking layer disposed on the encapsulation layer, and
a reflection adjustment layer disposed on the front surface of the light blocking layer and that absorbs light of one or more predetermined wavelength bands.

20. The light emitting display device of claim 19, further comprising
a capping layer disposed on the cathode and between the cathode and the encapsulation layer, and a low reflection layer disposed on the capping layer.

* * * * *